United States Patent
Kubota et al.

(10) Patent No.: US 9,331,108 B2
(45) Date of Patent: May 3, 2016

(54) SEMICONDUCTOR DEVICE

(71) Applicant: Semiconductor Energy Laboratory Co., Ltd., Atsugi-shi, Kanagawa-ken (JP)

(72) Inventors: Daisuke Kubota, Atsugi (JP); Ryo Hatsumi, Hadano (JP); Masami Jintyou, Shimotsuga (JP); Takumi Shigenobu, Tochigi (JP); Naoto Goto, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/926,795

(22) Filed: Oct. 29, 2015

(65) Prior Publication Data
US 2016/0049428 A1    Feb. 18, 2016

Related U.S. Application Data

(63) Continuation of application No. 14/656,285, filed on Mar. 12, 2015, now Pat. No. 9,177,969, which is a continuation of application No. 14/161,975, filed on Jan. 23, 2014, now Pat. No. 8,981,374.

(30) Foreign Application Priority Data

Jan. 30, 2013  (JP) ................................ 2013-016257
Mar. 15, 2013  (JP) ................................ 2013-054014

(51) Int. Cl.
*H01L 27/12* (2006.01)
*H01L 49/02* (2006.01)
*H01L 29/786* (2006.01)

(52) U.S. Cl.
CPC ........ *H01L 27/1255* (2013.01); *H01L 27/1225* (2013.01); *H01L 28/60* (2013.01); *H01L 29/7869* (2013.01)

(58) Field of Classification Search
CPC ... H01L 27/124; H01L 27/1225; H01L 29/24; H01L 29/66742; H01L 29/66969; H01L 29/7869; H01L 29/78696; H01L 29/78606
See application file for complete search history.

(56) References Cited

U.S. PATENT DOCUMENTS 5,403,762 A    4/1995 Takemura
5,403,772 A    4/1995 Zhang et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Kyoung Lee
(74) *Attorney, Agent, or Firm* — Robinson Intellectual Property Law Office; Eric J. Robinson

(57) ABSTRACT

A semiconductor device having a high aperture ratio and including a capacitor capable of increasing the charge capacity is provided. A semiconductor device includes a transistor over a substrate, a first light-transmitting conductive film over the substrate, an oxide insulating film covering the transistor and having an opening over the first light-transmitting conductive film, a nitride insulating film over the oxide insulating film and in contact with the first light-transmitting conductive film in the opening, a second light-transmitting conductive film connected to the transistor and having a depressed portion in the opening, and an organic resin film with which the depressed portion of the second light-transmitting conductive film is filled.

20 Claims, 55 Drawing Sheets

(56) References Cited

U.S. PATENT DOCUMENTS

| | | |
|---|---|---|
| 5,563,426 A | 10/1996 | Zhang et al. |
| 5,572,046 A | 11/1996 | Takemura |
| 5,731,856 A | 3/1998 | Kim et al. |
| 5,744,864 A | 4/1998 | Cillessen et al. |
| 5,847,410 A | 12/1998 | Nakajima |
| 6,140,198 A | 10/2000 | Liou |
| 6,294,274 B1 | 9/2001 | Kawazoe et al. |
| 6,479,331 B1 | 11/2002 | Takemura |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,872,605 B2 | 3/2005 | Takemura |
| 6,875,628 B1 | 4/2005 | Zhang et al. |
| 6,960,812 B2 | 11/2005 | Yamazaki et al. |
| 6,987,283 B2 | 1/2006 | Zhang et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,238,558 B2 | 7/2007 | Takemura |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,391,051 B2 | 6/2008 | Zhang et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,622,335 B2 | 11/2009 | Zhang et al. |
| 7,674,650 B2 | 3/2010 | Akimoto et al. |
| 7,732,819 B2 | 6/2010 | Akimoto et al. |
| 7,804,091 B2 | 9/2010 | Takechi et al. |
| 7,855,379 B2 | 12/2010 | Hayashi et al. |
| 7,943,930 B2 | 5/2011 | Zhang et al. |
| 7,998,372 B2 | 8/2011 | Yano et al. |
| 8,062,935 B2 | 11/2011 | Zhang et al. |
| 8,102,476 B2 | 1/2012 | Son et al. |
| 8,158,974 B2 | 4/2012 | Yano et al. |
| 8,164,256 B2 | 4/2012 | Sano et al. |
| 8,232,124 B2 | 7/2012 | Takechi et al. |
| 8,278,660 B2 | 10/2012 | Zhang et al. |
| 8,415,198 B2 | 4/2013 | Itagaki et al. |
| 8,436,349 B2 | 5/2013 | Sano et al. |
| 8,476,625 B2 | 7/2013 | Kimura |
| 8,541,944 B2 | 9/2013 | Sano et al. |
| 8,610,120 B2 | 12/2013 | Miyake et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218221 A1 | 11/2003 | Wager, III et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170067 A1 | 8/2006 | Maekawa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0115219 A1 | 5/2007 | Inoue |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0158107 A1* | 7/2008 | Miller .................. G09G 3/22 345/76 |
| 2008/0166834 A1 | 7/2008 | Kim et al. |
| 2008/0176364 A1 | 7/2008 | Yang et al. |
| 2008/0182358 A1 | 7/2008 | Cowdery-Corvan et al. |
| 2008/0191332 A1 | 8/2008 | Koyama et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0303020 A1 | 12/2008 | Shin et al. |
| 2009/0045397 A1 | 2/2009 | Iwasaki |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0101895 A1 | 4/2009 | Kawamura et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0237000 A1 | 9/2009 | Inoue |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0051937 A1 | 3/2010 | Kaji et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2011/0032435 A1 | 2/2011 | Kimura |
| 2012/0168748 A1 | 7/2012 | Yano et al. |
| 2014/0070209 A1 | 3/2014 | Yamazaki et al. |

FOREIGN PATENT DOCUMENTS

| | | |
|---|---|---|
| EP | 2579237 A | 4/2013 |
| GB | 2425401 | 10/2006 |
| JP | 60-198861 A | 10/1985 |
| JP | 63-210022 A | 8/1988 |
| JP | 63-210023 A | 8/1988 |

(56) References Cited

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-198806 A | 8/1993 |
| JP | 05-251705 A | 9/1993 |
| JP | 07-104312 A | 4/1995 |
| JP | 08-095062 A | 4/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 A | 4/2007 |
| JP | 2007-115808 A | 5/2007 |
| JP | 2007-123861 A | 5/2007 |
| JP | 2007-194594 A | 8/2007 |
| JP | 2007-220817 A | 8/2007 |
| JP | 2008-060419 A | 3/2008 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al.,"Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

(56) References Cited

OTHER PUBLICATIONS

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-443.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phase for Display Applications", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFe2O4, and YB2Fe3O7 Types of Structures for Compounds in the In2O3 and Sc2O3—A2O3—BO Systems [A; Fe, Ga, or Al; B; Ng, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects In ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

* cited by examiner

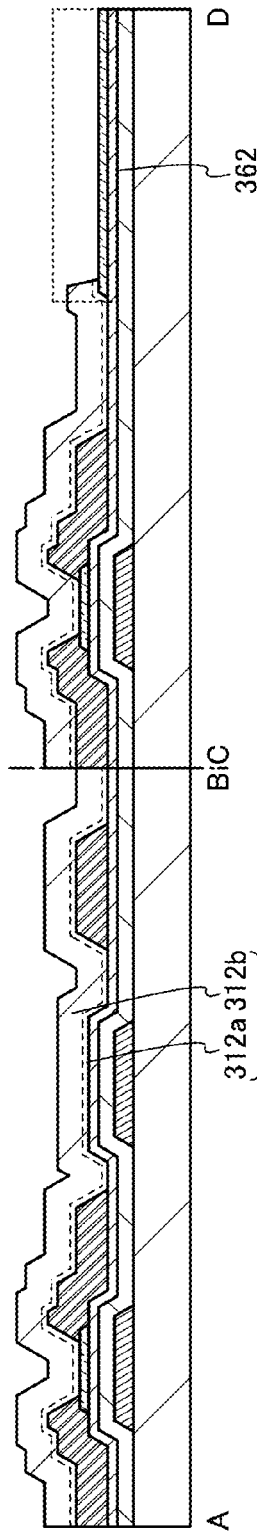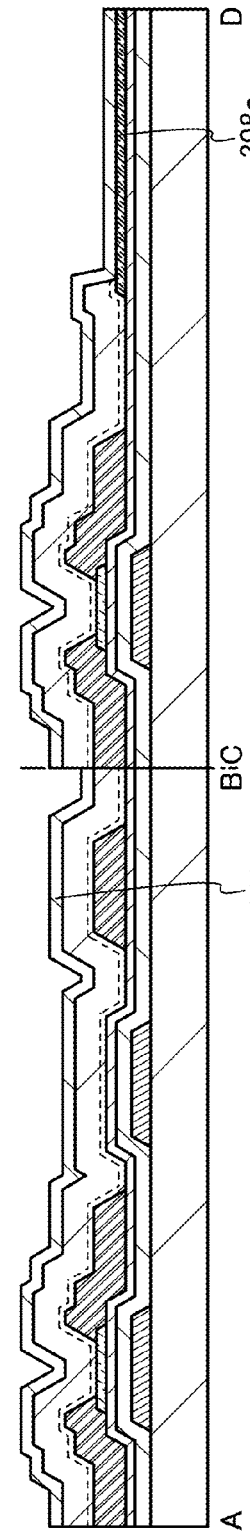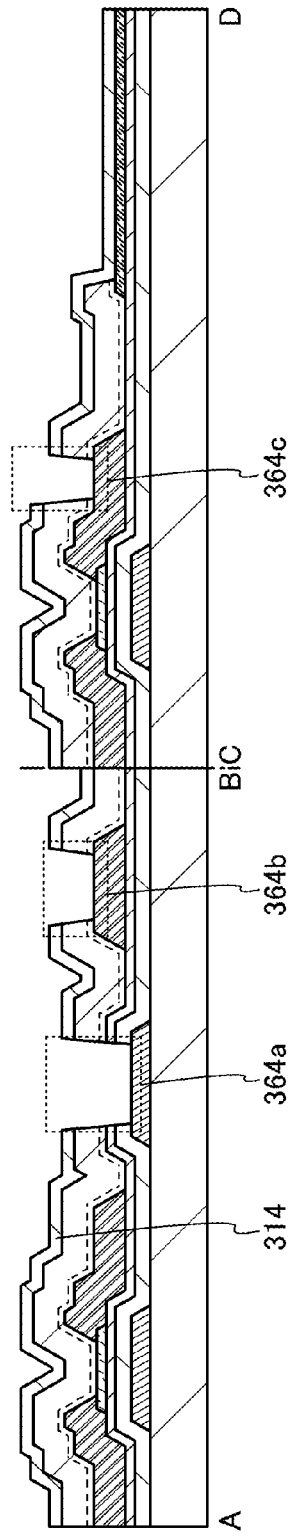

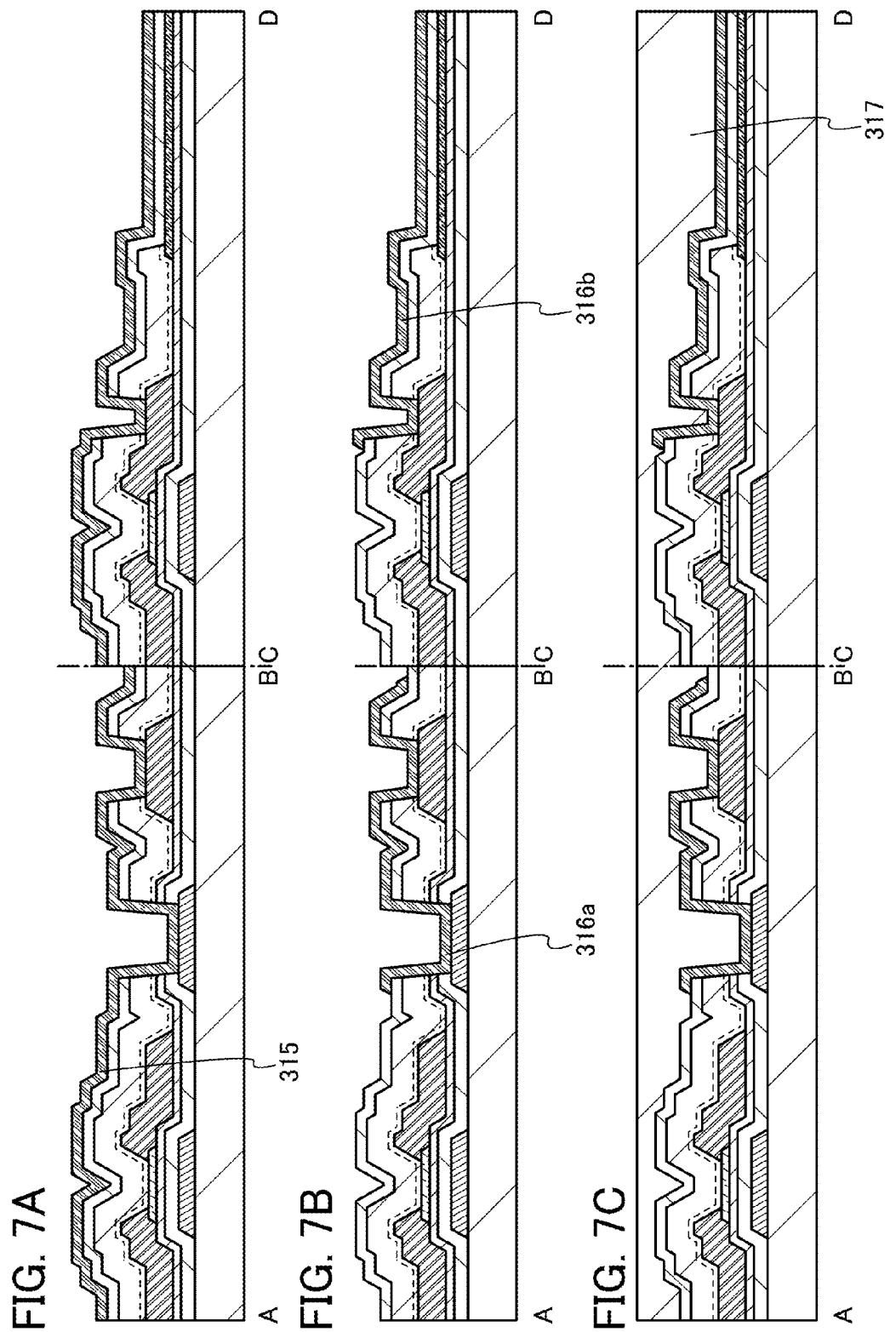

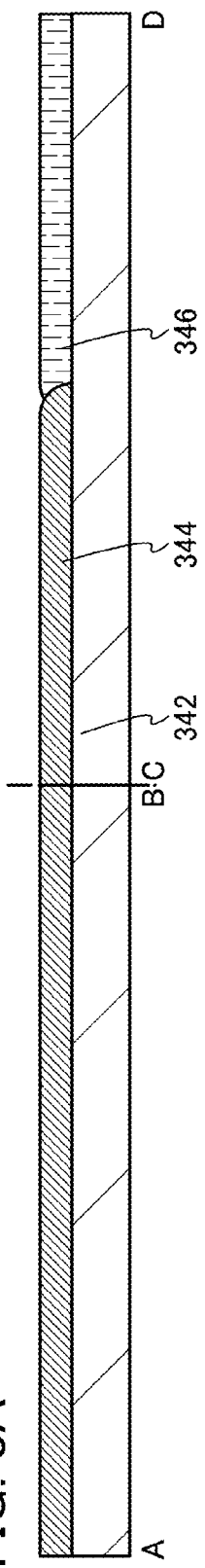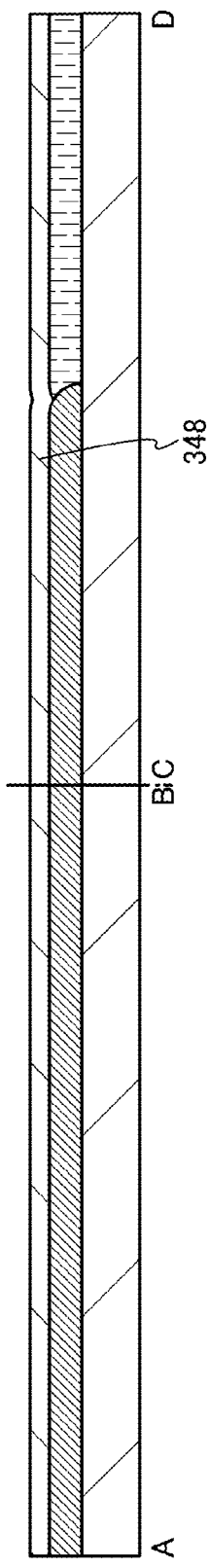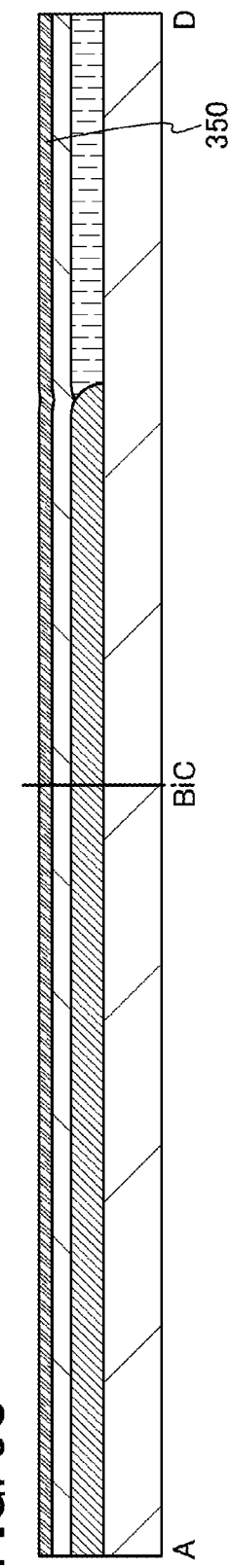

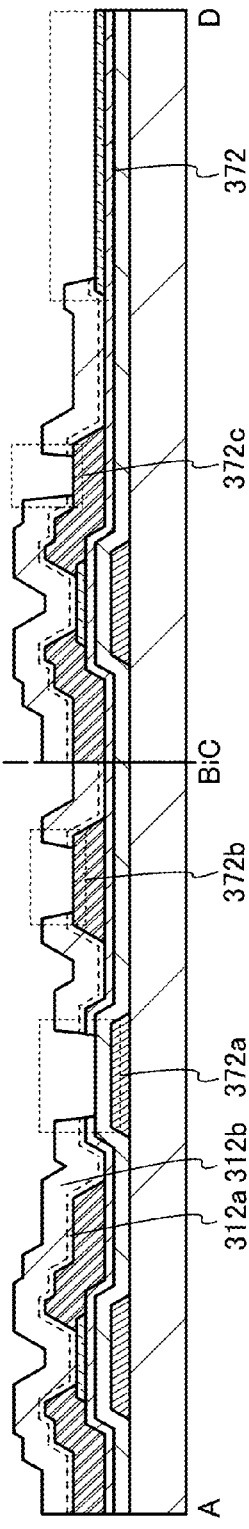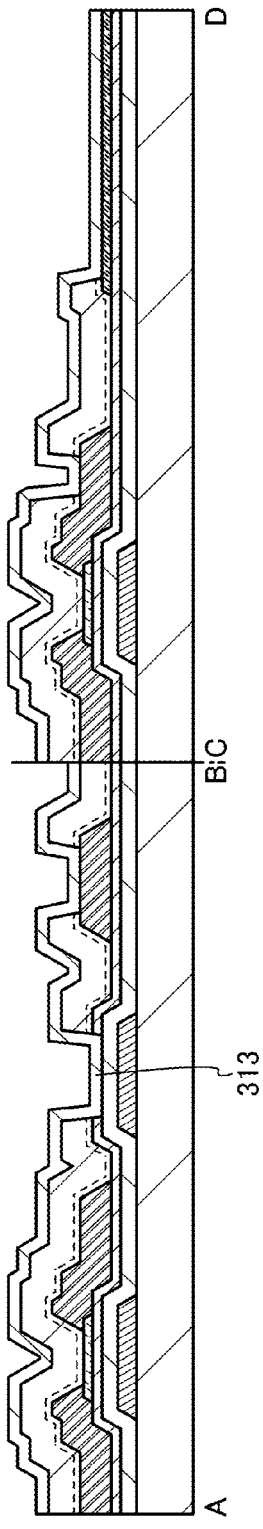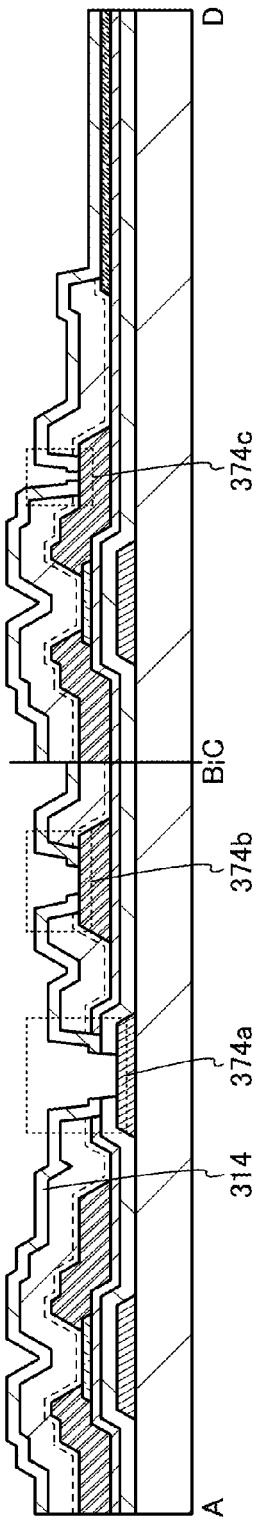

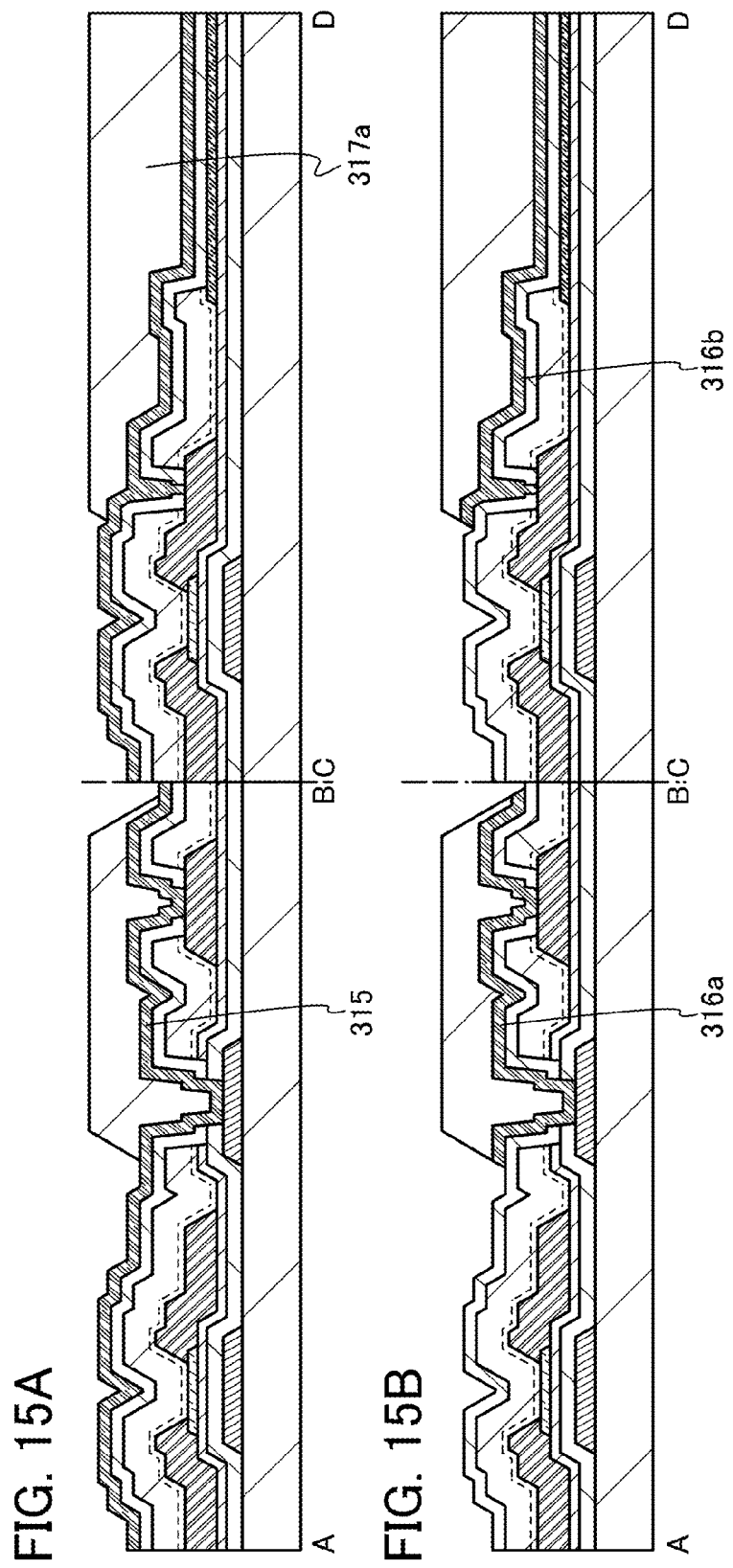

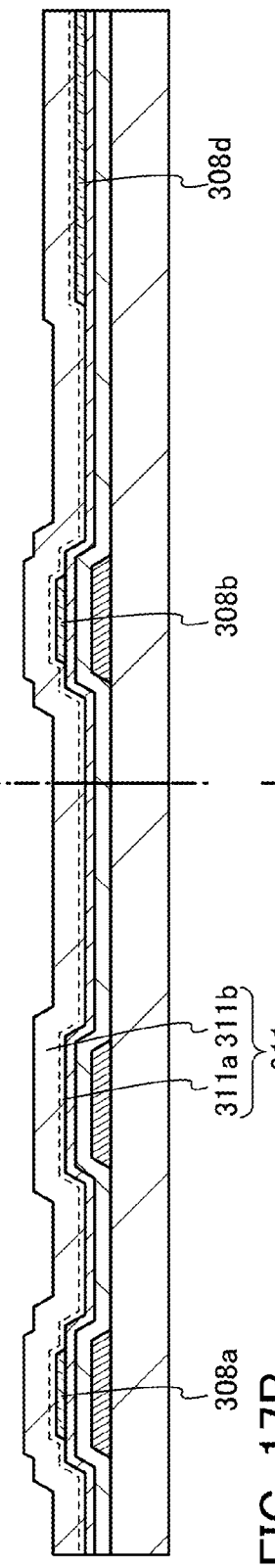
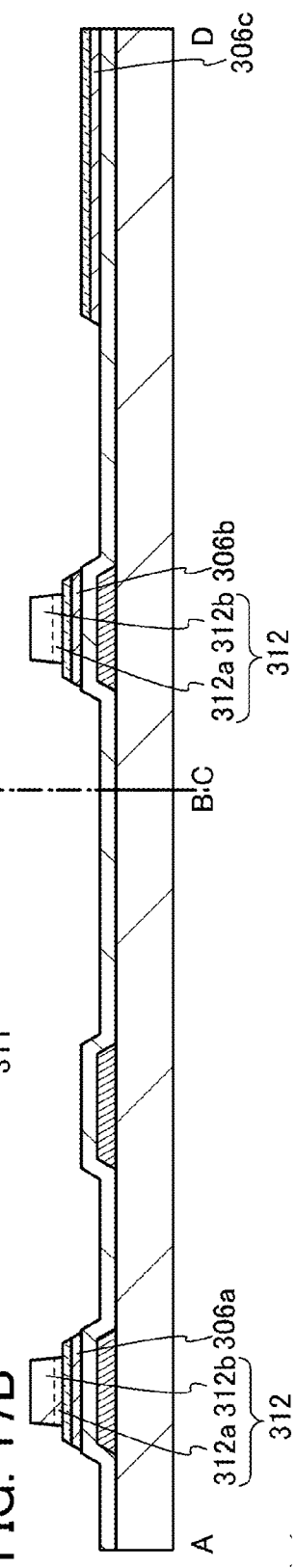
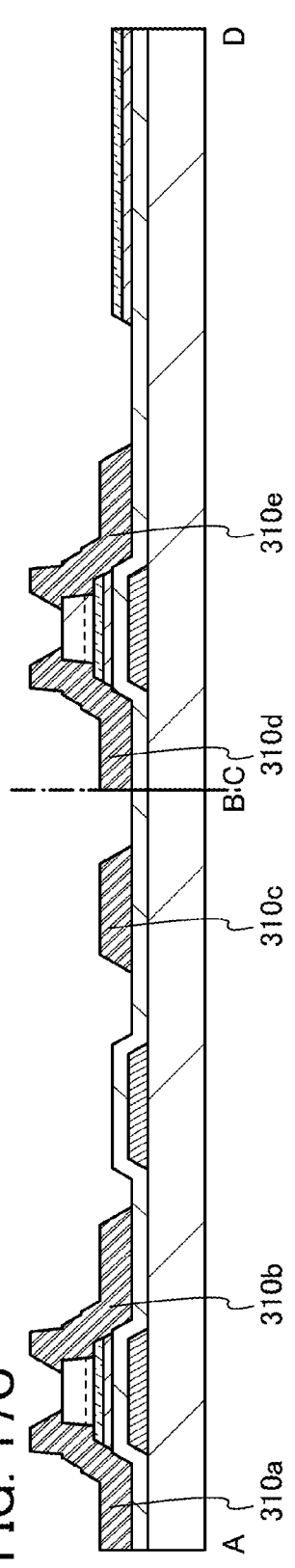
FIG. 17A
FIG. 17B
FIG. 17C

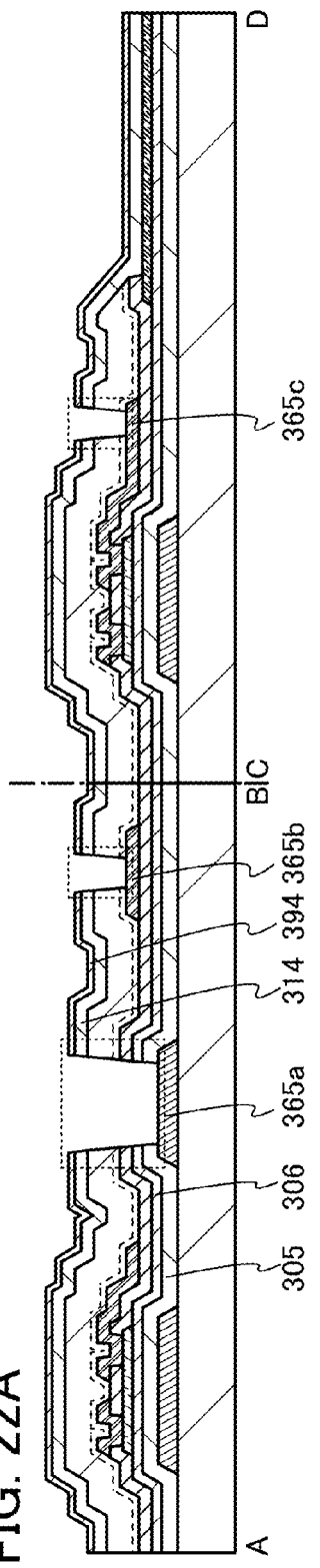
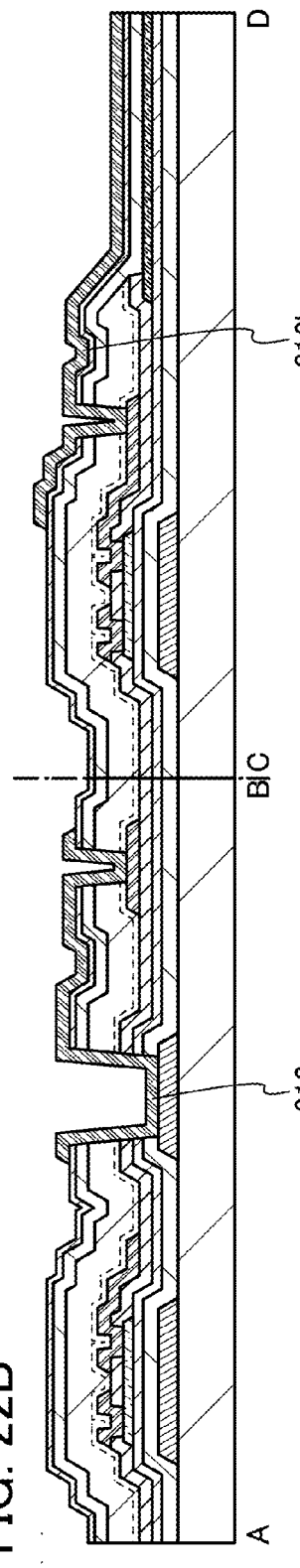
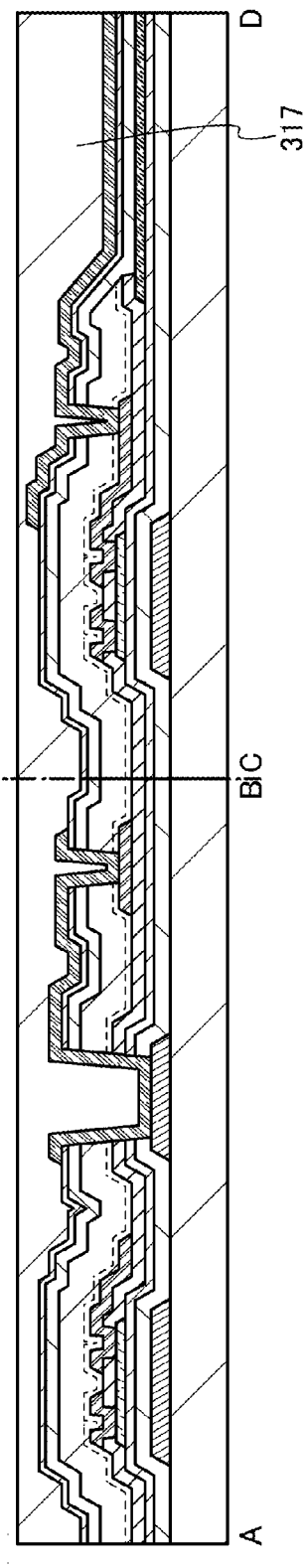

CAAC-OS nc-OS

FIG. 33A
the non touch
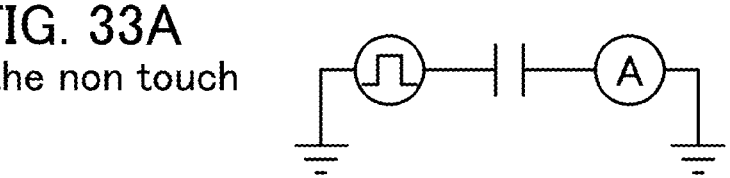
input voltage waveform
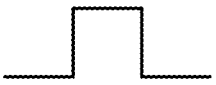
output current waveform
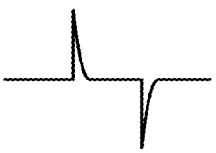
FIG. 33B
the touch
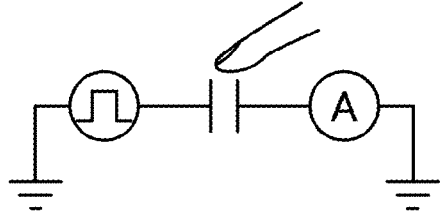
input voltage waveform
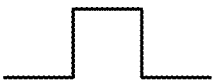
output current waveform
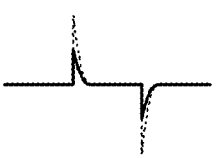
FIG. 33C
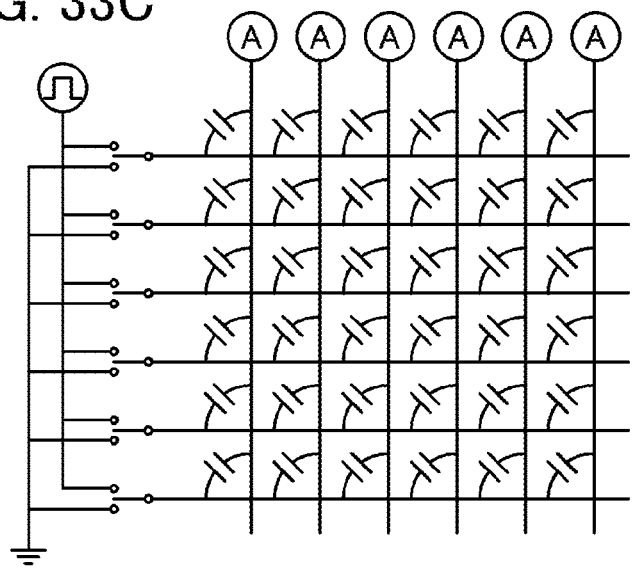

transmittance 100%

401 transmittance 100% transmittance 0%

403 transmittance 0%

50μm

5μm

5μm

5μm

5μm transmittance 100%

↖431 transmittance 100%

↖433 transmittance 0%

↖435 transmittance 0%

● In   ○ Ga   ○ Zn   ● O   ● H

SEMICONDUCTOR DEVICE

BACKGROUND OF THE INVENTION

1. Field of the Invention

The present invention relates to a semiconductor device including an oxide semiconductor or a display device.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, such a technique is disclosed in which a transistor is manufactured using zinc oxide or an In—Ga—Zn-based oxide as an oxide semiconductor and the transistor is used as a switching element or the like in a pixel of a display device (see Patent Documents 1 and 2).

REFERENCE

Patent Document

[Patent Document 1] Japanese Published Patent Application No. 2007-123861

[Patent Document 2] Japanese Published Patent Application No. 2007-096055

SUMMARY OF THE INVENTION

In a capacitor, a dielectric film is provided between a pair of electrodes at least one of which is formed, in many cases, using a light-blocking conductive film serving as a gate electrode, a source electrode, a drain electrode, or the like of a transistor.

In a liquid crystal display device, as the charge capacity of a capacitor is increased, a period in which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

One of methods for increasing the charge capacity of a capacitor is to increase the area occupied by the capacitor, specifically, to increase the area of a region where a pair of electrodes of the capacitor overlaps with each other. However, in a liquid crystal display device, when the area of a light-blocking conductive film is increased to increase the area of a region where a pair of electrodes overlaps with each other, the aperture ratio of a pixel is lowered and thus display quality of an image is degraded. Such a problem is remarkable particularly in a liquid crystal display device with high resolution.

Further, in a liquid crystal display device, alignment disorder of liquid crystal molecules causes a display defect. As examples of the alignment disorder, disclination, light leakage, and the like are given.

In the vicinity of an alignment film, the liquid crystal molecules are aligned in a state where one terminal of the liquid crystal molecule is lifted from the alignment film. In a liquid crystal molecule, a direction from a terminal that is the nearest to the alignment film to a terminal which is lifted from the alignment film is referred to as a "pretilt direction", which is orthographically projected on a substrate surface. An angle between a major axis of the liquid crystal molecule and the alignment film is referred to as a "pretilt angle".

Pretilt angles of adjacent liquid crystal molecules are almost the same; however, the pretilt directions are different, which causes alignment disorder of the liquid crystal molecules. The alignment disorder is referred to as "disclination". By the disclination, at the time of white display of the liquid crystal display device, a line defect occurs in a pixel.

In addition, because of step difference of a region where the alignment film is formed, pretilt angles of the liquid crystal molecules are different. As a result, alignment disorder is caused. The alignment disorder is referred to as "light leakage". By the light leakage, at the time of black display of the liquid crystal display device, contrast is degraded.

In view of the above, one object of one embodiment of the present invention is to provide a semiconductor device having a high aperture ratio and including a capacitor capable of increasing the charge capacity. Another object of one embodiment of the present invention is to provide a high-contrast semiconductor device. Another object of one embodiment of the present invention is to provide a semiconductor device using a light-transmitting electrode.

Note that the descriptions of these objects do not disturb the existence of other objects. In one embodiment of the present invention, there is no need to achieve all the objects.

One embodiment of the present invention is a semiconductor device including a transistor over a substrate, a first light-transmitting conductive film over the substrate, an oxide insulating film covering the transistor and having an opening over the first light-transmitting conductive film, a nitride insulating film over the oxide insulating film and in contact with the first light-transmitting conductive film in the opening, a second light-transmitting conductive film connected to the transistor and having a depressed portion in the opening, and an organic resin film with which the depressed portion of the second light-transmitting conductive film is filled.

Another embodiment of the present invention is a semiconductor device including a transistor over a substrate, a first light-transmitting conductive film over the substrate, an oxide insulating film covering the transistor and having an opening over the first light-transmitting conductive film, a nitride insulating film over the oxide insulating film and in contact with the first light-transmitting conductive film in the opening, and a second light-transmitting conductive film connected to the transistor and having a depressed portion in the opening. In the oxide insulating film having the opening, an angle between a surface of the first light-transmitting conductive film and a side surface of the oxide insulating film is greater than or equal to 5° and less than or equal to 45°, preferably greater than or equal to 5° and less than or equal to 30°, more preferably greater than or equal to 10° and less than or equal to 20°. Note that an organic resin film with which the depressed portion of the second light-transmitting conductive film is filled may be further included.

Note that the transistor includes a gate electrode over the substrate, a gate insulating film in contact with the gate electrode, an oxide semiconductor film in contact with the gate insulating film, and a pair of conductive films in contact with the oxide semiconductor film. The first light-transmitting conductive film is in contact with the gate insulating film.

Further, the oxide semiconductor film is formed at the same time as the first light-transmitting conductive film.

Further, the first light-transmitting conductive film and the oxide semiconductor film each contain at least one of In, Ga, and Zn.

According to one embodiment of the present invention, a semiconductor device having a high aperture ratio and including a capacitor capable of increasing the charge capacity can be manufactured. Further, according to one embodiment of the present invention, a high-contrast semiconductor device can be manufactured. Further, according to one embodiment of the present invention, a semiconductor device using a light-transmitting electrode can be manufactured.

BRIEF DESCRIPTION OF THE DRAWINGS

In the accompanying drawings:

FIGS. 6A to 6C are cross-sectional views illustrating one embodiment of a method for manufacturing a semiconductor device;

FIGS. 7A to 7C are cross-sectional views illustrating one embodiment of a method for manufacturing a semiconductor device;

FIGS. 8A to 8C are cross-sectional views illustrating one embodiment of a method for manufacturing a semiconductor device;

FIGS. 14A to 14C are cross-sectional views illustrating one embodiment of a method for manufacturing a semiconductor device;

FIGS. 15A and 15B are cross-sectional views illustrating one embodiment of a method for manufacturing a semiconductor device;

FIGS. 17A to 17C are cross-sectional views illustrating one embodiment of a method for manufacturing a semiconductor device;

FIGS. 22A to 22C are cross-sectional views illustrating one embodiment of a method for manufacturing a semiconductor device;

FIGS. 33A to 33C illustrate a touch sensor of one embodiment;

DETAILED DESCRIPTION OF THE INVENTION

Figure 1A:
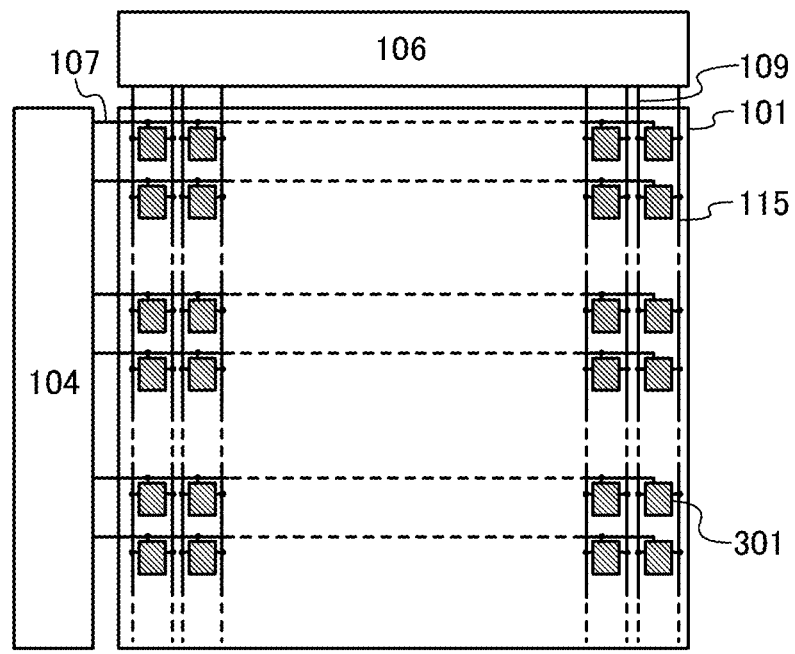
FIGS. 1A and 1B are a block diagram and a circuit diagram illustrating one embodiment of a semiconductor device.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed by the photolithography process is removed after the etching step.

Embodiment 1

In this embodiment, a semiconductor device which is one embodiment of the present invention and a manufacturing method thereof are described with reference to drawings.

FIG. 1A illustrates a liquid crystal display device as an example of a semiconductor device. FIG. 1A illustrates an example of a liquid crystal display device. The semiconductor device in FIG. 1A includes a pixel portion 101, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 101 includes a plurality of pixels 301 arranged in a matrix. Furthermore, capacitor lines 115 arranged in parallel or substantially in parallel are provided along the signal lines 109. Note that the capacitor lines 115 may be arranged in parallel or substantially in parallel along the scan lines 107. The scan line driver circuit 104 and the signal line driver circuit 106 are collectively referred to as a driver circuit portion in some cases.

Each scan line 107 is electrically connected to the n pixels 301 in the corresponding row among the pixels 301 arranged in m rows and n columns in the pixel portion 101. Each signal line 109 is electrically connected to the m pixels 301 in the corresponding column among the pixels 301 arranged in m rows and n columns. Note that m and n are each an integer of 1 or more. Each capacitor line 115 is electrically connected to the m pixels 301 in the corresponding column among the pixels 301 arranged in m rows and n columns. Note that in the case where the capacitor lines 115 are arranged in parallel or substantially in parallel along the scan lines 107, each capacitor line 115 is electrically connected to the n pixels 301 in the corresponding row among the pixels 301 arranged in m rows and n columns.

Figure 1B:
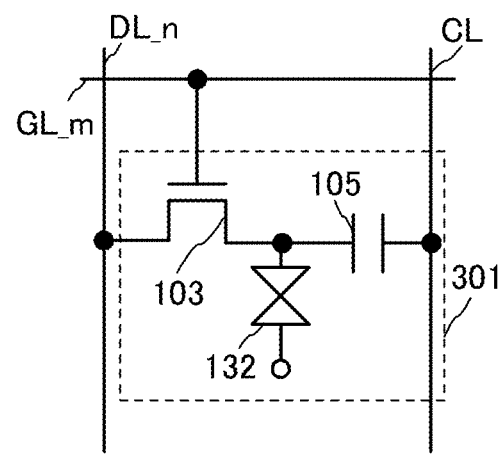

FIG. 1B illustrates circuit configurations that can be used for the pixels 301 in the liquid crystal display device illustrated in FIG. 1A.

The pixel 301 illustrated in FIG. 1B includes a liquid crystal element 132, a transistor 103, and a capacitor 105.

The potential of one of a pair of electrodes of the liquid crystal element 132 is set according to the specifications of the pixels 301 as appropriate. The alignment state of the liquid crystal element 132 depends on written data. A common potential may be applied to one of the pair of electrodes of the liquid crystal element 132 included in each of the plurality of pixel circuits 111. Further, the potential supplied to one of a pair of electrodes of the liquid crystal element 132 in the pixel 301 in one row may be different from the potential supplied to one of a pair of electrodes of the liquid crystal element 132 in the pixel 301 in another row. In the case of an IPS mode or an FFS mode, one of the pair of electrodes of the liquid crystal element 132 can be connected to a capacitor line CL.

As examples of a driving method of the liquid crystal display device including the liquid crystal element 132, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA mode, a PVA (patterned vertical alignment) mode, an IPS mode, an FFS mode, a TBA (transverse bend alignment) mode, and the like. Other examples of the driving method of the liquid crystal display device include ECB (electrically controlled birefringence) mode, PDLC (polymer dispersed liquid crystal) mode, PNLC (polymer network liquid crystal) mode, and a guest-host mode. Note that the present invention is not limited to these examples and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 301 in the m-th row and the n-th column, one of a source electrode and a drain electrode of the transistor 103 is electrically connected to a signal line DL_n, and the other is electrically connected to the other of a pair of electrodes of the liquid crystal element 132. A gate electrode of the transistor 103 is electrically connected to a scan line GL_m. The transistor 103 has a function of controlling whether to write a data signal by being turned on or off.

One of a pair of electrodes of the capacitor 105 is electrically connected to a wiring to which a potential is supplied (hereinafter referred to as a capacitor line CL), and the other is electrically connected to the other of the pair of electrodes of the liquid crystal element 132. The potential of the capacitor line CL is set according to the specifications of the pixel 301 as appropriate. The capacitor 105 functions as a storage capacitor for storing written data. In the case of an IPS mode or an FFS mode, one of the pair of electrodes of the capacitor 105 can be connected to one of the pair of electrodes of the liquid crystal element 132.

For example, in the liquid crystal display device including the pixel 301 in FIG. 1B, the pixels 301 are sequentially selected row by row by the scan line driver circuit 104, whereby the transistors 103 are turned on and a data signal is written.

When the transistors 103 are turned off, the pixels 301 in which the data has been written are brought into a holding state. This operation is sequentially performed row by row; thus, an image is displayed.

Note that in this specification and the like, examples of liquid crystal display devices having liquid crystal elements are a transmissive liquid crystal display device, a transflective liquid crystal display device, a reflective liquid crystal display device, a direct-view liquid crystal display device, and a projection liquid crystal display. An example of liquid crystal elements is an element where transmission and non-transmission of light is controlled by optical modulation action of liquid crystals. The element can be configured to include a pair of electrodes and a liquid crystal layer. The optical modulation action of liquid crystal is controlled by an electric field applied to the liquid crystal (including a lateral electric field, a vertical electric field and a diagonal electric field). Note that specifically, the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

Figure 2:
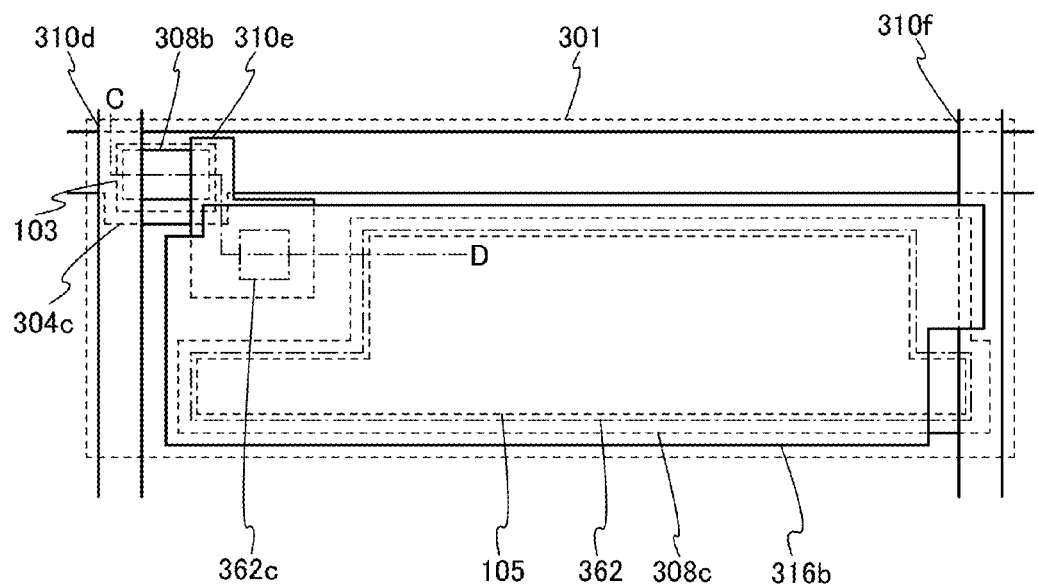
FIG. 2 is a top view illustrating one embodiment of a semiconductor device.

Next, a specific example of a liquid crystal display device including a liquid crystal element in the pixel 301 is described. FIG. 2 is a top view of the pixel 301 illustrated in FIG. 1B. Note that in FIG. 2, a counter electrode and a liquid crystal element are omitted.

In FIG. 2, a conductive film 304c serving as a scan line extends substantially perpendicularly to the signal line (in the horizontal direction in the drawing). A conductive film 310d serving as a signal line extends substantially perpendicularly to the scan line (in the vertical direction in the drawing). A conductive film 310f serving as a capacitor line extends in parallel to the signal line. Note that the conductive film 304c serving as a scan line is electrically connected to the scan line driver circuit 104 (see FIG. 1A), and the conductive film 310d serving as a signal line and the conductive film 310f serving as a capacitor line are electrically connected to the signal line driver circuit 106 (see FIG. 1A).

The transistor 103 is provided at a region where the scan line and the signal line cross each other. The transistor 103 includes the conductive film 304c serving as a gate electrode; the gate insulating film (not illustrated in FIG. 2); an oxide semiconductor film 308b where a channel region is formed, over the gate insulating film; and the conductive films 310d and 310e serving as a source electrode and a drain electrode. The conductive film 304c also serves as a scan line, and a region of the conductive film 304c that overlaps with the oxide semiconductor film 308b serves as the gate electrode of the transistor 103. In addition, the conductive film 310d also serves as a signal line, and a region of the conductive film 310d that overlaps with the oxide semiconductor film 308b serves as the source electrode or drain electrode of the transistor 103. Further, in the top view of FIG. 2, an end portion of the scan line is located on the outer side than an end portion of the oxide semiconductor film 308b. Thus, the scan line functions as a light-blocking film for blocking light from a light source such as a backlight. For this reason, the oxide semiconductor film 308b included in the transistor is not irradiated with light, so that a variation in the electrical characteristics of the transistor can be suppressed.

The conductive film 310e is electrically connected to the light-transmitting conductive film 316b that serves as a pixel electrode, through an opening 362c.

The capacitor 105 includes the light-transmitting conductive film 308c formed over the gate insulating film, a dielectric film formed of a nitride insulating film formed over the transistor 103, and a light-transmitting conductive film 316b that serves as a pixel electrode. That is, the capacitor 105 has a light-transmitting property. Further, the capacitor 105 is connected to the conductive film 310f serving as a capacitor line through the opening 362.

Here, the conductive film 316b preferably has a rectangular shape as illustrated in FIG. 2. Note that one embodiment of the present invention is not limited thereto. For example, the conductive film 316b can have a comb shape or a shape having a slit like a pixel electrode provided in a liquid crystal display device of an FFS mode, an IPS mode, or an MVA mode.

Thanks to the light-transmitting property of the capacitor 105, the capacitor 105 can be formed large (covers a large area) in the pixel 301. Thus, a liquid crystal display device having charge capacity increased while improving the aperture ratio, typically to 50% or more, preferably 55% or more, more preferably 60% or more can be obtained. For example, in a liquid crystal display device with a high resolution, the area of a pixel is small and thus the area of a capacitor is also small. For this reason, the charge capacity of the capacitor is small in the high-resolution liquid crystal display device. However, since the capacitor 105 of this embodiment has a light-transmitting property, when it is provided in a pixel, enough charge capacity can be obtained in the pixel and the aperture ratio can be improved. Typically, the capacitor 105 can be favorably used in a high-resolution liquid crystal display device with a pixel density of 200 ppi or more, or furthermore, 300 ppi or more.

The pixel 301 illustrated in FIG. 2 has a shape in which a side parallel to the conductive film 310d serving as a signal line is shorter than a side parallel to the conductive film 304c serving as a scan line and the conductive film 310f serving as a capacitor line extends in parallel to the conductive film 310d serving as a signal line. As a result, the area where the conductive film 310f occupies the pixel 301 can be decreased, thereby increasing the aperture ratio. In addition, the conductive film 310f serving as a capacitor line does not use a connection electrode, and is in a direct contact with the light-transmitting conductive film 308c and thus the aperture ratio can be further increased.

Further, according to one embodiment of the present invention, the aperture ratio can be improved even in a liquid crystal display device with a high resolution, which makes it possible to use light from a light source such as a backlight efficiently, so that power consumption of the liquid crystal display device can be reduced.

Figure 3:
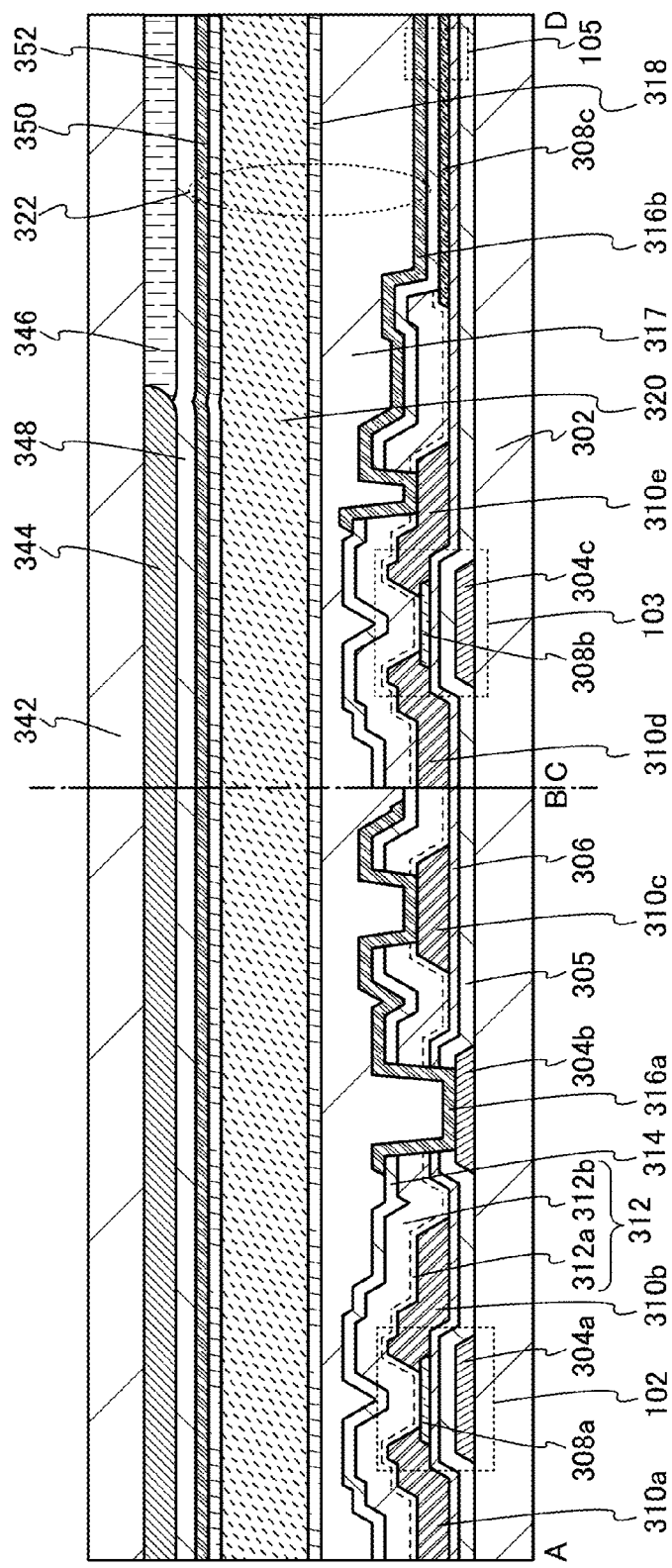
FIG. 3 is a cross-sectional view illustrating one embodiment of a semiconductor device.

Next, FIG. 3 shows a cross section taken along dashed-dotted line C-D in FIG. 2. Note that a cross section A-B in FIG. 3 is a cross-sectional view of a driver circuit portion (a top view thereof is omitted) including the scan line driver circuit 104 and the signal line driver circuit 106. In this embodiment, as a semiconductor device, a liquid crystal display device of a vertical electric field mode is described.

In the liquid crystal display device described in this embodiment, a liquid crystal element 322 is provided between a pair of substrates (a substrate 302 and a substrate 342).

The liquid crystal element 322 includes the light-transmitting conductive film 316b over the substrate 302, films controlling alignment (hereinafter referred to as alignment films 318 and 352), a liquid crystal layer 320, and a conductive film 350.

Note that the light-transmitting conductive film 316b functions as one electrode of the liquid crystal element 322, and the conductive film 350 functions as the other electrode of the liquid crystal element 322. Further, in this embodiment, a planarization film 317 is provided between the light-transmitting conductive film 316b and the alignment film 318. The planarization film 317 is an organic resin film with which at least a depressed portion of the light-transmitting conductive film 316b serving as a pixel electrode is filled. A depressed portion of the light-transmitting conductive film 316b which is provided in a region of a liquid crystal display device which transmits backlight, that is, an opening over the light-transmitting conductive film 308c and in an insulating film 312 is filled with the planarization film 317, whereby step difference of the region where the alignment film is formed can be reduced. In other words, step difference of the alignment film 318 provided over the light-transmitting conductive film 316b can be reduced. Note that the depth of the depressed portion corresponds to the thickness of the insulating film 312.

The planarization film 317 preferably has a light-transmitting property. Note that one embodiment of the present invention is not limited thereto. For example, the planarization film 317 can function as a color filter or a black matrix. In the case where the planarization film 317 functions as a color filter, a colored planarization film 317 may be formed in accordance with each pixel, for example, a red pixel, a blue pixel, and a green pixel.

Thus, a "liquid crystal display device" refers to a device including a liquid crystal element. Note that the liquid crystal display device includes a driver circuit for driving a plurality of pixels and the like. The liquid crystal display device may also be referred to as a liquid crystal module including a control circuit, a power supply circuit, a signal generation circuit, a backlight module, and the like provided over another substrate.

In the driver circuit portion, the transistor 102 includes the conductive film 304a functioning as a gate electrode, insulating films 305 and 306 collectively functioning as a gate insulating film, the oxide semiconductor film 308a in which a channel region is formed, and the conductive films 310a and 310b functioning as a source electrode and a drain electrode. The oxide semiconductor film 308a is provided over the gate insulating film. Further, insulating films 312 and 314 are provided as protective films over the conductive films 310a and 310b.

In the pixel portion, the transistor 103 includes the conductive film 304c functioning as a gate electrode, the insulating films 305 and 306 collectively functioning as a gate insulating film, the oxide semiconductor film 308b which is formed over the gate insulating film and in which a channel region is formed, and the conductive films 310d and 310e functioning as a source electrode and a drain electrode. The oxide semiconductor film 308b is provided over the gate insulating film. Further, insulating films 312 and 314 are provided as protective films over the conductive films 310d and 310e.

The light-transmitting conductive film 316b functioning as a pixel electrode is connected to the conductive film 310e through an opening provided in the insulating films 312 and 314.

Further, the capacitor 105 includes the light-transmitting conductive film 308c functioning as one electrode of the capacitor 105, the insulating film 314 functioning as a dielectric film, and the light-transmitting conductive film 316b functioning as the other electrode of the capacitor 105. The light-transmitting conductive film 308c is provided over the gate insulating film.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 316a formed at the same time as the light-transmitting conductive film 316b.

The conductive film 304b and the light-transmitting conductive film 316a are connected to each other through an opening provided in the insulating film 305, the insulating film 306, the insulating film 312, and the insulating film 314. Further, the conductive film 310c and the light-transmitting conductive film 316a are connected to each other through an opening provided in the insulating film 312 and the insulating film 314.

In this embodiment, in order to increase conductivity of the light-transmitting conductive film 308c serving as one electrode of the capacitor 105, an opening is formed in the insulating film 312. In the opening, by being in contact with the insulating film 314 formed using a nitride insulating film, the light-transmitting conductive film 308c has high conductivity. Further, in the opening, a depressed portion is formed in the light-transmitting conductive film 316b serving as the pixel electrode. Here, the liquid crystal display device described in this embodiment includes the planarization film 317 over the light-transmitting conductive film 316b serving as the pixel electrode, so that the depressed portion of the light-transmitting conductive film 316b is filled with the planarization film 317, and a surface of the planarization film 317 has few steps. As a result, step difference of a surface of the alignment film 318 provided over the planarization film 317 and uneven alignment of the liquid crystal can be reduced. Thus, display defects of the liquid crystal display device can be reduced.

Here, components of the display device shown in FIG. 3 are described below.

There is no particular limitation on a material and the like of the substrate 302 as long as the material has heat resistance high enough to withstand at least heat treatment performed later. For example, a glass substrate, a ceramic substrate, a quartz substrate, or a sapphire substrate may be used as the substrate 302. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 302. In the case where a glass substrate is used as the substrate 302, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized liquid crystal display device can be manufactured.

Alternatively, a flexible substrate may be used as the substrate 302, and the transistor may be provided directly on the flexible substrate. Alternatively, a separation layer may be provided between the substrate 302 and the transistor. The separation layer can be used when part or the whole of an element portion formed over the separation layer is completed and separated from the substrate 302 and transferred to another substrate. In such a case, the transistor can be transferred to a substrate having low heat resistance or a flexible substrate as well.

The conductive films 304a, 304b, and 304c each can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese or zirconium may be used. The conductive films 304a, 304b, and 304c each may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive films 304a, 304b, and 304c each can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride film, an In—Sn-based oxynitride film, an In—Ga-based oxynitride film, an In—Zn-based oxynitride film, a Sn-based oxynitride film, an In-based oxynitride film, a film of a metal nitride (such as InN or ZnN), or the like may be provided between the conductive films 304a, 304b, and 304c and the insulating film 305 serving as part of the gate insulating film. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride film, an In—Ga—Zn-based oxynitride film whose nitrogen concentration is higher than at least those of the oxide semiconductor films 308a and 308b, specifically, an In—Ga—Zn-based oxynitride film whose nitrogen concentration is higher than or equal to 7 at. % is used.

The insulating films 305 and 306 are formed over the substrate 302 and the conductive films 304a, 304c, and 304b. The insulating films 305 and 306 function as a gate insulating film of the transistor 102 in the driver circuit portion and a gate insulating film of the transistor 103 in the pixel portion 101.

The insulating film 305 is preferably formed using a nitride insulating film such as a silicon nitride film, a silicon nitride oxide film, an aluminum nitride film, and an aluminum nitride oxide film.

The insulating film 306 can be formed to have a single-layer structure or a stacked-layer structure using, for example, any of silicon oxide, silicon oxynitride, silicon nitride oxide, silicon nitride, aluminum oxide, hafnium oxide, gallium oxide, and Ga—Zn-based metal oxide. The insulating film 306 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The total thickness of the insulating films 305 and 306 is greater than or equal to 5 nm and less than or equal to 400 nm, preferably greater than or equal to 10 nm and less than or equal to 300 nm, further preferably greater than or equal to 50 nm and less than or equal to 250 nm.

The oxide semiconductor films 308a and 308b and the light-transmitting conductive film 308c are formed over the insulating film 306. The oxide semiconductor film 308a is formed in a position overlapping with the conductive film 304a and functions as a channel region of the transistor 102 in the driver circuit portion. The oxide semiconductor film 308b is formed in a position overlapping with the conductive film 304c and functions as a channel region of the transistor 103 in the pixel portion. The light-transmitting conductive film 308c functions as one electrode of the capacitor 105.

The oxide semiconductor films 308a and 308b and the light-transmitting conductive film 308c each are typically an In—Ga oxide film, an In—Zn oxide film, or an In-M-Zn oxide film (M represents Al, Ti, Ga, Y, Zr, La, Ce, Nd, or Hf).

Note that in the case where the oxide semiconductor films 308a and 308b and the light-transmitting conductive film 308c each are an In-M-Zn oxide film, the proportions of In and M when summation of In and M is assumed to be 100 atomic % are preferably as follows: the atomic percentage of In is greater than or equal to 25 atomic % and the atomic percentage of M is less than 75 atomic %; further preferably, the atomic percentage of In is greater than or equal to 34 atomic % and the atomic percentage of M is less than 66 atomic %.

The energy gap of each of the oxide semiconductor films 308a and 308b and the light-transmitting conductive film 308c is 2 eV or more, preferably 2.5 eV or more, more preferably 3 eV or more. With the use of an oxide semiconductor having such a wide energy gap, the off-state current of the transistor can be reduced.

The thickness of each of the oxide semiconductor films 308a and 308b and the light-transmitting conductive film 308c is greater than or equal to 3 nm and less than or equal to 200 nm, preferably greater than or equal to 3 nm and less than or equal to 100 nm, more preferably greater than or equal to 3 nm and less than or equal to 50 nm.

As each of the oxide semiconductor films 308a and 308b and the light-transmitting conductive film 308c, an In—Ga—Zn oxide with an atomic ratio of In:Ga:Zn=1:1:1 or 3:1:2 can be used. Note that the atomic ratio of each of the oxide semiconductor films 308a and 308b and the light-transmitting conductive film 308c varies within a range of ±20% of the above atomic ratio as an error.

Both the oxide semiconductor films 308a and 308b and the light-transmitting conductive film 308c are formed over the gate insulating film (here, over the insulating film 306) but differ in impurity concentration. Specifically, the light-transmitting conductive film 308c has a higher impurity concentration than the oxide semiconductor films 308a and 308b. For example, the concentration of hydrogen contained in each of the oxide semiconductor films 308a and 308b is lower than $5\times10^{19}$ atoms/cm$^3$, preferably lower than $5\times10^{18}$ atoms/cm$^3$, more preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$. The concentration of hydrogen contained in the light-transmitting conductive film 308c is higher than or equal to $8\times10^{19}$ atoms/cm$^3$, preferably higher than or equal to $1\times10^{20}$ atoms/cm$^3$, further preferably higher than or equal to $5\times10^{20}$ atoms/cm$^3$. The concentration of hydrogen contained in the light-transmitting conductive film 308c is greater than or equal to 2 times, preferably greater than or equal to 10 times those in the oxide semiconductor films 308a and 308b.

The light-transmitting conductive film 308c has lower resistivity than the oxide semiconductor films 308a and 308b. The resistivity of the light-transmitting conductive film 308c is preferably greater than or equal to $1\times10^{-8}$ times and less than or equal to $1\times10^{-1}$ times the resistivity of the oxide semiconductor films 308a and 308b. The resistivity of the light-transmitting conductive film 308c is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

When silicon or carbon which is one of elements belonging to Group 14 is contained in the oxide semiconductor films 308a and 308b, oxygen vacancies are increased, and the oxide semiconductor films 308a and 308b each have an n-type region. Thus, the concentration of silicon or carbon (the concentration is measured by SIMS) of each of the oxide semiconductor films 308a and 308b is lower than or equal to $2\times10^{18}$ atoms/cm$^3$, preferably lower than or equal to $2\times10^{17}$ atoms/cm$^3$.

Further, the concentration of alkali metal or alkaline earth metal of each of the oxide semiconductor films 308a and 308b, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of each of the oxide semiconductor films 308a and 308b.

Further, when containing nitrogen, the oxide semiconductor films 308a and 308b each easily have an n-type region by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

An oxide semiconductor film with low carrier density is used as the oxide semiconductor films 308a and 308b. For example, an oxide semiconductor film whose carrier density is $1\times10^{17}$/cm$^3$ or lower, preferably $1\times10^{15}$/cm$^3$ or lower, more preferably $1\times10^{13}$/cm$^3$ or lower, much more preferably $1\times10^{11}$/cm$^3$ or lower is used as the oxide semiconductor films 308a and 308b.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor films 308a and 308b be set to be appropriate.

The oxide semiconductor films 308a and 308b are in contact with the films each formed using a material which can improve characteristics of the interface with the oxide semiconductor film, such as the insulating film 306 and the insulating film 312. Thus, the oxide semiconductor films 308a and 308b function as semiconductors, so that the transistors including the oxide semiconductor films 308a and 308b have excellent electrical characteristics.

Note that it is preferable to use, as the oxide semiconductor films 308a and 308b, an oxide semiconductor film in which the impurity concentration is low and density of defect states is low, in which case the transistor can have excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^{6}$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

The light-transmitting conductive film 308c is in contact with the insulating film 314 in the opening 362 (see FIG. 6A). The insulating film 314 prevents diffusion of impurities from the outside, such as water, alkali metal, and alkaline earth metal, into the oxide semiconductor film, and the insulating film 314 further includes hydrogen. Thus, when hydrogen in the insulating film 314 is diffused into the oxide semiconductor film formed at the same time as the oxide semiconductor films 308a and 308b, hydrogen is bonded to oxygen and electrons serving as carriers are generated in the oxide semiconductor film. As a result, the oxide semiconductor film has higher conductivity and functions as a conductor; in other words, the oxide semiconductor film can be an oxide semiconductor film with high conductivity. Here, a metal oxide which contains a material similar to those of the oxide semiconductor films 308a and 308b as a main component and has higher conductivity because hydrogen concentration of the metal oxide is higher than those of the oxide semiconductor films 308a and 308b is referred to as the "light-transmitting conductive film 308c".

The oxide semiconductor films 308a and 308b and the light-transmitting conductive film 308c may have a non-single crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect levels, whereas CAAC-OS has the lowest density of defect levels. Note that the oxide semiconductor films 308a and 308b and the light-transmitting conductive film 308c have the same crystallinity.

Note that the oxide semiconductor films 308a and 308b and the light-transmitting conductive film 308c each may be a mixed film including two or more of the following: a region having an amorphous structure, a region having a microcrystalline structure, a region having a polycrystalline structure, a CAAC-OS region, and a region having a single-crystal structure. The mixed film has a single-layer structure of two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

Note that one embodiment of the present invention is not limited thereto, and it is possible that the light-transmitting conductive film 308c be not in contact with the insulating film 314 depending on circumstances.

Further, one embodiment of the present invention is not limited thereto, and the light-transmitting conductive film 308c may be formed by a different process from that of the oxide semiconductor film 308a or the oxide semiconductor film 308b depending on circumstances. In that case, the light-transmitting conductive film 308c may include a different material from that of the oxide semiconductor film 308a or the oxide semiconductor film 308b. For example, the light-transmitting conductive film 308c may include indium tin oxide (hereinafter referred to as ITO), indium zinc oxide, or the like.

In the liquid crystal display device illustrated in this embodiment, one electrode of the capacitor is formed at the same time as the oxide semiconductor film of the transistor. In addition, the light-transmitting conductive film that serves as a pixel electrode is used as the other electrode of the capacitor. Thus, a step of forming another conductive film is not needed to form the capacitor, and the number of steps of manufacturing the liquid crystal display device can be reduced. Further, since the capacitor has a pair of electrodes formed with the light-transmitting conductive film, it can have a light-transmitting property. As a result, the area occupied by the capacitor can be increased and the aperture ratio in a pixel can be increased.

The conductive films 310a, 310b, 310c, 310d, and 310e are formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The insulating films 312 and 314 are formed over the insulating film 306, the oxide semiconductor films 308a and 308b, the light-transmitting conductive film 308c, and the conductive films 310a, 310b, 310c, 310d, and 310e. For the insulating film 312, in a manner similar to that of the insulating film 306, a material which can improve characteristics of the interface with the oxide semiconductor film is preferably used. The insulating film 312 can be formed using an oxide insulating film. Here, the insulating film 312 is formed by stacking insulating films 312a and 312b.

The insulating film 312a is an oxide insulating film through which oxygen is passed. Note that the insulating film 312a also serves as a film which relieves damage to the oxide semiconductor films 308a and 308b and the light-transmitting conductive film 308c at the time of forming the insulating film 312b later.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 312a. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the amount of defects in the insulating film 312a be small, typically the spin density of a signal which appears at g=2.001 due to a dangling bond of silicon, be lower than or equal to $3 \times 10^{17}$ spins/cm$^3$ by ESR measurement. This is because if the density of defects in the insulating film 312a is high, oxygen is bonded to the defects and the amount of oxygen that passes through the insulating film 312a is decreased.

Further, it is preferable that the amount of defects at the interface between the insulating film 312a and the oxide semiconductor film 308a, the oxide semiconductor film 308b, and the light-transmitting conductive film 308c be small, typically the spin density of a signal which appears at g=1.93 due to an oxygen vacancy in the oxide semiconductor films 308a and 308b and the light-transmitting conductive film 308c be lower than or equal to $1 \times 10^{17}$ spins/cm$^3$, more preferably lower than or equal to the lower limit of detection by ESR measurement.

Note that in the insulating film 312a, all oxygen entering the insulating film 312a from the outside does not move to the outside of the insulating film 312a and some oxygen remains in the insulating film 312a. Further, movement of oxygen occurs in the insulating film 312a in some cases in such a manner that oxygen enters the insulating film 312a and oxygen contained in the insulating film 312a is moved to the outside of the insulating film 312a.

When the oxide insulating film through which oxygen is passed is formed as the insulating film 312a, oxygen released from the insulating film 312b provided over the insulating film 312a can be moved to the oxide semiconductor films 308a and 308b and the light-transmitting conductive film 308c through the insulating film 312a.

The insulating film 312b is formed in contact with the insulating film 312a. The insulating film 312b is preferably formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film containing oxygen at a higher proportion than the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 312b.

Further, it is preferable that the amount of defects in the insulating film 312b be small, typically the spin density of a signal which appears at g=2.001 originating from a dangling bond of silicon, be lower than $1.5 \times 10^{18}$ spins/cm$^3$, more preferably lower than or equal to $1 \times 10^{18}$ spins/cm$^3$ by ESR measurement. Note that the insulating film 312b is provided more apart from the oxide semiconductor films 308a and 308b and the light-transmitting conductive film 308c than the insulating film 312a is; thus, the insulating film 312b may have higher defect density than the insulating film 312a.

Further, it is possible to prevent outward diffusion of oxygen from the oxide semiconductor films 308a and 308b and the light-transmitting conductive film 308c by providing the nitride insulating film having a blocking effect against oxygen, hydrogen, water, alkali metal, alkaline earth metal, and the like as the insulating film 314. The nitride insulating film is formed using silicon nitride, silicon nitride oxide, aluminum nitride, aluminum nitride oxide, or the like.

Note that over the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given. In order to control the charge capacity of the capacitor, a nitride insulating film or an oxide insulating film may be further provided over the nitride insulating film having a blocking effect against oxygen, hydrogen, water, alkali metal, alkaline earth metal, and the like, as appropriate.

Further, the light-transmitting conductive films 316a and 316b are provided over the insulating film 314. The light-transmitting conductive film 316a is electrically connected to the conductive film 304b through the opening 364a (see FIG. 6C) and electrically connected to the conductive film 310c through the opening 364b (see FIG. 6C). That is, the light-transmitting conductive film 316a functions as a connection electrode which connects the conductive film 304b and the conductive film 310c. The light-transmitting conductive film 316b is electrically connected to the conductive film 310e through the opening 364c (see FIG. 6C) and functions as the pixel electrode of a pixel. Further, the light-transmitting conductive film 316b can function as one of the pair of electrodes of the capacitor.

In order to form a connection structure in which the conductive film 304b is in direct contact with the conductive film 310c, it is necessary to perform patterning for forming an opening in the insulating films 305 and 306 and to form a mask before the conductive film 310c is formed. However, when the conductive film 304b is connected to the conductive film 310c with the light-transmitting conductive film 316a as shown in FIG. 3, it is not necessary to form a connection portion where the conductive film 304b is in contact with the conductive film 310c. Thus, the number of photomasks can be reduced by one. That is, steps of forming a liquid crystal display device can be reduced.

For the light-transmitting conductive films 316a and 316b, a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added can be used.

The planarization film 317 can be formed using an organic resin such as an acrylic resin, polyimide, and an epoxy resin. The thickness of the planarization film 317 is greater than or equal to the thickness of the insulating film 312 and less than or equal to 1500 nm, preferably greater than or equal to the thickness of the insulating film 312 and less than or equal to 1000 nm. The thickness of the planarization film 317 is greater than or equal to the thickness of the insulating film 312, whereby the depressed portion of the light-transmitting conductive film 316b can be filled with the planarization film 317; thus, the step difference of the region where the alignment film 318 is formed can be reduced. In the case where the thickness of the planarization film 317 is thick, when the alignment of the liquid crystal molecules included in the liquid crystal layer 320 is controlled, a voltage supplied to the light-transmitting conductive film 316b serving as the pixel electrode needs to be large and power consumption becomes high; thus, the thickness of the planarization film 317 is preferably less than or equal to 1500 nm.

By forming the planarization film 317 using an organic resin, at least the depressed portion of the light-transmitting conductive film 316b serving as the pixel electrode can be filled with the planarization film 317, so that the uneven alignment of the liquid crystal molecules included in the liquid crystal layer 320 can be reduced.

The alignment film 318 can be formed using an organic resin such as polyimide. The thickness of the alignment film 318 is greater than or equal to 40 nm and less than or equal to 100 nm, preferably greater than or equal to 50 nm and less than or equal to 90 nm. With such a thickness, the pretilt angles of the liquid crystal molecules can be made large, which can reduce disclination.

A film having a colored property (hereinafter referred to as a colored film 346) is formed on the substrate 342. The colored film 346 functions as a color filter. Further, a light-blocking film 344 adjacent to the colored film 346 is formed on the substrate 342. The light-blocking film 344 functions as a black matrix. The colored film 346 is not necessarily provided in the case where the liquid crystal display device is a monochrome display device, for example.

The colored film 346 is a colored film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 344 preferably has a function of blocking light in a particular wavelength region, and can be a metal film or an organic insulating film including a black pigment.

An insulating film 348 is formed on the colored film 346. The insulating film 348 functions as a planarization layer or suppresses diffusion of impurities in the colored film 346 to the liquid crystal element side.

The conductive film 350 is formed on the insulating film 348. The conductive film 350 functions as the other of the pair of electrodes of the liquid crystal element in the pixel portion. Note that the insulating film 352 is formed on the light-transmitting conductive films 316a and 316b and the conductive film 350.

The liquid crystal layer 320 is formed between the light-transmitting conductive film 316a and the conductive film 350, and the light-transmitting conductive film 316b and the conductive film 350. The liquid crystal layer 320 is sealed between the substrate 302 and the substrate 342 with the use of a sealant (not illustrated). The sealant is preferably in contact with an inorganic material to prevent entry of moisture and the like from the outside.

A spacer may be provided between the light-transmitting conductive film 316a and the conductive film 350, and the light-transmitting conductive film 316b and the conductive film 350 to maintain the thickness of the liquid crystal layer 320 (also referred to as a cell gap).

A formation method of the element portion over the substrate 302 in the liquid crystal display device illustrated in FIG. 3 is described with reference to FIGS. 4A to 4C, FIGS. 5A to 5C, FIGS. 6A to 6C, and FIGS. 7A to 7C. Here, the element portion provided over the substrate 302 refers to a region sandwiched between the substrate 302 and the alignment film 318.

First, the substrate 302 is prepared. Here, a glass substrate is used as the substrate 302.

Then, a conductive film is formed over the substrate 302 and processed into desired regions, so that the conductive films 304a, 304b, and 304c are formed. The conductive films 304a, 304b, and 304c can be formed in such a manner that a mask is formed over the desired regions by first patterning and regions not covered with the mask are etched (see FIG. 4A).

The conductive films 304a, 304b, and 304c can be typically formed by an evaporation method, a CVD method, a sputtering method, a spin coating method, or the like.

Figure 4A:
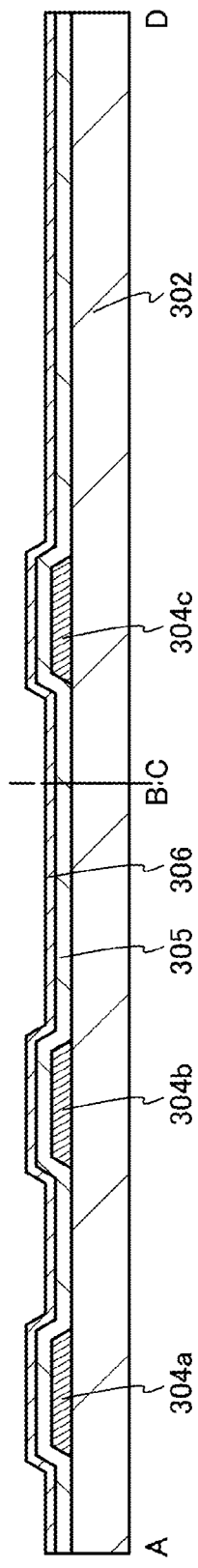
FIGS. 4A to 4C are cross-sectional views illustrating one embodiment of a method for manufacturing a semiconductor device.

Next, the insulating film 305 is formed over the substrate 302 and the conductive films 304a, 304b, and 304c, and then the insulating film 306 is formed over the insulating film 305 (see FIG. 4A).

The insulating films 305 and 306 can be formed by a sputtering method, a CVD method, or the like. Note that it is preferable that the insulating films 305 and 306 be formed in succession in a vacuum, in which case entry of impurities is suppressed.

Figure 4B:
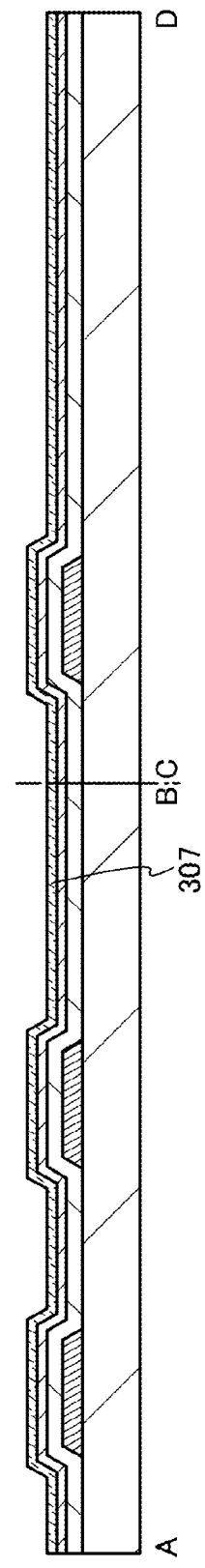

Next, an oxide semiconductor film 307 is formed over the insulating film 306 (see FIG. 4B).

The oxide semiconductor film 307 can be formed by a sputtering method, a coating method, a pulsed laser deposition method, a laser ablation method, or the like.

Next, the oxide semiconductor film 307 is processed into desired regions, so that the island-shaped oxide semiconductor films 308a, 308b, and 308d are formed. The oxide semiconductor films 308a, 308b, and 308d can be formed in such a manner that a mask is formed over the desired regions by second patterning and regions not covered with the mask are etched. For the etching, dry etching, wet etching, or a combination of both can be employed (see FIG. 4C).

After that, hydrogen, water, and the like may be released from the oxide semiconductor films 308a, 308b, and 308d by heat treatment and at least hydrogen concentration in the oxide semiconductor films 308a, 308b, and 308d may be reduced. As a result, highly purified oxide semiconductor films 308a, 308b, and 308d can be formed. The heat treatment is performed typically at a temperature higher than or equal to 250° C. and lower than or equal to 650° C., preferably higher than or equal to 300° C. and lower than or equal to 500° C. The heat treatment is performed typically at a temperature higher than or equal to 300° C. and lower than or equal to 400° C., preferably higher than or equal to 320° C. and lower than or equal to 370° C., whereby warp or shrinking of a large-sized substrate can be reduced and yield can be improved.

An electric furnace, an RTA apparatus, or the like can be used for the heat treatment. With the use of an RTA apparatus, the heat treatment can be performed at a temperature of higher than or equal to the strain point of the substrate if the heating time is short. Thus, the heat treatment time can be shortened and warp of the substrate during the heat treatment can be reduced, which is particularly preferable in a large-sized substrate.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like. Further, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancies in the oxide semiconductor film can be reduced.

In the case where the deposition temperature of an insulating film 311a formed later is higher than or equal to 280° C. and lower than or equal to 400° C., hydrogen, water, and the like can be released from the oxide semiconductor films 308a, 308b, and 308d; thus, the heat treatment is not necessary.

Figure 5A:
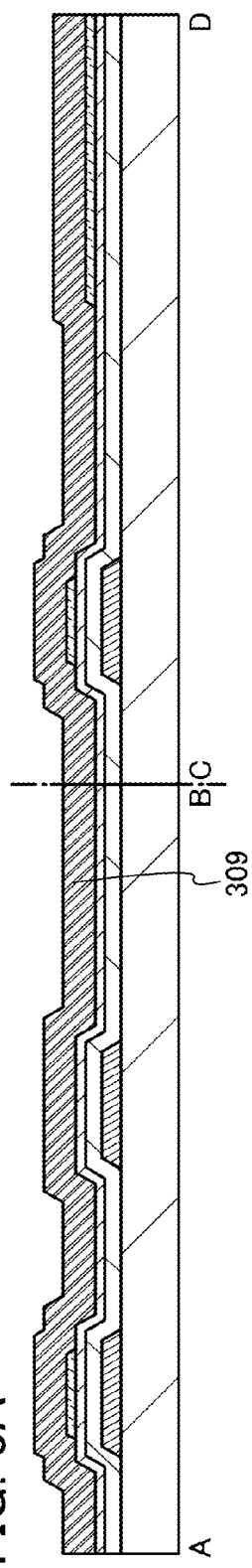
FIGS. 5A to 5C are cross-sectional views illustrating one embodiment of a method for manufacturing a semiconductor device.

Next, a conductive film 309 is formed over the insulating film 306 and the oxide semiconductor films 308a, 308b, and 308d (see FIG. 5A).

The conductive film 309 can be formed by a sputtering method, for example.

Then, the conductive film 309 is processed into desired regions, so that the conductive films 310a, 310b, 310c, 310d, and 310e are formed. The conductive films 310a, 310b, 310c, 310d, and 310e can be formed in such a manner that a mask is formed over the desired regions by third patterning and regions not covered with the mask are etched (see FIG. 5B).

Figure 5B:
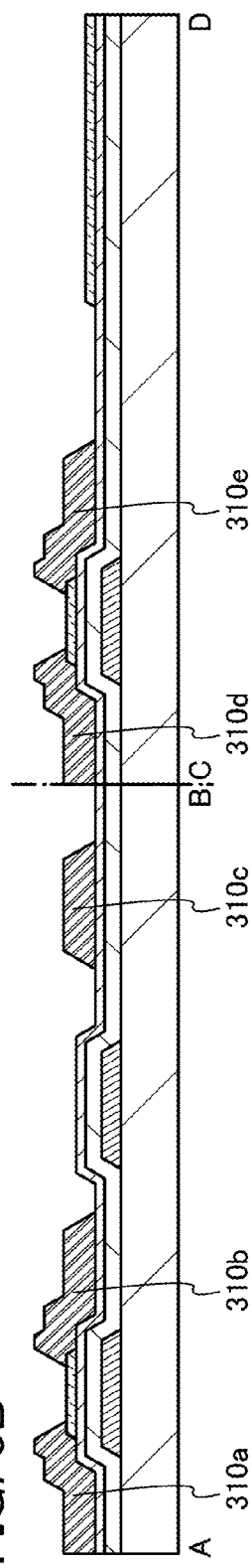
Figure 5C:
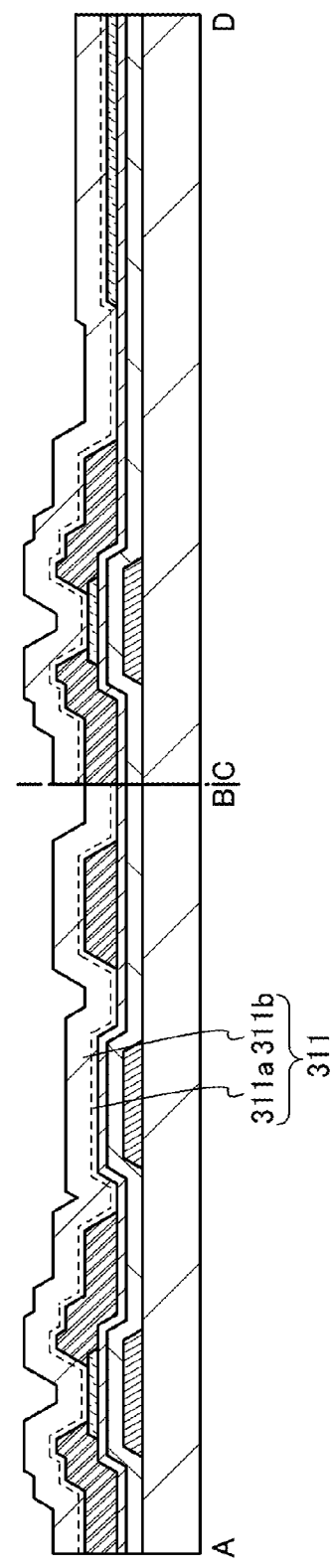

Next, an insulating film 311 in which insulating films 311a and 311b are stacked is formed to cover the insulating film 306, the oxide semiconductor films 308a, 308b, and 308d, and the conductive films 310a, 310b, 310c, 310d, and 310e (see FIG. 5C).

Note that after the insulating film 311a is formed, the insulating film 311b is preferably formed in succession without exposure to the air. After the insulating film 311a is formed, the insulating film 311b is formed in succession by adjusting at least one of the flow rate of a source gas, pressure, a high-frequency power, and a substrate temperature without exposure to the air, whereby the concentration of impurities attributed to the atmospheric component at the interface between the insulating film 311a and the insulating film 311b can be reduced and oxygen in the insulating film 311b can be moved to the oxide semiconductor films 308a, 308b, and 308d; accordingly, the amount of oxygen vacancies in the oxide semiconductor films 308a, 308b, and 308d can be reduced.

As the insulating film 311a, a silicon oxide film or a silicon oxynitride film can be formed under the following conditions:

the substrate placed in a treatment chamber of a plasma CVD apparatus that is vacuum-evacuated is held at a temperature higher than or equal to 180° C. and lower than or equal to 400° C., preferably higher than or equal to 200° C. and lower than or equal to 370° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the insulating film 311a. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film through which oxygen is passed can be formed as the insulating film 311a. Further, by providing the insulating film 311a, damage to the oxide semiconductor films 308a, 308b, and 308d can be reduced in a step of forming the insulating film 311b which is formed later.

As for the insulating film 311a, a silicon oxide film or a silicon oxynitride film can be formed as the insulating film 311a under the following conditions: the substrate placed in a treatment chamber of a plasma CVD apparatus that is vacuum-evacuated is held at a temperature higher than or equal to 280° C. and lower than or equal to 400° C., the pressure is greater than or equal to 100 Pa and less than or equal to 250 Pa with introduction of a source gas into the treatment chamber, and a high-frequency power is supplied to an electrode provided in the treatment chamber.

Under the above film formation conditions, the bonding strength of silicon and oxygen becomes strong when the substrate temperature is the deposition temperature of the insulating film 311a. Thus, as the insulating film 311a, a dense and hard oxide insulating film through which oxygen is passed, typically, a silicon oxide film or a silicon oxynitride film of which etching using hydrofluoric acid of 0.5 wt % at 25° C. is performed at a rate of lower than or equal to 10 nm/min, preferably lower than or equal to 8 nm/min can be formed.

The insulating film 311a is formed while heating is performed; thus, hydrogen, water, or the like contained in the oxide semiconductor films 308a, 308b, and 308d can be released in the step.

Further, time for heating in a state where the oxide semiconductor films 308a, 308b, and 308d are exposed can be shortened because heating is performed in a step of forming the insulating film 311a. Thus, the amount of oxygen released from the oxide semiconductor film by heat treatment can be reduced. That is, the amount of oxygen vacancies in the oxide semiconductor film can be reduced.

Note that by setting the pressure in the treatment chamber to be greater than or equal to 100 Pa and less than or equal to 250 Pa, the amount of water contained in the insulating film 311a is reduced; thus, variation in electrical characteristics of the transistor can be reduced and change in threshold voltage can be inhibited.

Further, by setting the pressure in the treatment chamber to be greater than or equal to 100 Pa and less than or equal to 250 Pa, damage to the oxide semiconductor films 308a, 308b, and 308d can be reduced when the insulating film 311a is formed, so that the amount of oxygen vacancies contained in the oxide semiconductor films 308a, 308b, and 308d can be reduced. In particular, when the film formation temperature of the insulating film 311a or the insulating film 311b which is formed later is set to be high, typically higher than 220° C., part of oxygen contained in the oxide semiconductor films 308a, 308b, and 308d is released and oxygen vacancies are easily formed. Further, when the film formation conditions for reducing the amount of defects in the insulating film 311b which is formed later are used to increase reliability of the transistor, the amount of released oxygen is easily reduced. Thus, it is difficult to reduce oxygen vacancies in the oxide semiconductor films 308a, 308b, and 308d in some cases. However, by setting the pressure in the treatment chamber to be greater than or equal to 100 Pa and less than or equal to 250 Pa to reduce damage to the oxide semiconductor films 308a, 308b, and 308d at the time of forming the insulating film 311a, oxygen vacancies in the oxide semiconductor films 308a, 308b, and 308d can be reduced even when the amount of oxygen released from the insulating film 311b is small.

Note that when the ratio of the amount of the oxidizing gas to the amount of the deposition gas containing silicon is 100 or higher, the hydrogen content in the insulating film 311a can be reduced. Consequently, the amount of hydrogen entering the oxide semiconductor films 308a, 308b, and 308d can be reduced; thus, the negative shift in the threshold voltage of the transistor can be inhibited.

As the insulating film 311b, a silicon oxide film or a silicon oxynitride film is formed under the conditions as follows: the substrate placed in a vacuum-evacuated treatment chamber of a plasma CVD apparatus is held at a temperature higher than or equal to 180° C. and lower than or equal to 280° C., preferably higher than or equal to 200° C. and lower than or equal to 240° C.; to the treatment chamber is charged a source gas at a pressure greater than or equal to 100 Pa and less than or equal to 250 Pa, preferably greater than or equal to 100 Pa and less than or equal to 200 Pa; and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

A deposition gas containing silicon and an oxidizing gas are preferably used as the source gas of the insulating film 311b. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the insulating film 311b, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the insulating film 311b becomes higher than the stoichiometric composition. However, when the substrate temperature is the deposition temperature of the insulating film 311b, the bond between silicon and oxygen is weak, and accordingly, part of oxygen is released by heat treatment. Thus, it is possible to form an oxide insulating film which contains oxygen at a higher proportion than the stoichiometric composition and from which part of oxygen is released by heating. Further, the insulating film 311a is provided over the oxide semiconductor films 308a, 308b, and 308d. Accordingly, in the step of forming the insulating film 311b, the insulating film 311a serves as a protective film of the oxide semiconductor films 308a, 308b, and 308d. Consequently, the insulating film 311b can be formed using the high-frequency power having a high power density while damage to the oxide semiconductor films 308a, 308b, and 308d is reduced.

Note that in the film formation conditions of the insulating film 311b, the flow rate of the deposition gas containing silicon relative to the oxidizing gas can be increased, whereby the amount of defects in the insulating film 311b can be reduced. Typically, it is possible to form an oxide insulating film in which the amount of defects is small, i.e. the spin density of a signal which appears at g=2.001 originating from a dangling bond of silicon is lower than $6\times10^{17}$ spins/cm$^3$, preferably lower than or equal to $3\times10^{17}$ spins/cm$^3$, more preferably lower than or equal to $1.5\times10^{17}$ spins/cm$^3$ by ESR measurement. As a result, the reliability of the transistor can be improved.

Next, heat treatment is performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. The heat treatment is performed typically at a temperature higher than or equal to 300° C. and lower than or equal to 400° C., preferably higher than or equal to 320° C. and lower than or equal to 370° C., whereby warp or shrinking of a large-sized substrate can be reduced and yield can be improved.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the insulating film 311b can be moved to the oxide semiconductor films 308a, 308b, and 308d to reduce the oxygen vacancies in the oxide semiconductor films 308a, 308b, and 308d. Consequently, the amount of oxygen vacancies in the oxide semiconductor films 308a, 308b, and 308d can be further reduced.

Further, in the case where water, hydrogen, or the like is contained in the insulating film 311a and the insulating film 311b, when the insulating film 313 having a function of blocking water, hydrogen, and the like is formed later and heat treatment is performed, water, hydrogen, or the like contained in the insulating film 311a and the insulating film 311b are moved to the oxide semiconductor films 308a, 308b, and 308d, so that defects are generated in the oxide semiconductor films 308a, 308b, and 308d. However, by the heating, water, hydrogen, or the like contained in the insulating film 311a and the insulating film 311b can be released; thus, variation in electrical characteristics of the transistor can be reduced, and change in threshold voltage can be inhibited.

Note that when the insulating film 311b is formed over the insulating film 311a while being heated, oxygen can be moved to the oxide semiconductor films 308a, 308b, and 308d to compensate the oxygen vacancies in the oxide semiconductor films 308a, 308b, and 308d; thus, the heat treatment is not necessarily performed.

Further, when the conductive films 310a, 310b, 310c, 310d, and 310e are formed, the oxide semiconductor films 308a, 308b, and 308d are damaged by the etching of the conductive film, so that oxygen vacancies are generated on the back channel sides (the sides of the oxide semiconductor films 308a and 308b which are opposite to the sides facing the conductive films 304a and 304c which serve as gate electrodes) of the oxide semiconductor films 308a and 308b. However, with the use of the oxide insulating film containing oxygen at a higher proportion than the stoichiometric composition as the insulating film 311b, the oxygen vacancies generated on the back channel side can be repaired by heat treatment. By this, defects contained in the oxide semiconductor films 308a and 308b can be reduced, and thus, the reliability of the transistor can be improved.

Note that the heat treatment may be performed after the formation of the opening 362 to be formed later.

Next, the insulating film 311 is processed into desired regions so that the insulating film 312 and the opening 362 are formed. The insulating film 312 and the opening 362 can be formed in such a manner that a mask is formed over the desired regions by fourth patterning and regions not covered with the mask are etched (see FIG. 6A).

The opening 362 is formed so as to expose the surface of the oxide semiconductor film 308d. An example of a formation method of the opening 362 includes, but not limited to, a dry etching method. Alternatively, a wet etching method or a combination of dry etching and wet etching can be employed for formation of the opening 362.

Next, an insulating film 313 is formed over the insulating film 312 and the oxide semiconductor film 308d (see FIG. 6B).

The insulating film 313 is preferably formed using a material that can prevent an external impurity such as oxygen, hydrogen, water, alkali metal, and alkaline earth metal, from diffusing into the oxide semiconductor film, more preferably formed using the material including hydrogen, and typically an inorganic insulating material containing nitrogen, such as a nitride insulating film, can be used. The insulating film 313 can be formed by a CVD method or a sputtering method, for example.

When the insulating film 313 is formed by a plasma CVD method or a sputtering method, the oxide semiconductor film is exposed to plasma and oxygen vacancies are generated in the oxide semiconductor film. The insulating film 313 is formed using a material which prevents diffusion of impurities from the outside, such as water, an alkali metal, and an alkaline earth metal, into the oxide semiconductor film, and the material further includes hydrogen. Thus, when hydrogen in the insulating film 313 diffuses into the oxide semiconductor film 308d, hydrogen is bonded to oxygen in the oxide semiconductor film 308d, thereby producing an electron serving as a carrier. Alternatively, hydrogen enters into the oxygen vacancies in the oxide semiconductor film, whereby an electron serving as a carrier is produced. As a result, the conductivity of the oxide semiconductor film 308d is increased, so that the oxide semiconductor film 308d becomes a light-transmitting conductive film 308c.

The insulating film 313 is preferably formed at a high temperature to have an improved blocking property; for example, the silicon nitride film is preferably formed at a temperature in the range from the substrate temperature of 100° C. to 400° C., more preferably at a temperature in the range from 300° C. to 400° C. When the silicon nitride film is formed at a high temperature, a phenomenon in which oxygen is released from the oxide semiconductor used for the oxide semiconductor films 308a and 308b and the carrier density is increased is caused in some cases; therefore, the upper limit of the temperature is a temperature at which the phenomenon is not caused.

Then, the insulating film 313 is processed into desired regions so that the insulating film 314 and the openings 364a, 364b, and 364c are formed. The insulating film 314 and the openings 364a, 364b, and 364c can be formed in such a manner that a mask is formed over the desired regions by fifth patterning and regions not covered by the mask are etched (see FIG. 6C).

The opening 364a is formed so as to expose a surface of the conductive film 304a. The opening 364b is formed so as to expose the conductive film 310c. The opening 364c is formed so as to expose the conductive film 310e.

An example of a formation method of the openings 364a, 364b, and 364c includes, but not limited to, a dry etching method. Alternatively, a wet etching method or a combination of dry etching and wet etching can be employed for formation of the openings 364a, 364b, and 364c.

Then, a conductive film 315 is formed over the insulating film 314 so as to cover the openings 364a, 364b, and 364c (see FIG. 7A).

The conductive film 315 can be formed by a sputtering method, for example.

Then, the conductive film 315 is processed into desired regions so that the light-transmitting conductive films 316a and 316b are formed. The light-transmitting conductive films 316a and 316b are formed in such a manner that a mask is formed in the desired regions by sixth patterning and regions not covered with the mask are etched (see FIG. 7B).

Next, the planarization film 317 is formed to cover the insulating film 314 and the conductive films 316a and 316b (see FIG. 7C).

The planarization film 317 is formed by a wet method such as a spin coating method, a dip coating method, a slit coating method, an inkjet method, and a printing method, whereby the planarization film 317 having a flat surface can be formed without being affected by the step difference of the region where the planarization film 317 is formed. In the case where the planarization film 317 is formed by a spin coating method, a dip coating method, or a slit coating method, a composition is applied, and then a mask is formed over desired regions by seventh patterning and regions not covered by the mask are etched, so that the planarization film 317 can be formed.

Through the above process, the pixel portion and the driver circuit portion that include transistors can be formed over the substrate 302. In the manufacturing process described in this embodiment, the transistors and the capacitor can be formed at the same time by the first to sixth patterning or by the first to seventh patterning, that is, with the six masks or with the seven masks.

In this embodiment, the conductivity of the oxide semiconductor film 308d is increased by diffusing hydrogen contained in the insulating film 314 into the oxide semiconductor film 308d; however, the conductivity of the oxide semiconductor film 308d may be increased by covering the oxide semiconductor films 308a and 308b with a mask and adding impurities, typically, hydrogen, boron, phosphorus, tin, antimony, a rare gas element, alkali metal, alkaline earth metal, or the like to the oxide semiconductor film 308d. Hydrogen, boron, phosphorus, tin, antimony, a rare gas element, or the like is added to the oxide semiconductor film 308d by an ion doping method, an ion implantation method, or the like. Further, alkali metal, alkaline earth metal, or the like may be added to the oxide semiconductor film 308d by a method in which the oxide semiconductor film 308d is exposed to a solution that contains the impurity.

Although the variety of films such as the oxide semiconductor film and the inorganic insulating film which are described in the above embodiment can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the oxide semiconductor film and the inorganic insulating film which are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is In$(CH_3)_3$. The chemical formula of trimethylgallium is Ga$(CH_3)_3$. The chemical formula of dimethylzinc is Zn$(CH_3)_2$. Without limitation to the above combination, triethylgallium (chemical formula: Ga$(C_2H_5)_3$) can be used instead of trimethylgallium and diethylzinc (chemical formula: Zn$(C_2H_5)_2$) can be used instead of dimethylzinc.

For example, in the case where a hafnium oxide film is formed using a deposition apparatus employing ALD, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is Hf$[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

Next, an element portion formed over the substrate 342 provided so as to face the substrate 302 is described below. Here, the element portion provided over the substrate 342 refers to a region sandwiched between the substrate 342 and the alignment film 352.

First, the substrate 342 is prepared. For materials of the substrate 342, the materials that can be used for the substrate 302 can be referred to. Then, the light-blocking film 344 and the colored film 346 are formed over the substrate 342 (see FIG. 8A).

The light-blocking film 344 and the colored film 346 each are formed in a desired position with any of various materials by a printing method, an inkjet method, an etching method using a photolithography technique, or the like.

Then, the insulating film 348 is formed over the light-blocking film 344 and the colored film 346 (see FIG. 8B).

For the insulating film 348, an organic insulating film of an acrylic resin, an epoxy resin, polyimide, or the like can be used. With the insulating film 348, an impurity or the like contained in the colored film 346 can be prevented from diffusing into the liquid crystal layer 320, for example. Note that the insulating film 348 is not necessarily formed.

Then, the conductive film 350 is formed over the insulating film 348 (see FIG. 8C). As the conductive film 350, a material that can be used for the conductive films 316a and 316b can be used.

Through the above process, the structure formed over the substrate 342 can be formed.

Next, the alignment film 318 and the alignment film 352 are formed over the substrate 302 and the substrate 342 respectively, specifically, over the insulating film 314 and the light-transmitting conductive films 316a and 316b formed over the substrate 302 and over the conductive film 350 formed over the substrate 342. The alignment films 318 and 352 can be formed by a rubbing method, an optical alignment method, or the like. After that, the liquid crystal layer 320 is formed between the substrate 302 and the substrate 342. The liquid crystal layer 320 can be formed by a dispenser method (a dropping method), or an injecting method by which a liquid crystal is injected using a capillary phenomenon after the substrate 302 and the substrate 342 are bonded to each other.

Through the above process, the liquid crystal display device illustrated in FIG. 3 can be fabricated.

This embodiment can be combined with another embodiment in this specification as appropriate.

Modification Example 1

Figure 9:
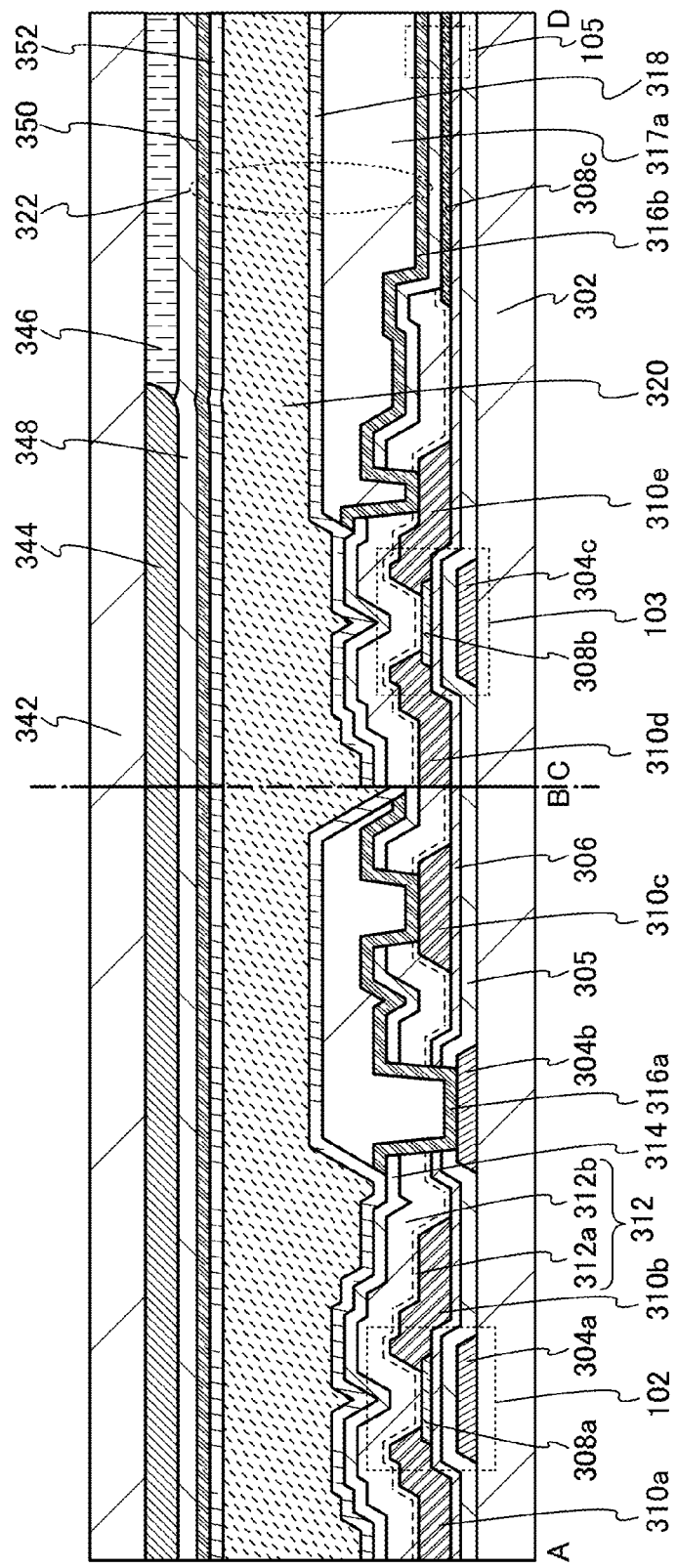
FIG. 9 is a cross-sectional view illustrating one embodiment of a semiconductor device.

A modification example of the planarization film 317 in Embodiment 1 is described with reference to FIG. 9. In FIG. 9, as in FIG. 3, a cross section taken along line A-B is a cross-sectional view of a driver circuit portion and a cross section taken along line C-D is a cross-sectional view of a pixel portion.

The cross section in FIG. 9 is different from the cross section in FIG. 3 in that the planarization film 317a is not provided over the entire surface of the substrate 302 and is provided over the light-transmitting conductive films 316a and 316b. In other words, the alignment film 318 has a region in contact with the planarization film 317a and a region in contact with the insulating film 314.

In the pixel portion, the display region is a region where the light-transmitting conductive film 316b serving as a pixel electrode is formed. Thus, at least the planarization film 317a is formed over the light-transmitting conductive film 316b, whereby step difference of a region where the alignment film 318 is formed can be reduced. As a result, display defects due to an alignment defect of the liquid crystal molecules can be reduced.

Here, a method for manufacturing the liquid crystal display device in FIG. 9 is described with reference to FIGS. 4A to 4C, FIGS. 5A to 5C, FIGS. 6A to 6C, FIGS. 7A to 7C, and FIGS. 10A to 10C.

Figure 10A:
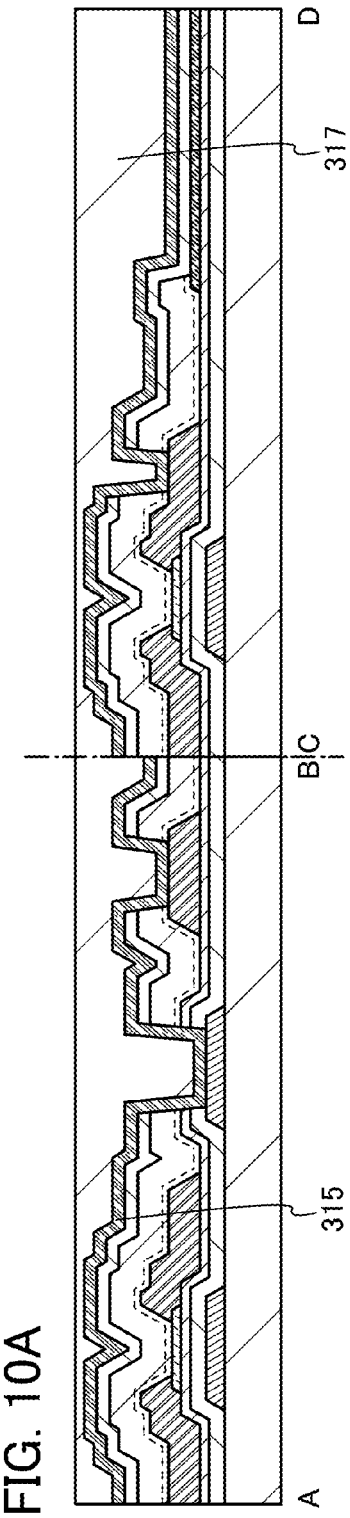
FIGS. 10A to 10C are cross-sectional views illustrating one embodiment of a method for manufacturing a semiconductor device.

As in Embodiment 1, through the steps in FIGS. 4A to 4C, FIGS. 5A to 5C, FIGS. 6A to 6C, and FIG. 7A, as illustrated in FIG. 10A, the conductive films 304a, 304b, and 304c, each of which functions as a gate electrode, the insulating films 305 and 306, each of which functions as a gate insulating film, the oxide semiconductor films 308a, 308b, and 308d, the conductive films 310a, 310b, 310c, 310d, and 310e, the insulating film 312, the insulating film 314, the conductive film 315, and the planarization film 317 are formed over the substrate 302. Note that in the process, the first to fifth patterning are performed to form the conductive films 304a, 304b, and 304c, the oxide semiconductor films 308a 308b, and 308d, the conductive films 310a, 310b, 310c, 310d, and 310e, the opening 362, and the openings 364a, 364b, and 364c.

Figure 10B:
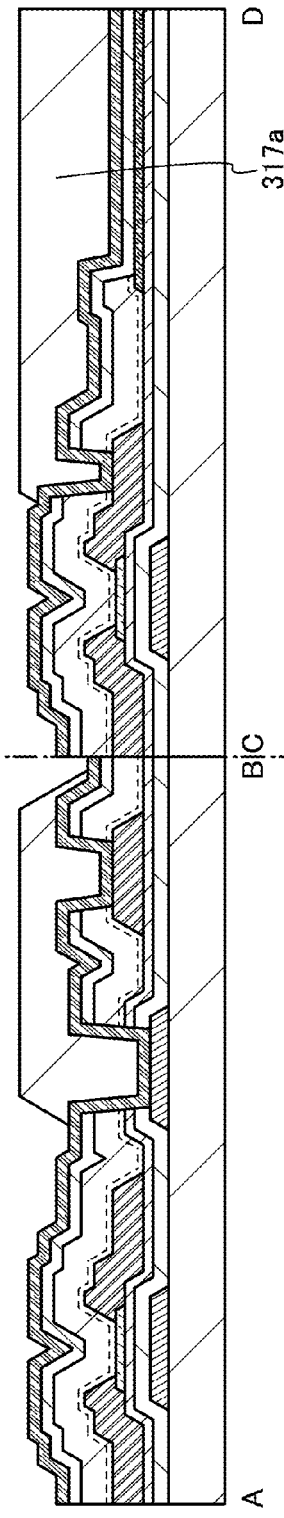

Next, as illustrated in FIG. 10B, the planarization film 317 is processed into desired regions, so that the planarization film 317a is formed. In the case where the planarization film 317a is formed using a non-photosensitive resin, the planarization film 317a can be formed in such a manner that a mask is formed over the desired regions by sixth patterning and regions not covered with the mask are etched. Further, in the case where the planarization film 317a is formed using a photosensitive resin, the planarization film 317a can be formed in such a manner that the desired regions are exposed to light and developed by the sixth patterning.

Then, the planarization film 317a is used as a mask and regions of the conductive film 315 not covered with the mask are etched, whereby the light-transmitting conductive films 316a and 316b can be formed. Here, patterning for forming the light-transmitting conductive films 316a and 316b and patterning for forming the planarization film 317a are not separately performed. The light-transmitting conductive films 316a and 316b can be formed by patterning for forming the planarization film 317a; thus, the number of patterning steps can be reduced. That is, the transistors, the capacitor, and the planarization film 317a can be formed at the same time by the first to sixth patterning, that is, with the six masks.

Figure 10C:
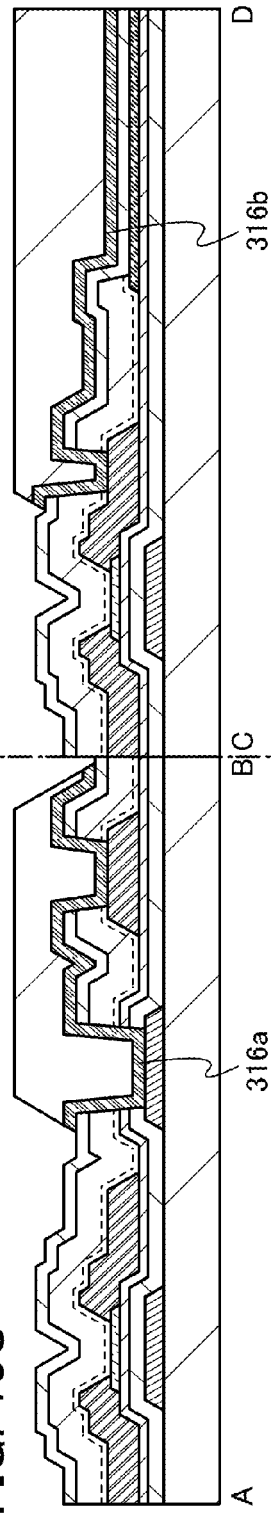
Figure 11:
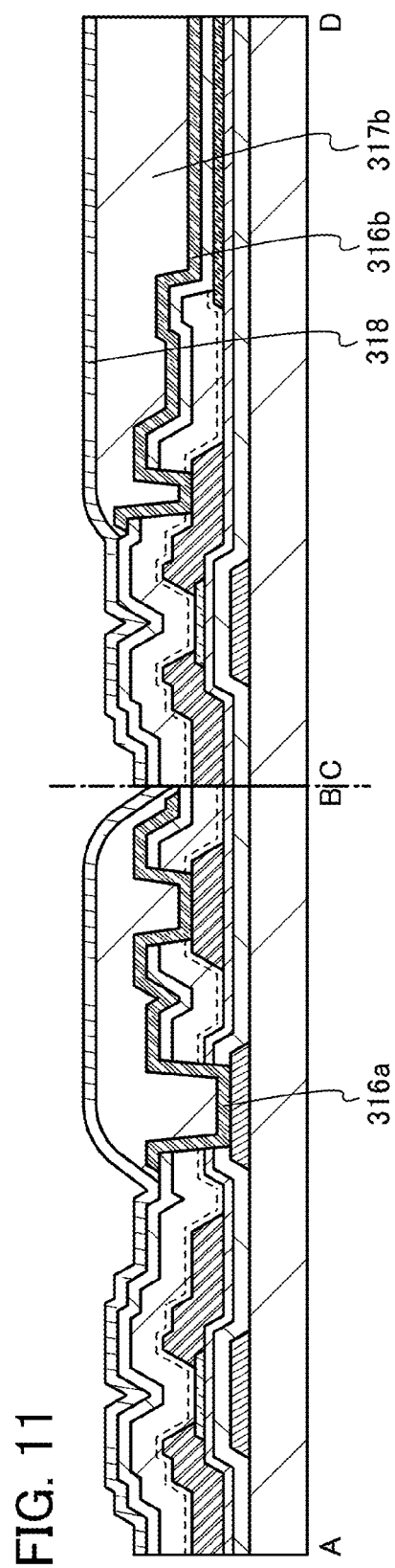
FIG. 11 is a cross-sectional view illustrating one embodiment of a method for manufacturing a semiconductor device.

Heat treatment is performed after the step of FIG. 10C, the planarization film 317b whose end portions are curved can be formed as illustrated in FIG. 11. As a result, the step difference of the region where the alignment film 318 is formed can be further reduced. The heat treatment may be performed at a temperature lower than or equal to the baking temperature of the planarization film 317b. By the heat treatment, the planarization film 317a whose end portions are positioned over the light-transmitting conductive films 316a and 316b can be formed. Alternatively, as illustrated in FIG. 11, the planarization film 317b whose end portions are positioned on an outer side than the light-transmitting conductive films 316a and 316b can be formed.

Modification Example 2

Figure 12:
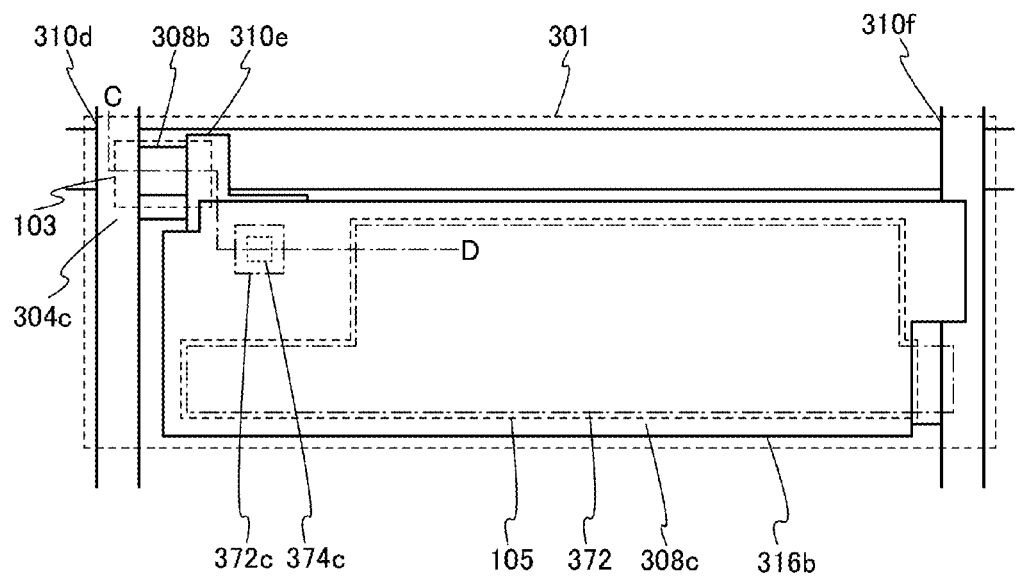
FIG. 12 is a top view illustrating one embodiment of a semiconductor device.

A modification example of the liquid crystal display device including a liquid crystal element in the pixel 301 is described. FIG. 12 is a top view of the pixel 301 shown in FIG. 1B. Note that in FIG. 12, a counter electrode and a liquid crystal element are omitted. Descriptions of the portions similar to those in Embodiment 1 and Modification Example 1 are omitted. Here, a planarization film and a conductive film serving as a pixel electrode are formed using Modification Example 1 in Embodiment 1; however, Modification Example 2 can also be applied to Embodiment 1 as appropriate.

The pixel 301 shown in FIG. 12 is different from the pixel 301 shown in FIG. 2 in that an opening 374c is provided inside an opening 372c. The difference lies in that an opening 372 is provided instead of the opening 362. The conductive film 310e is electrically connected to the light-transmitting conductive film 316b functioning as a pixel electrode, through the opening 374c.

Figure 13:
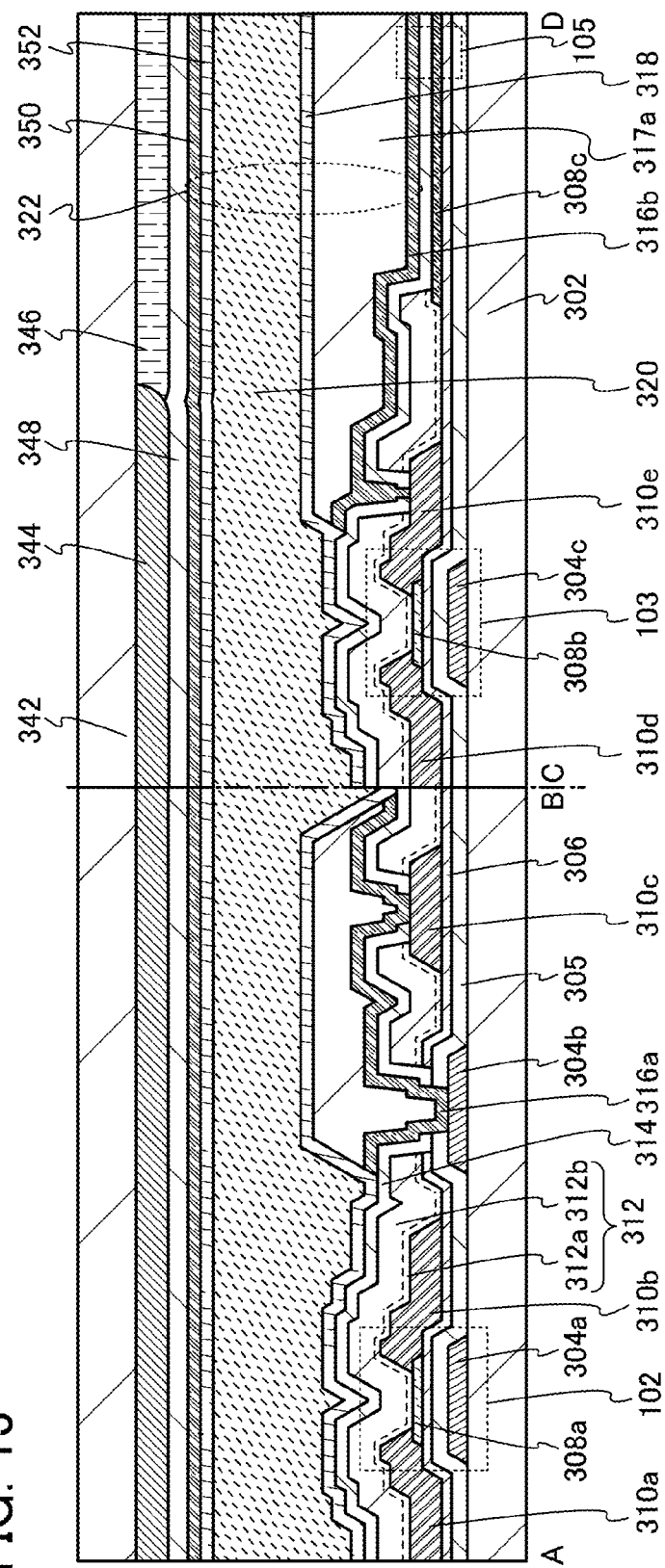
FIG. 13 is a cross-sectional view illustrating one embodiment of a semiconductor device.

Next, FIG. 13 shows a cross section taken along dashed-dotted line C-D in FIG. 12. Note that a cross section A-B in FIG. 13 is a cross-sectional view of a driver circuit portion (a top view thereof is omitted).

As shown in FIG. 13, an opening 372a (see FIG. 14A) formed in the insulating film 306 and the insulating film 312 and an opening 374a (see FIG. 14C) formed in the insulating film 314 are provided over the conductive film 304b. The opening 374a (see FIG. 14C) is located inside the opening 372a (see FIG. 14A). In the opening 374a (see FIG. 14C), the conductive film 304b and the light-transmitting conductive film 316a are connected to each other.

Further, an opening 372b (see FIG. 14A) formed in the insulating film 312 and an opening 374b (see FIG. 14C) formed in the insulating film 314 are provided over the conductive film 310c. The opening 374b (see FIG. 14C) is located inside the opening 372b (see FIG. 14A). In the opening 374b (see FIG. 14C), the conductive film 310c and the light-transmitting conductive film 316a are connected to each other.

Furthermore, the opening 372c (see FIG. 14A) formed in the insulating film 312 and the opening 374c (see FIG. 14C) formed in the insulating film 314 are provided over the conductive film 310e. The opening 374c (see FIG. 14C) is located inside the opening 372c (see FIG. 14A). In the opening 374c (see FIG. 14C), the conductive film 310e and the light-transmitting conductive film 316b are connected to each other.

The opening 372 (see FIG. 14A) formed in the insulating film 312 is provided over the light-transmitting conductive film 308c. In the opening 372, the light-transmitting conductive film 308c is in contact with the insulating film 314.

A connection portion between the conductive film 304b and the light-transmitting conductive film 316a, a connection portion between the conductive film 310c and the light-transmitting conductive film 316a, and a connection portion between the conductive film 310e and the light-transmitting conductive film 316b are each surrounded by the insulating film 305 and/or the insulating film 314. The insulating films 305 and 314 are each formed of an insulating film using a material that prevents diffusion of impurities from the outside, such as water, alkali metal, and alkaline earth metal, into the oxide semiconductor film. Further, the side surfaces of the openings 372a, 372b, 372c, and 372 (see FIG. 14A) are each covered with the insulating film 305 and/or the insulating film 314. The oxide semiconductor films are provided on an inner side than the insulating films 305 and 314. Thus, it is possible to prevent diffusion of impurities from the outside, such as water, alkali metal, and alkaline earth metal, through the connection portions between the conductive film 304b and the light-transmitting conductive film 316a, between the conductive film 310c and the light-transmitting conductive film 316a, and between the conductive film 310e and the light-transmitting conductive film 316b into the oxide semiconductor films included in the transistors. As a result, fluctuation in the electrical characteristics of the transistors can be prevented and reliability of the liquid crystal display device can be improved.

A formation method of the element portion over the substrate 302 in the liquid crystal display device shown in FIG. 13 is described with reference to FIGS. 4A to 4C, FIGS. 5A to 5C, FIGS. 14A to 14C, and FIGS. 15A and 15B.

In a manner similar to that of Embodiment 1, through the steps in FIGS. 4A to 4C and FIGS. 5A to 5C, the conductive films 304a, 304b, and 304c, each of which functions as a gate electrode, the insulating films 305 and 306 which function as a gate insulating film, the oxide semiconductor films 308a, 308b, and 308d, the conductive films 310a, 310b, 310c, 310d, and 310e, and the insulating film 311 are formed over the substrate 302. Note that in the process, the first to third patterning are performed to form the conductive films 304a, 304b, and 304c, the oxide semiconductor films 308a 308b, and 308d, and the conductive films 310a, 310b, 310c, 310d, and 310e.

Then, heat treatment is performed in a manner similar to that of Embodiment 1, whereby part of oxygen contained in the insulating film 311b can be moved to the oxide semiconductor films 308a and 308b to reduce the amount of oxygen vacancies in the oxide semiconductor films 308a and 308b.

Then, as shown in FIG. 14A, the insulating film 311 is processed into desired regions so that the insulating film 312 and the openings 372, 372b, and 372c are formed. Further, the insulating film 306 which is part of the gate insulating film is processed into desired regions so that the opening 372a is formed. The insulating film 305, the insulating film 312, and the openings 372, 372a, 372b, and 372c can be formed in such a manner that a mask is formed over the desired regions by fourth patterning and regions not covered with the mask are etched. As a method for forming the openings 372, 372a, 372b, and 372c, the method for forming the opening 362 described in Embodiment 1 can be used as appropriate.

By forming at least the opening 372a in the etching step, the etching amount can be reduced in an etching step with a mask formed by fifth patterning to be performed later.

Next, the insulating film 313 is formed over the insulating film 305, the conductive films 310c and 310e, the insulating film 312, and the oxide semiconductor film 308d (see FIG. 14B).

Then, in a manner similar to that of Embodiment 1, the insulating film 313 is processed into desired regions so that the insulating film 314 and the openings 374a, 374b, and 374c are formed. The insulating film 314 and the openings 374a, 374b, and 374c can be formed in such a manner that a mask is formed over the desired regions by fifth patterning and regions not covered with the mask are etched (see FIG. 14C).

Then, a conductive film 315 is formed over the insulating film 314 to cover the openings 374a, 374b, and 374c in a manner similar to that of Embodiment 1. Further, the planarization film 317a is formed over the conductive film 315 in a manner similar to that of Modification Example 1 in Embodiment 1 (see FIG. 15A). In the case where the planarization film 317a is formed using a non-photosensitive resin, the planarization film 317a can be formed in such a manner that a mask is formed over the desired regions by sixth patterning and regions not covered with the mask are etched. Further, in the case where the planarization film 317a is formed using a photosensitive resin, the planarization film 317a can be formed in such a manner that the desired regions are exposed to light and developed by the sixth patterning.

Then, the planarization film 317a is used as a mask and regions of the conductive film 315 not covered with the mask are etched, whereby the light-transmitting conductive films 316a and 316b are formed (see FIG. 15B).

Through the above process, the pixel portion and the driver circuit portion that include transistors can be formed over the substrate 302. In the manufacturing process described in this embodiment, the transistors and the capacitor can be formed at the same time by the first to sixth patterning, that is, with the six masks.

When the opening 372a is not formed in the process of FIG. 14A, the insulating films 305, 306, 312, and 314 are required to be etched in the etching step in FIG. 14C, so that the etching amount is increased as compared to the case of forming other openings. Thus, the etching step cannot be performed uniformly and the opening 374a is not formed in some regions, so that a contact defect between the light-transmitting conductive film 316a formed later and the conductive film 304b is generated. However, in this embodiment, the openings 372a and 374a are formed in two etching steps; thus, an etching defect is not easily generated in the forming process of the openings. Consequently, yield of a liquid crystal display device can be improved. The opening 372a is described here, but the same effect can also obtained in the case of the openings 374b and 374c.

In the etching step in FIG. 14A in Modification Example 2, the insulating film 306 and the insulating film 312 are etched to form the opening 372a. Alternatively, the insulating film 305, the insulating film 306, and the insulating film 312 may be etched instead. Accordingly, in the etching step in FIG. 14C, only the insulating film 314 is etched in all openings and the etching amounts of the openings are the same; thus, an etching defect can be further reduced.

Modification Example 3

A modification example of the liquid crystal display device including a liquid crystal element in the pixel 301 is described. In the liquid crystal display devices shown in FIG. 3, FIGS. 9, and 13, the light-transmitting conductive film 308c is in contact with the insulating film 314; however, a structure in which the light-transmitting conductive film 308c is in contact with the insulating film 305 can be employed. In that case, it is not necessary to provide the opening 362 as shown in FIGS. 6A to 6C. Thus, step difference of the surfaces of the light-transmitting conductive films 316a and 316b can be reduced. Consequently, alignment disorder of the liquid crystal molecules contained in the liquid crystal layer 320 can be reduced. Further, a high-contrast liquid crystal display device can be fabricated.

Such a structure can be obtained as follows: in FIG. 4B, before the oxide semiconductor film 307 is formed, the insulating film 306 is selectively etched, so that part of the insulating film 305 is exposed.

Modification Example 4

Figure 16:
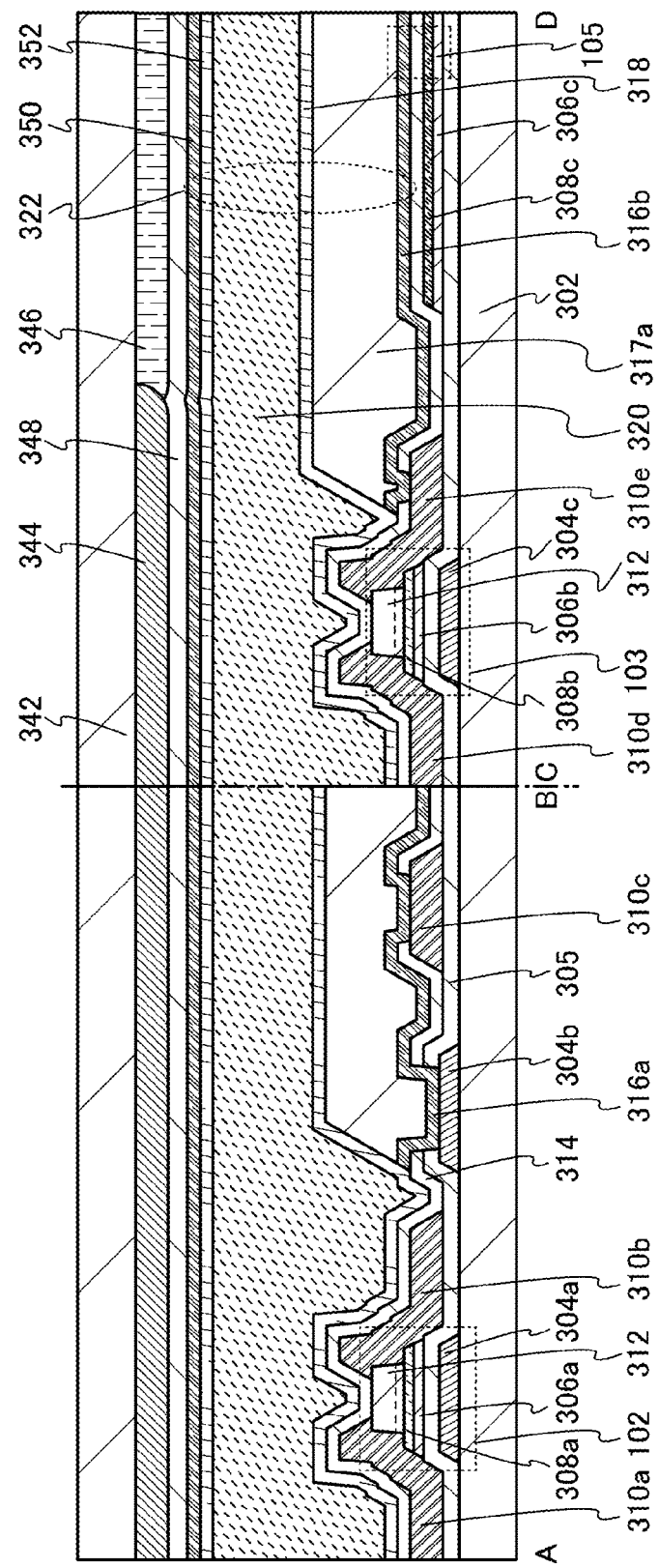
FIG. 16 is a cross-sectional view illustrating one embodiment of a semiconductor device.

A modification example of the liquid crystal display device described in Embodiment 1 is described with reference to FIG. 16, FIGS. 17A to 17C, and FIGS. 18A to 18C. A cross section A-B in FIG. 16 is a cross-sectional view of a driver circuit portion, and a cross section C-D in FIG. 16 is a cross-sectional view of a pixel portion. Here, a planarization film and a conductive film serving as a pixel electrode are formed using Modification Example 1 in Embodiment 1; however, Modification Example 4 can also be applied to Embodiment 1, Modification Example 2, and Modification Example 3 as appropriate.

The liquid crystal display device shown in FIG. 16 is different from the liquid crystal display device described in Embodiment 1 in that a channel protective transistor is used.

In the driver circuit portion, the transistor 102 includes the conductive film 304a functioning as a gate electrode, the insulating films 305 and 306 collectively functioning as a gate insulating film, the oxide semiconductor film 308a in which a channel region is formed, and the conductive films 310a and 310b functioning as a source electrode and a drain electrode. The insulating film 312 functioning as a channel protective film is provided between the oxide semiconductor film 308a and the conductive films 310a and 310b. Further, the insulating film 314 is provided as a protective film over the conductive films 310a, 310b, and 310c.

In the pixel portion, the transistor 103 includes the conductive film 304c functioning as a gate electrode, the insulating films 305 and 306 collectively functioning as a gate insulating film, the oxide semiconductor film 308b which is formed over the gate insulating film and in which a channel region is formed, and the conductive films 310d and 310e functioning as a source electrode and a drain electrode. The insulating film 312 functioning as a channel protective film is provided between the oxide semiconductor film 308b and the conductive films 310d and 310e. Further, the insulating film 314 is provided as a protective film over the conductive films 310d and 310e and the light-transmitting conductive film 308c.

The light-transmitting conductive film 316b functioning as a pixel electrode is connected to the conductive film 310e through an opening provided in the insulating film 314.

Further, the capacitor 105 includes the light-transmitting conductive film 308c functioning as one electrode of the capacitor 105, the insulating film 314 functioning as a dielectric film, and the light-transmitting conductive film 316b functioning as the other electrode of the capacitor 105.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 316a formed at the same time as the light-transmitting conductive film 316b.

In this modification example, a region which is to be a channel region in the oxide semiconductor films 308a and 308b are not damaged by etching for forming the conductive films 310a, 310b, 310d, and 310e because the region which is to be the channel region in the oxide semiconductor films 308a and 308b are covered with the insulating film 312 when the conductive films 310a, 310b, 310d, and 310e are etched. Further, the insulating film 312 is formed using an oxide insulating film which contains oxygen at a higher proportion than the stoichiometric composition. Thus, part of oxygen contained in the oxide insulating film 312 can be moved to the oxide semiconductor films 308a and 308b, so that the amount of oxygen vacancies contained in the oxide semiconductor films 308a and 308b can be reduced.

A formation method of the element portion over the substrate 302 in the liquid crystal device shown in FIG. 16 is described with reference to FIGS. 4A to 4C, FIGS. 17A to 17C, and FIGS. 18A to 18C.

Figure 4C:
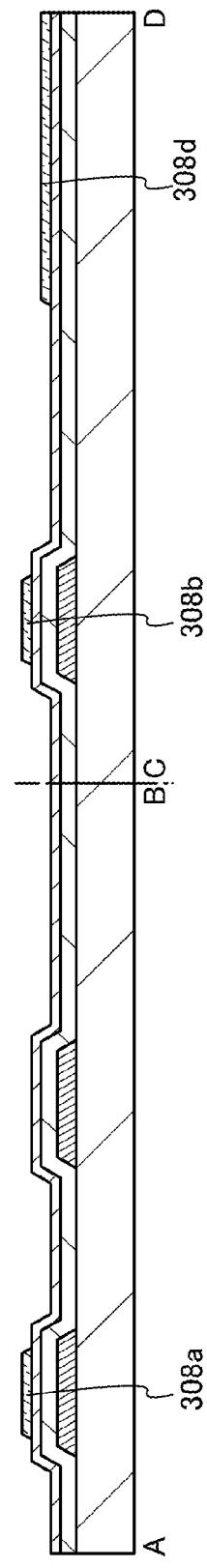

In a manner similar to that of Embodiment 1, through the steps in FIGS. 4A to 4C, the conductive films 304a, 304b, and 304c, each of which functions as a gate electrode, the insulating films 305 and 306 which function as a gate insulating film, and the oxide semiconductor films 308a, 308b, and 308d are formed over the substrate 302. Note that in the process, the first and second patterning are performed to form the conductive films 304a, 304b, and 304c and the oxide semiconductor films 308a 308b, and 308d.

Next, as shown in FIG. 17A, the insulating film 311 in which the insulating film 311a and the insulating film 311b are stacked is formed as in Embodiment 1.

Then, heat treatment is performed in a manner similar to that of Embodiment 1, whereby part of oxygen contained in the insulating film 311 can be moved to the oxide semiconductor films 308a and 308b to compensate the amount of oxygen vacancies in the oxide semiconductor films 308a and 308b.

Next, as shown in FIG. 17B, the insulating film 311 is processed into desired regions, so that the insulating film 312 is formed over the oxide semiconductor films 308a and 308b. In the process, in the case where the insulating film 306 is formed using a material similar to that of the insulating film 312, part of the insulating film 306 is etched, and only regions covered with the oxide semiconductor films 308a and 308b are left. Note that the insulating film 306 and the insulating film 312 can be formed in such a manner that a mask is formed over the desired regions by third patterning and regions not covered with the mask are etched.

Next, after a conductive film is formed over the insulating film 305, the insulating film 306, and the oxide semiconductor films 308a and 308b, a process similar to that in Embodiment 1 is performed, so that the conductive films 310a, 310b, 310c, 310d, and 310e are formed (see FIG. 17C). The conductive films 310a, 310b, 310c, 310d, and 310e can be formed in such a manner that a mask is formed over a desired region by fourth patterning and regions not covered with the mask are etched.

Figure 18A:
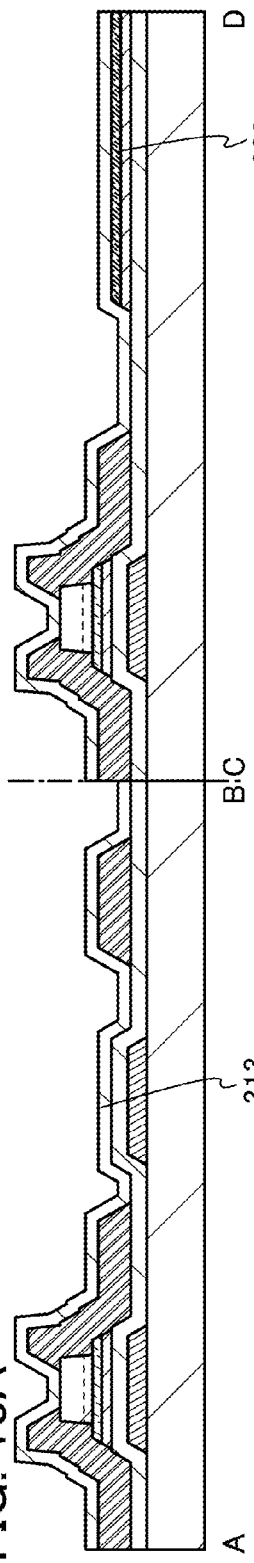
FIGS. 18A to 18C are cross-sectional views illustrating one embodiment of a method for manufacturing a semiconductor device.
Figure 18B:
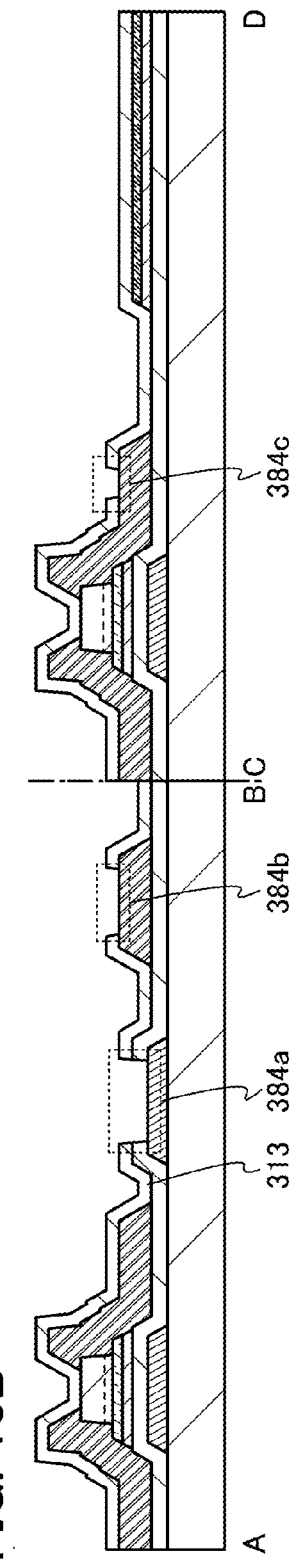
Figure 18C:
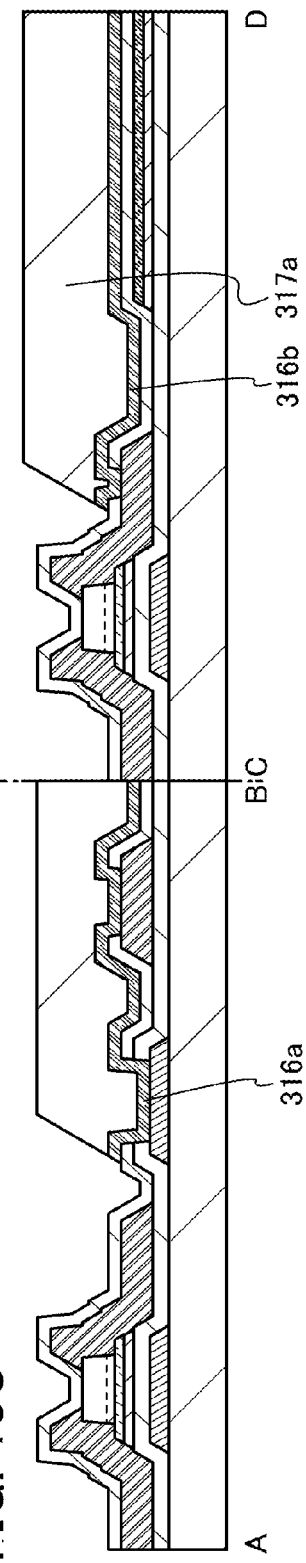

Next, the insulating film 313 is formed over the insulating film 305, the insulating film 312, the oxide semiconductor film 308d, and the conductive films 310a, 310b, 310c, 310d, and 310e (see FIG. 18A).

Then, in a manner similar to that of Embodiment 1, the insulating film 305 and the insulating film 313 are processed into desired regions, so that the insulating film 314 and the openings 384a, 384b, and 384c are formed. Note that the insulating film 314 and the openings 384a, 384b, and 384c can be formed in such a manner that a mask is formed in the desired regions by fifth patterning and regions not covered with the mask are etched (see FIG. 18B).

Then, a conductive film is formed over the insulating film 314 to cover the openings 384a, 384b, and 384c in a manner similar to that of Embodiment 1. Further, the planarization film 317a is formed over the conductive film in a manner similar to that of Modification Example 1 in Embodiment 1. In the case where the planarization film 317a is formed using a non-photosensitive resin, the planarization film 317a can be formed in such a manner that a mask is formed over the desired regions by sixth patterning and regions not covered with the mask are etched. Further, in the case where the planarization film 317a is formed using a photosensitive resin, the planarization film 317a can be formed in such a manner that the desired regions are exposed to light and developed by the sixth patterning. Then, the planarization film 317a is used as a mask and regions of the conductive film not covered with the mask are etched, whereby the light-transmitting conductive films 316a and 316b are formed (see FIG. 18C).

Through the above process, the pixel portion and the driver circuit portion that include the transistors can be formed over the substrate 302. In the manufacturing process described in this embodiment, the transistors and the capacitor can be formed at the same time by the first to sixth patterning, that is, with the six masks.

Modification Example 5

Figure 19:
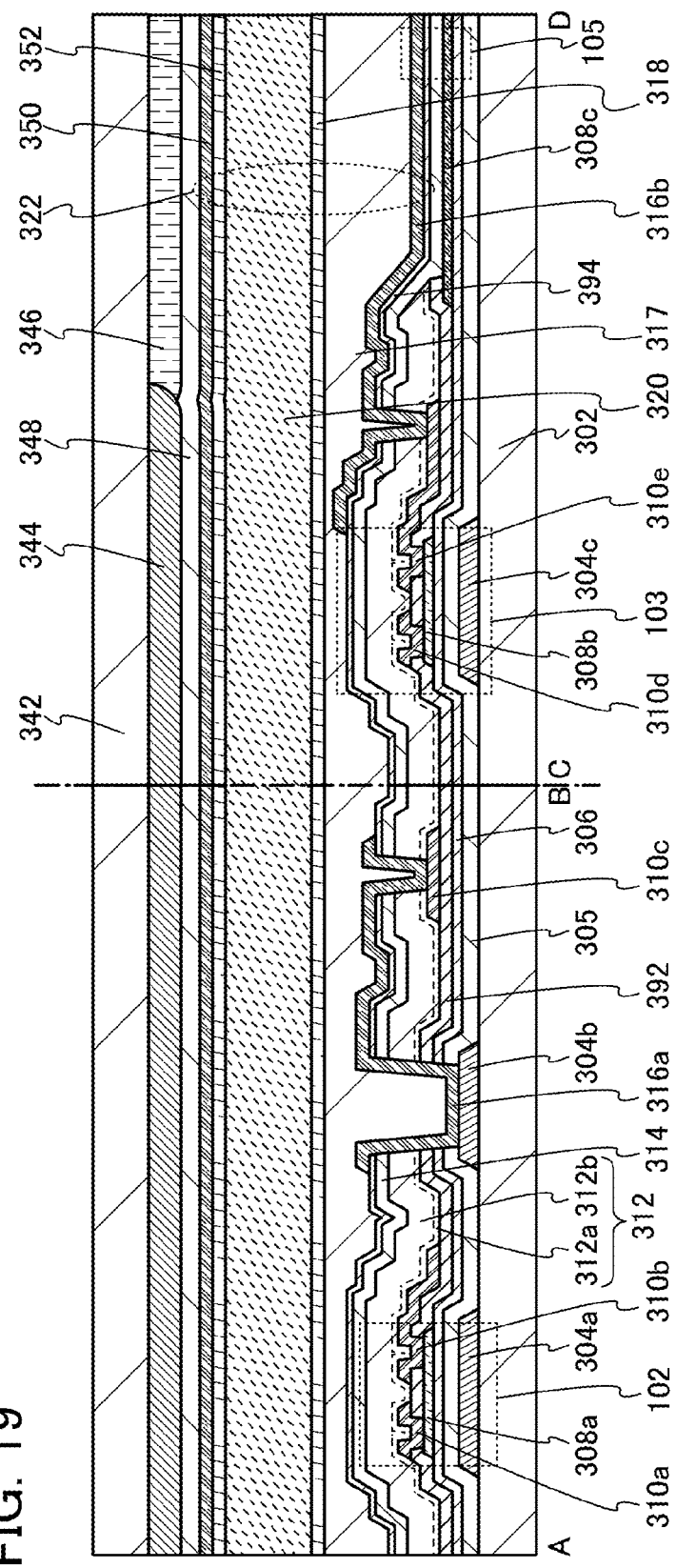
FIG. 19 is a cross-sectional view illustrating one embodiment of a semiconductor device.

A modification example of the liquid crystal display device described in Embodiment 1 is described with reference to FIG. 19, FIGS. 20A to 20C, FIGS. 21A to 21C, and FIGS. 22A to 22C. A cross section A-B in FIG. 19 is a cross-sectional view of a driver circuit portion, and a cross section C-D in FIG. 19 is a cross-sectional view of a pixel portion. Here, a planarization film and a light-transmitting conductive film serving as a pixel electrode are formed using Embodiment 1; however, the planarization film and the light-transmitting conductive film serving as a pixel electrode can be formed using Modification Example 1 in Embodiment 1.

The liquid crystal display device in FIG. 19 is different from the liquid crystal display device in Embodiment 1 in that the oxide semiconductor film 308a is connected to the conductive films 310a and 310b and the oxide semiconductor film 308b is connected to the conductive films 310d and 310e in openings in an insulating film 392. Further, the difference lies in that an insulating film 394 is provided between the insulating film 314 and the light-transmitting conductive film 316b.

In the driver circuit portion, the transistor 102 includes the conductive film 304a functioning as a gate electrode, the insulating films 305 and 306 collectively functioning as a gate insulating film, the oxide semiconductor film 308a in which a channel region is formed, the insulating film 392 covering the oxide semiconductor film 308a, and the conductive films 310a and 310b which are in contact with the oxide semiconductor film 308a in the openings in the insulating film 392 and function as a source electrode and a drain electrode. Further, the insulating films 312, 314, and 394 are provided as a protective film over the conductive films 310a, 310b, and 310c.

In the pixel portion, the transistor 103 includes the conductive film 304c functioning as a gate electrode, the insulating films 305 and 306 collectively functioning as a gate insulating film, the oxide semiconductor film 308b which is formed over the gate insulating film and in which a channel region is formed, the insulating film 392 covering the oxide semiconductor film 308b, and the conductive films 310d and 310e which are in contact with the oxide semiconductor film 308b in the openings in the insulating film 392 and function as a source electrode and a drain electrode. Further, the insulating films 312, 314, and 394 are provided as a protective film over the conductive films 310d and 310e.

The light-transmitting conductive film 316b functioning as a pixel electrode is connected to the conductive film 310e through an opening provided in the insulating films 312, 314, and 394.

Further, the capacitor 105 includes the light-transmitting conductive film 308c functioning as one electrode of the capacitor 105, the insulating film 314 and the insulating film 394 functioning as a dielectric film, and the light-transmitting conductive film 316b functioning as the other electrode of the capacitor 105.

The insulating film 392 is preferably formed using an oxide insulating film because of being in contact with the oxide semiconductor films 308a and 308b. The insulating film 392 can be formed using a material similar to that of the insulating film 306. Further, it is preferable that the insulating film 392 be an oxide insulating film which transmits oxygen like the insulating film 312a and have few defects. As a result, oxygen contained in the insulating film 312b can be moved to the oxide semiconductor films 308a and 308b to reduce the oxygen vacancies in the oxide semiconductor films 308a and 308b. Further, it is preferable that the amount of defects at the interface between the insulating film 392 and the oxide semiconductor films 308a and 308b be small.

The insulating film 394 is provided to control the charge capacity of the capacitor 105. Thus, the insulating film 394 can be formed using an oxide insulating film or a nitride insulating film as appropriate. As the insulating film 394, an oxide insulating film formed by a chemical vapor deposition (CVD) method using an organosilane gas, typically a silicon oxide film, is preferably used because the planarity can be improved. In the case where the capacitor 105 can obtain a certain amount of charge capacity with the insulating film 314, the insulating film 394 is not necessarily provided.

In this modification example, the oxide semiconductor films 308a and 308b are not damaged by etching for forming the conductive films 310a, 310b, 310d, and 310e because the oxide semiconductor films 308a and 308b are covered with the insulating film 392 when the conductive films 310a, 310b, 310d, and 310e are etched. Further, the insulating film 312 is formed using an oxide insulating film which contains oxygen at a higher proportion than the stoichiometric composition. Thus, part of oxygen contained in the oxide insulating film 312 can be moved to the oxide semiconductor films 308a and 308b, so that the amount of oxygen vacancies contained in the oxide semiconductor films 308a and 308b can be reduced.

A formation method of the element portion over the substrate 302 in the liquid crystal device shown in FIG. 19 is described with reference to FIGS. 4A to 4C, FIGS. 20A to 20C, FIGS. 21A to 21C, and FIGS. 22A to 22C.

In a manner similar to that of Embodiment 1, through the steps in FIGS. 4A to 4C, the conductive films 304a, 304b, and 304c, each of which functions as a gate electrode, the insulating films 305 and 306 which function as a gate insulating film, and the oxide semiconductor films 308a, 308b, and 308d are formed over the substrate 302. Note that in the process, the first and second patterning are performed to form the conductive films 304a, 304b, and 304c and the oxide semiconductor films 308a 308b, and 308d.

Figure 20A:
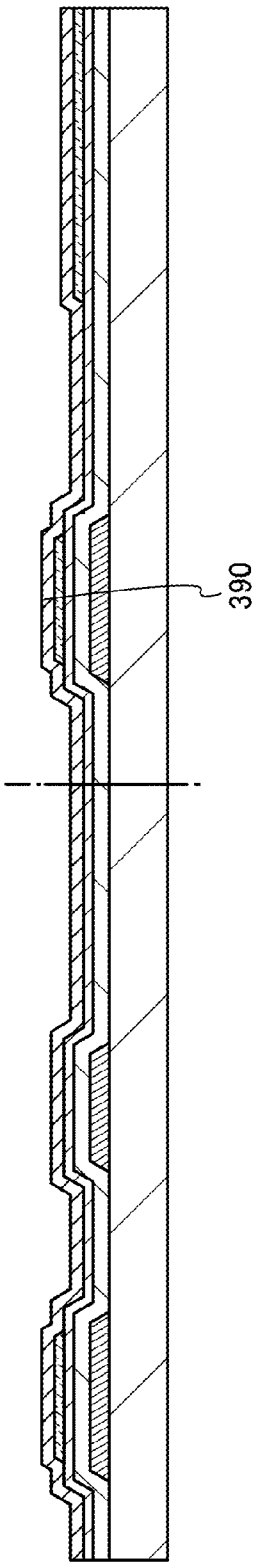
FIGS. 20A to 20C are cross-sectional views illustrating one embodiment of a method for manufacturing a semiconductor device.
Figure 20B:
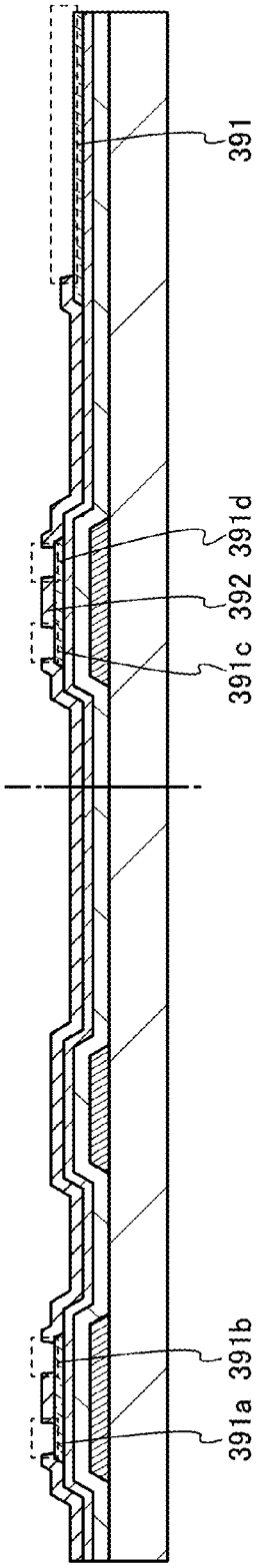

Next, as illustrated in FIG. 20A, the insulating film 390 is formed. The insulating film 390 is formed under conditions similar to those of the insulating film 305 or the insulating film 311a.

Next, the insulating film 390 is processed into desired regions to form an insulating film 392 having the openings 391, 391a, 391b, 391c, and 391d. Note that the insulating film 392 can be formed in such a manner that a mask is formed over the desired regions by third patterning and regions not covered with the mask are etched.

Figure 20C:
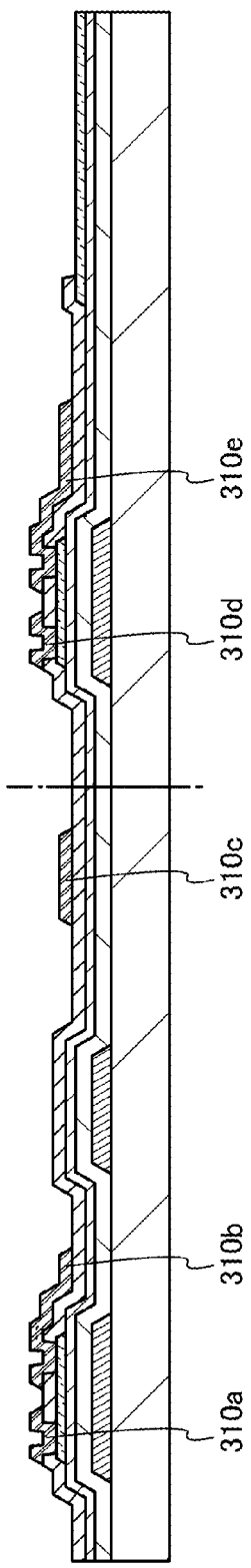

Next, after a conductive film is formed over the oxide semiconductor films 308a and 308b and the insulating film 392, a process similar to that in Embodiment 1 is performed, so that the conductive films 310a, 310b, 310c, 310d, and 310e are formed (see FIG. 20C). The conductive films 310a, 310b, 310c, 310d, and 310e can be formed in such a manner that a mask is formed over a desired region by fourth patterning and regions not covered with the mask are etched.

Figure 21A:
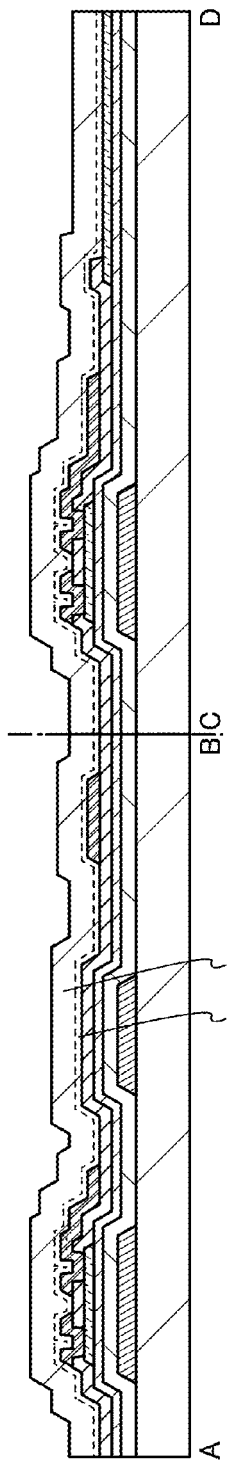
FIGS. 21A to 21C are cross-sectional views illustrating one embodiment of a method for manufacturing a semiconductor device.
Figure 21B:
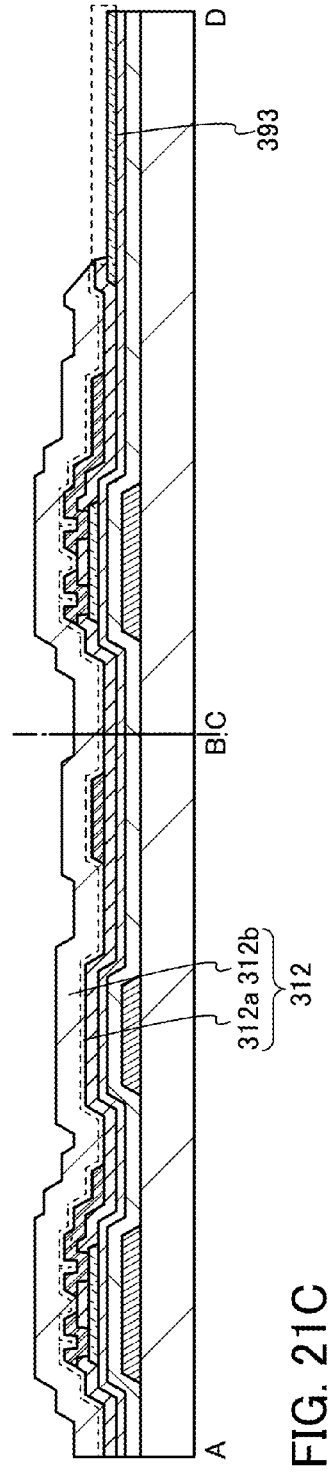

Next, the insulating film 311 is formed over the insulating film 392 and the conductive films 310a, 310b, 310c, 310d, and 310e (see FIG. 21A).

Then, the insulating film 311 is processed into desired regions, so that the insulating film 312 having the opening 393 is formed. Note that the insulating film 312 and the opening 393 can be formed in such a manner that a mask is formed over the desired regions by fifth patterning and regions not covered with the mask are etched (see FIG. 21B).

Figure 21C:
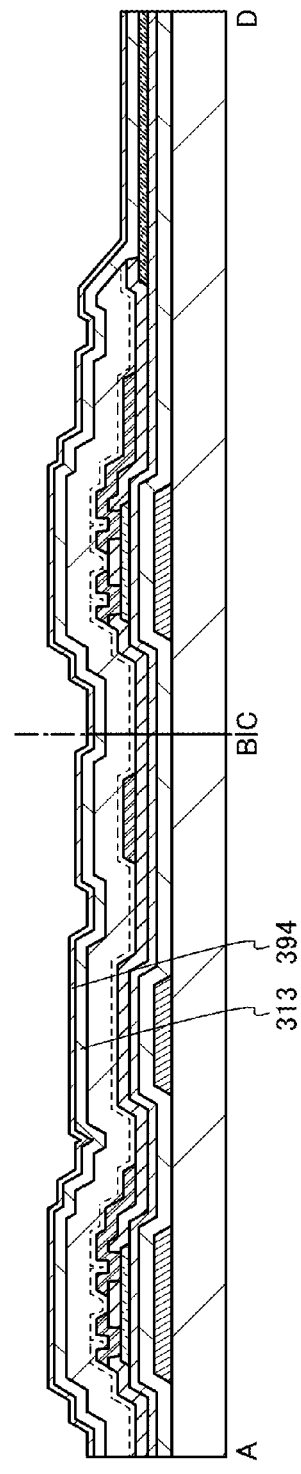

Next, as illustrated in FIG. 21C, the insulating film 313 and the insulating film 394 are formed to cover the oxide semiconductor film 308d, the insulating film 392, and the opening 393.

The insulating film 394 is formed by a CVD method, a sputtering method, or the like.

Then, in a manner similar to that of Embodiment 1, the insulating films 305, 306, 392, 312, 314, and 394 are processed into desired regions, so that the openings 365a, 365b, and 365c are formed. Note that the openings 365a, 365b, and 365c can be formed in such a manner that a mask is formed over the desired regions by sixth patterning and regions not covered with the mask are etched (see FIG. 22A).

Next, after a conductive film is formed over the conductive film 304b, the conductive films 310c and 310e, and the insulating film 394, a process similar to that in Embodiment 1 is performed, so that the conductive films 316a and 316b are formed (see FIG. 22B). The conductive films 316a and 316b can be formed in such a manner that a mask is formed over a desired region by seventh patterning and regions not covered with the mask are etched.

Next, as illustrated in FIG. 22C, the planarization film 317 is formed as in Embodiment 1.

Through the above process, the pixel portion and the driver circuit portion that include the transistors can be formed over the substrate 302. In the manufacturing process described in this embodiment, the transistors and the capacitor can be formed at the same time by the first to seventh patterning, that is, with the seven masks.

Embodiment 2

In this embodiment, a liquid crystal display device having a structure different from that in Embodiment 1 which can reduce light leakage causing display defects is described with reference to FIG. 23 and FIGS. 24A to 24C.

Figure 23:
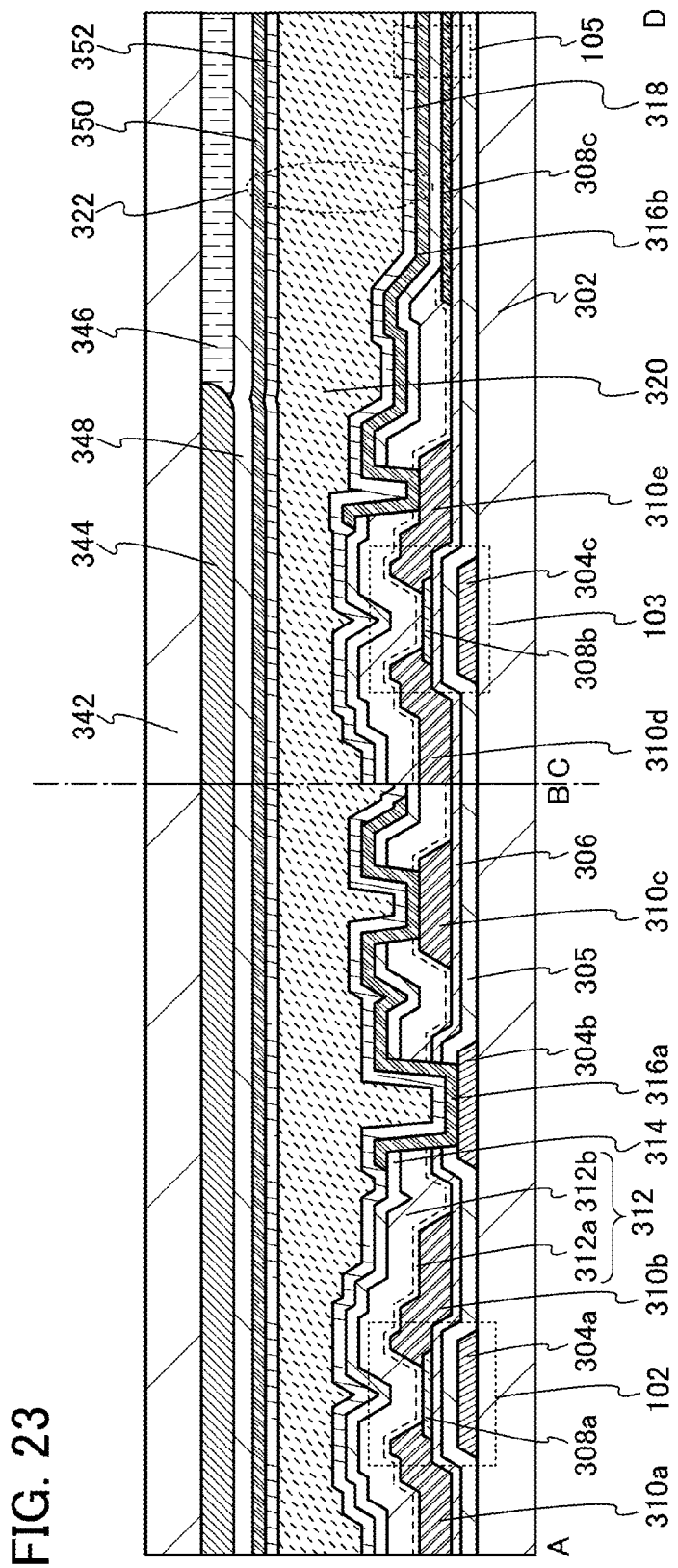
FIG. 23 is a cross-sectional view illustrating one embodiment of a semiconductor device.

An angle (hereinafter referred to as a taper angle) between the surface of the light-transmitting conductive film 308c and the side surface of the insulating film 312 having the opening 362 (see FIG. 24C) in FIG. 23 is smaller than that in Embodiment 1. Further, the structure in FIG. 23 is different from those in Embodiment 1 in that a planarization film is not provided over the insulating film 314 and the conductive films 316a and 316b.

Over the light-transmitting conductive film 308c, the taper angle between the surface of the light-transmitting conductive film 308c and the side surface of the insulating film 312 is greater than or equal to 5° and less than or equal to 45°, preferably greater than or equal to 5° and less than or equal to 30°, more preferably greater than or equal to 10° and less than or equal to 20°, whereby step difference of the light-transmitting conductive film 316b provided over the insulating film 312 with the insulating film 314 provided therebetween can be reduced. That is, step difference of a region where the alignment film 318 is formed is reduced, so that alignment disorder of liquid crystal molecules contained in the liquid crystal layer 320 can be reduced.

By reducing the step difference of the region where the alignment film 318 is formed, the uniformity of the thickness of the alignment film 318 can be improved. The thickness of the alignment film 318 influences the pretilt angle of the liquid crystal molecules; thus, by improving the planarity of the thickness of the alignment film 318, the pretilt angle of the liquid crystal molecules can be controlled. Typically, when the pretilt angle of the liquid crystal molecules is greater than or equal to 6°, disclination does not easily occur.

As described above, in order to reduce the step difference of the region where the alignment film 318 is formed, the taper angle between the surface of the light-transmitting conductive film 308c and the side surface of the insulating film 312 is greater than or equal to 5° and less than or equal to 45°, preferably greater than or equal to 5° and less than or equal to 30°, more preferably greater than or equal to 10° and less than or equal to 20°, whereby the liquid crystal molecules can be formed on the alignment film 318 so that disclination does not easily occur in the pretilt angle. As a result, the alignment disorder of the liquid crystal molecules contained in the liquid crystal layer 320 can be reduced. Further, by reducing steps of the region where the alignment film 318 is formed, light leakage can be reduced.

Here, a method for manufacturing the liquid crystal display device in FIG. 23 is described with reference to FIGS. 4A to 4C, FIGS. 5A to 5C, and FIGS. 24A to 24C.

In a manner similar to that of Embodiment 1, through the steps in FIGS. 4A to 4C and FIGS. 5A to 5C, the conductive films 304a, 304b, and 304c, each of which functions as a gate electrode, the insulating films 305 and 306, each of which functions as a gate insulating film, the oxide semiconductor films 308a, 308b, and 308d, the conductive films 310a, 310b, 310c, 310d, and 310e, and the insulating film 311 are formed over the substrate 302. Note that in the process, the first to third patterning are performed to form the conductive films 304a, 304b, and 304c, the oxide semiconductor films 308a 308b, and 308d, and the conductive films 310a, 310b, 310c, 310d, and 310e.

Figure 24A:
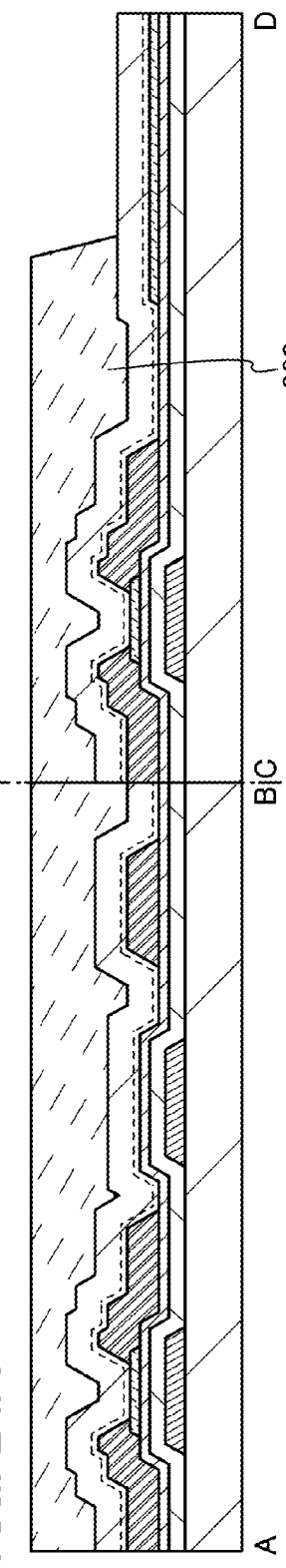
FIGS. 24A to 24C are cross-sectional views illustrating one embodiment of a method for manufacturing a semiconductor device.

Next, as illustrated in FIG. 24A, a mask 330 is formed over desired regions by fourth patterning.

Figure 24B:
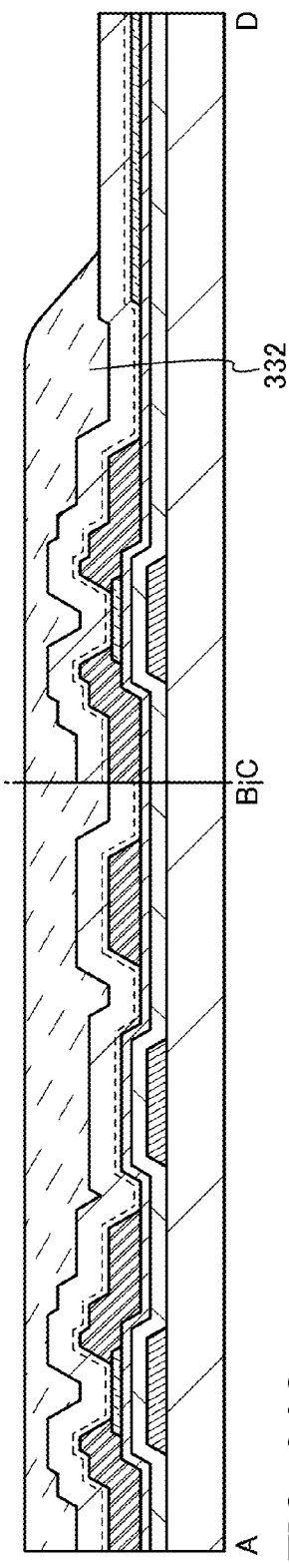

Then, as illustrated in FIG. 24B, a mask 332 in which an angle between the side surface of the mask 330 and the surface of the insulating film 311 is reduced and whose side surface is curved is formed by performing heat treatment.

Figure 24C:
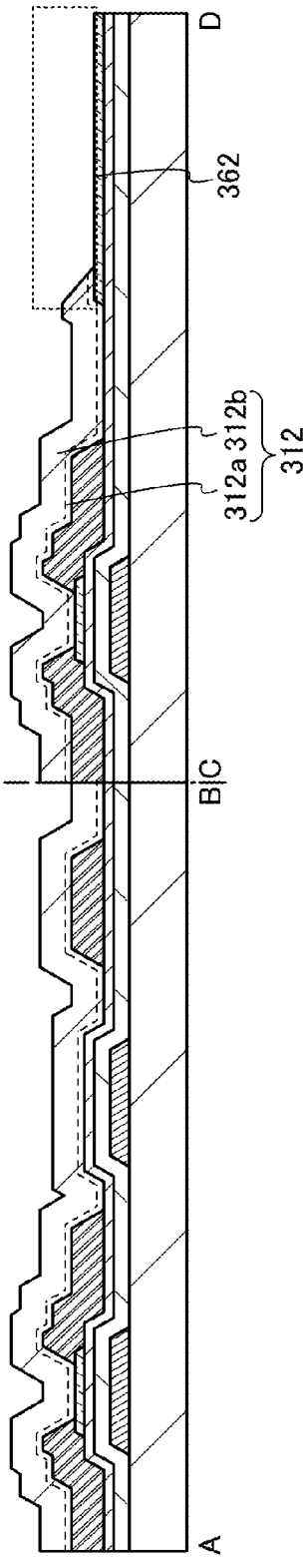

Next, as illustrated in FIG. 24C, the insulating film 312 in which the taper angle of the side surface is greater than or equal to 5° and less than or equal to 45°, preferably greater than or equal to 5° and less than or equal to 30°, more preferably greater than or equal to 10° and less than or equal to 20° can be formed by etching regions not covered with the mask 332 in the insulating film 311. Dry etching is preferably employed for the etching step. Further, it is preferable that the thickness and the area of the mask 332 be reduced step by step in the etching step. As a result, the insulating film 311 can be etched while being gradually exposed, so that the taper angle of the side surface of the insulating film 312 to be formed can be reduced by etching regions not covered with the mask 332 in the insulating film 311.

After that, as in Embodiment 1, the insulating film 314, the light-transmitting conductive films 316a and 316b, and the alignment film 318 are formed.

Through the above process, the pixel portion and the driver circuit portion that include the transistors can be formed over the substrate 302. In the manufacturing process described in this embodiment, the transistors and the capacitor can be formed at the same time by the first to sixth patterning, that is, with the six masks.

Embodiment 3

In this embodiment, a liquid crystal display device having the structures in Embodiment 1 and Embodiment 2 is described with reference to FIG. 25.

Figure 25:
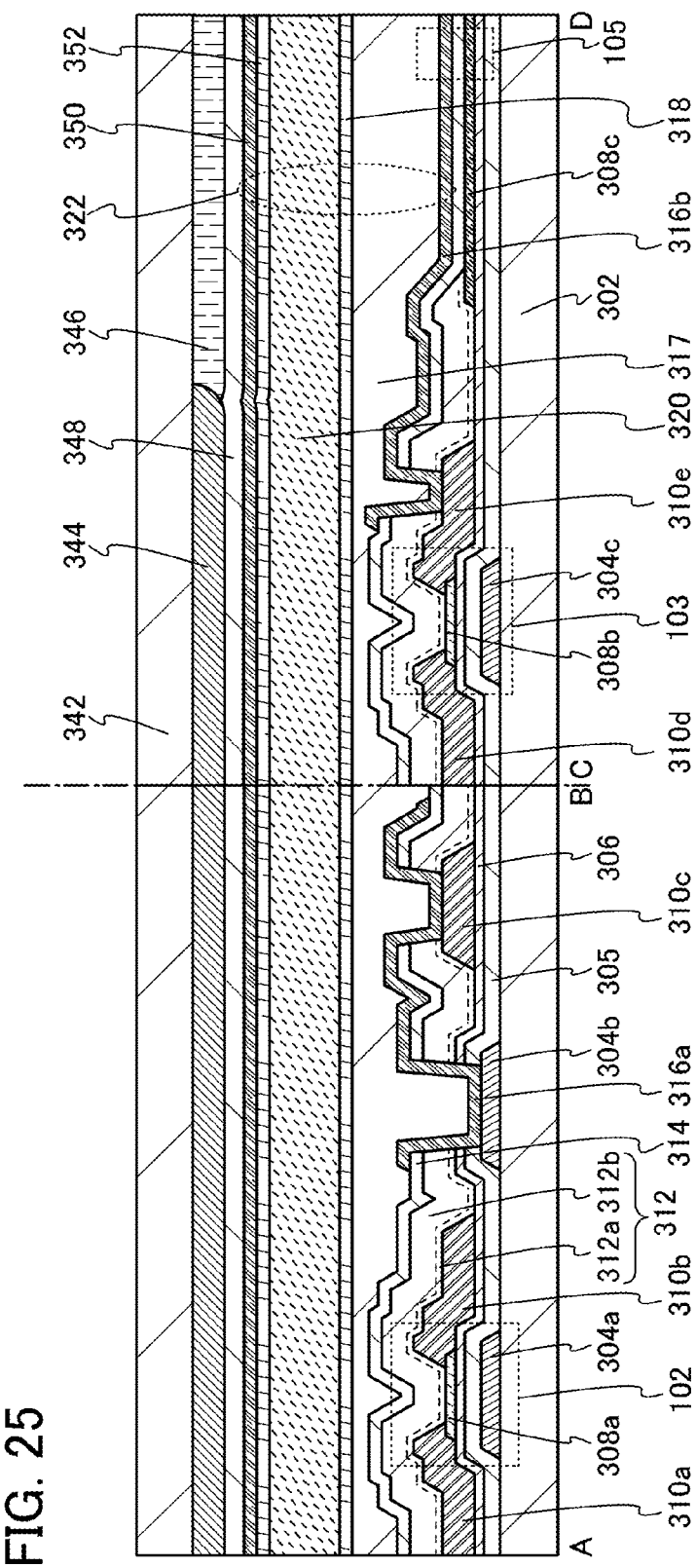
FIG. 25 is a cross-sectional view illustrating one embodiment of a semiconductor device.

In the element portion provided over the substrate 302, an angle between the surface of the light-transmitting conductive film 308c and the side surface of the insulating film 312 (such an angle is hereinafter referred to as a taper angle) in FIG. 25 is smaller than that in Embodiment 1. Note that the structure and the formation method of the insulating film 312 in Embodiment 2 can be employed for such an insulating film 312.

The insulating film 312 in which the taper angle between the surface of the light-transmitting conductive film 308c and the side surface of the insulating film 312 is small is provided in the element portion, whereby the step difference of a region to be a display region in the conductive film 316b can be reduced. As a result, in the planarization film 317 in the vicinity of the display region, the affect of the step difference of the insulating film 312 can be reduced; thus, the step difference of the surface of the planarization film 317 can be further reduced than that in Embodiment 1. Thus, alignment disorder of the liquid crystal molecules contained in the liquid crystal layer 320 can be further reduced. Further, by reducing steps of the region where the alignment film 318 is formed, light leakage can be further reduced.

Embodiment 4

In this embodiment, modification examples which can be applied to transistors in Embodiment 1 and Embodiment 2 are described.

Modification Example 1

Regarding Base Insulating Film

In the transistors 102 and 103 described in Embodiment 1 and Embodiment 2, a base insulating film can be provided between the substrate 302 and the conductive films 304a, 304b, and 304c as necessary. As a material of the base insulating film, silicon oxide, silicon oxynitride, silicon nitride, silicon nitride oxide, gallium oxide, hafnium oxide, yttrium oxide, aluminum oxide, aluminum oxynitride, and the like can be given as examples. Note that when silicon nitride, gallium oxide, hafnium oxide, yttrium oxide, aluminum oxide, or the like is used as a material of the base insulating film, it is possible to suppress diffusion of impurities such as alkali metal, water, and hydrogen into the oxide semiconductor films 308a and 308b from the substrate 302.

The base insulating film can be formed by a sputtering method, a CVD method, or the like.

Modification Example 2

Regarding Gate Insulating Film

In the transistors 102 and 103 in Embodiments 1 and 2, the stacked-layer structure of the insulating film serving as the gate insulating film can be changed as needed. Here, description is made using the transistor 103.

Figure 26A:
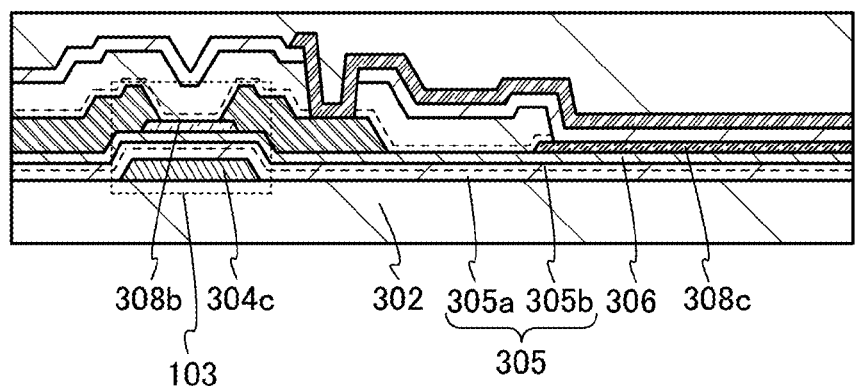
FIGS. 26A and 26B are cross-sectional views each illustrating one embodiment of a transistor.

As shown in FIG. 26A, in the gate insulating film, the insulating film 305 and the insulating film 306 are stacked in that order over the conductive film 304c serving as a gate electrode.

When the insulating film 305 formed using the nitride insulating film is provided over the conductive film 304c, an impurity, typically hydrogen, nitrogen, alkali metal, and alkaline earth metal can be prevented from moving from the conductive film 304c to the oxide semiconductor film 308b.

Further, when the insulating film 306 formed using the oxide insulating film is provided on the oxide semiconductor film 308b side, the density of defect states at the interface between the insulating film 306 and the oxide semiconductor film 308b can be reduced. Consequently, a transistor whose electrical characteristics are hardly degraded can be obtained. Note that it is preferable to form the insulating film 306 using an oxide insulating film containing oxygen at a higher proportion than the stoichiometric composition in a manner similar to that of the oxide insulating film 312b. This is because the density of defect states at the interface between the insulating film 306 and the oxide semiconductor film 308b can be further reduced.

As shown in FIG. 26A, the insulating film 305 can have a stacked-layer structure in which a nitride insulating film 305a with few defects and a nitride insulating film 305b with a high blocking property against hydrogen are stacked in that order from the conductive film 304c side. When the nitride insulating film 305a with few defects is provided in the insulating film 305, the withstand voltage of the gate insulating film can be improved. Further, when the nitride insulating film 305b with a high blocking property against hydrogen is provided, hydrogen can be prevented from moving from the conductive film 304c and the nitride insulating film 305a to the oxide semiconductor film 308b.

An example of a method for forming the nitride insulating films 305a and 305b shown in FIG. 26A is described below. First, as the nitride insulating film 305a, a silicon nitride film with few defects is formed by a plasma CVD method in which a mixed gas of silane, nitrogen, and ammonia is used as a source gas. Then, as the nitride insulating film 305b, a silicon nitride film in which the hydrogen concentration is low and hydrogen can be blocked is formed by switching the source gas to a mixed gas of silane and nitrogen. By such a formation method, the gate insulating film having a stacked-layer structure of nitride insulating films with few defects and a blocking property against hydrogen can be formed.

Figure 26B:
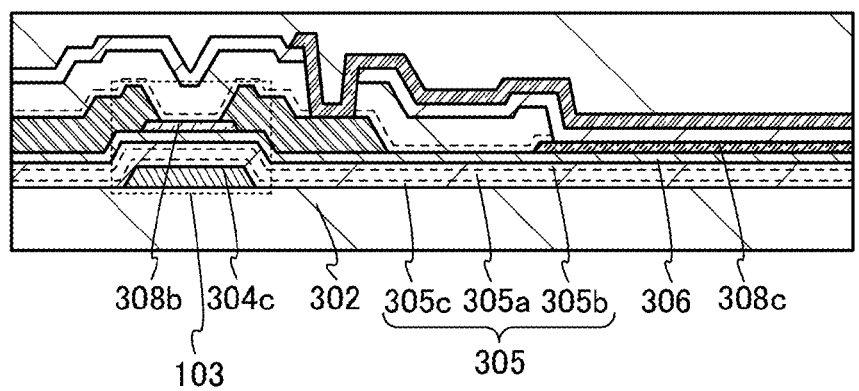

Alternatively, as shown in FIG. 26B, the insulating film 305 can have a stacked-layer structure in which a nitride insulating film 305c with a high blocking property against an impurity, the nitride insulating film 305a with few defects, and the nitride insulating film 305b with a high blocking property against hydrogen are stacked in that order from the conductive film 304c side. When the nitride insulating film 305c with a high blocking property against an impurity is provided in the insulating film 305, an impurity, typically hydrogen, nitrogen, alkali metal, alkaline earth metal, or the like, can be prevented from moving from the conductive film 304c to the oxide semiconductor film 308b.

An example of a method for forming the nitride insulating films 305a, 305b, and 305c shown in FIG. 26B is described below. First, as the nitride insulating film 305c, a silicon nitride film with a high blocking property against an impurity is formed by a plasma CVD method in which a mixed gas of silane, nitrogen, and ammonia is used as a source gas. Then, a silicon nitride film with few defects is formed as the nitride insulating film 305a by increasing the flow rate of ammonia. Then, as the nitride insulating film 305b, a silicon nitride film in which the hydrogen concentration is low and hydrogen can be blocked is formed by switching the source gas to a mixed gas of silane and nitrogen. By such a formation method, the insulating film 305 having a stacked-layer structure of nitride insulating films with few defects and a blocking property against an impurity can be formed.

Modification Example 3

Regarding Pair of Electrodes

In the liquid crystal display devices in Embodiment 1 and Embodiment 2, a material used for the conductive films 310a, 310b, 310c, 310d, and 310e is described. Here, description is made using the transistor 103.

Figure 27:
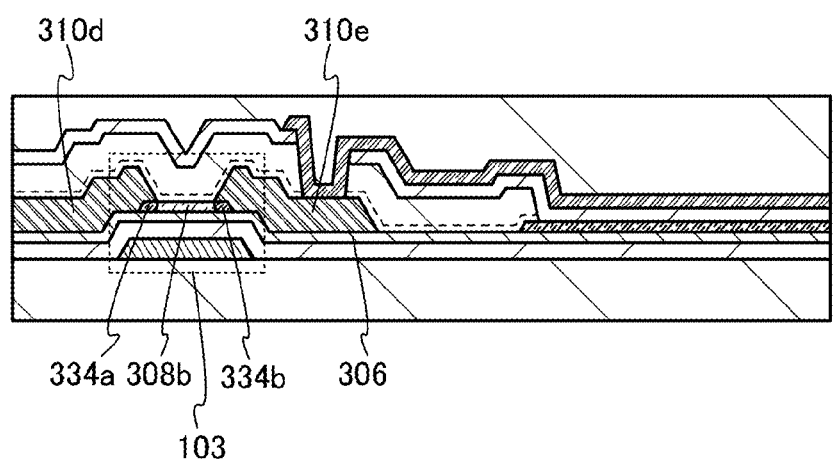
FIG. 27 is a cross-sectional view illustrating one embodiment of a transistor.

As for the conductive films 310d and 310e provided in the transistor 103 described in Embodiments 1 and 2, it is preferable to use a conductive material which is easily bonded to oxygen, such as tungsten, titanium, aluminum, copper, molybdenum, chromium, or tantalum, or an alloy thereof. Thus, oxygen contained in the oxide semiconductor film 308b and the conductive material contained in the conductive films 310d and 310e are bonded to each other, so that an oxygen deficient region is formed in the oxide semiconductor film 308b. Further, in some cases, part of constituent elements of the conductive material that forms the conductive films 310d and 310e is mixed into the oxide semiconductor film 308b. Consequently, as shown in FIG. 27, low-resistance regions 334a and 334b are formed in the vicinity of regions of the oxide semiconductor film 308b which are in contact with the conductive films 310d and 310e. The low-resistance regions 334a and 334b are formed between the insulating film 306 and the conductive films 310d and 310e so as to be in contact with the conductive films 310d and 310e. Since the low-resistance regions 334a and 334b have high conductivity, contact resistance between the oxide semiconductor film 308b and the conductive films 310d and 310e can be reduced, and thus, the on-state current of the transistor can be increased.

Further, the conductive films 310d and 310e may each have a stacked-layer structure of the conductive material which is easily bonded to oxygen and a conductive material which is not easily bonded to oxygen, such as titanium nitride, tantalum nitride, or ruthenium. With such a stacked-layer structure, oxidization of the conductive films 310d and 310e can be prevented at the interface between the conductive films 310d and 310e and the oxide insulating film 312a, so that the increase of the resistance of the conductive films 310d and 310e can be inhibited.

Modification Example 4

Regarding Oxide Semiconductor Film

In the method for manufacturing the transistors 102 and 103 described in Embodiments 1 and 2, after the conductive films 310a, 310b, 310d and 310e are formed, the oxide semiconductor films 308a and 308b may be exposed to plasma generated in an oxygen atmosphere, so that oxygen may be supplied to the oxide semiconductor films 308a and 308b. Atmospheres of oxygen, ozone, dinitrogen monoxide, nitrogen dioxide, and the like can be given as examples of oxidizing atmospheres. Further, in the plasma treatment, the oxide semiconductor films 308a and 308b are preferably exposed to plasma generated with no bias applied to the substrate 302 side. Consequently, the oxide semiconductor films 308a and 308b can be supplied with oxygen without being damaged; accordingly, the amount of oxygen vacancies in the oxide semiconductor films 308a and 308b can be reduced. Moreover, impurities, e.g., halogen such as fluorine or chlorine remaining on the surfaces of the oxide semiconductor films 308a and 308b due to the etching treatment can be removed.

Modification Example 5

Regarding Oxide Semiconductor Film

In the transistors 102 and 103 described in Embodiments 1 and 2, the oxide semiconductor film can have a stacked-layer structure as necessary. Here, description is made using the transistor 103.

Figure 28:
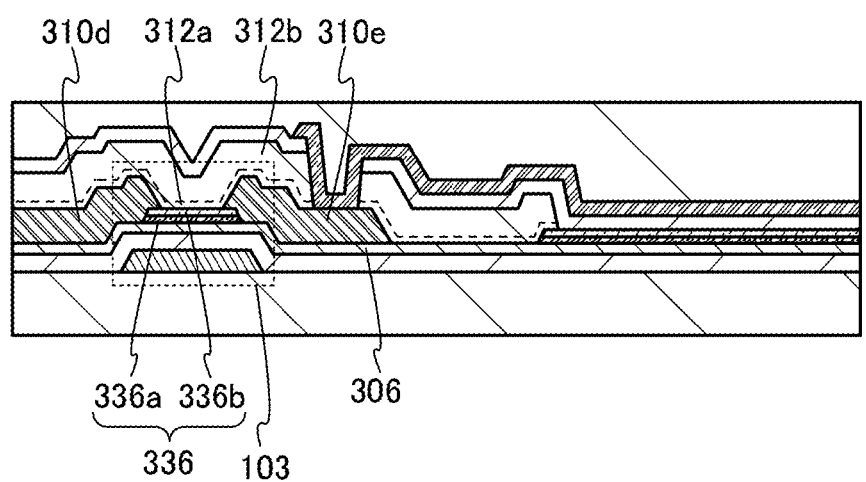
FIG. 28 is a cross-sectional view illustrating one embodiment of a transistor.

In the transistor illustrated in FIG. 28, a multilayer film 336 including an oxide semiconductor film is formed between the insulating film 306 and the conductive films 310d and 310e.

The multilayer film 336 includes the oxide semiconductor film 336a and the oxide film 336b. That is, the multilayer film 336 has a two-layer structure. Further, part of the oxide semiconductor film 336a serves as a channel region. Furthermore, the insulating film 312a is formed in contact with the multilayer film 336, and the oxide film 336b is formed in contact with the insulating film 312a. That is, the oxide film 336b is provided between the oxide semiconductor film 336a and the insulating film 312a.

The oxide film 336b is an oxide film containing one or more elements which form the oxide semiconductor film 336a. Since the oxide film 336b contains one or more elements which form the oxide semiconductor film 336a, interface scattering is unlikely to occur at the interface between the oxide semiconductor film 336a and the oxide film 336b. Thus, the transistor can have a high field-effect mobility because the movement of carriers is not hindered at the interface.

The oxide film 336b is typically In—Ga oxide, In—Zn oxide, or In-M-Zn oxide (M represents Al, Ti, Ga, Y, Zr, La, Ce, Nd, or Hf). The energy at the conduction band bottom of the oxide film 336b is closer to a vacuum level than that of the oxide semiconductor film 336a is, and typically, the difference between the energy at the conduction band bottom of the oxide film 336b and the energy at the conduction band bottom of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide film 336b and the electron affinity of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide film 336b preferably contains In because carrier mobility (electron mobility) can be increased.

When the oxide film 336b contains a larger amount of Al, Ti, Ga, Y, Zr, La, Ce, Nd, or Hf in an atomic ratio than the amount of In in an atomic ratio, any of the following effects may be obtained: (1) the energy gap of the oxide film 336b is widened; (2) the electron affinity of the oxide film 336b decreases; (3) an impurity from the outside is blocked; (4) an insulating property increases as compared to the oxide semiconductor film 336a; and (5) oxygen vacancies are less likely to be generated in the oxide film 336b containing a larger amount of Al, Ti, Ga, Y, Zr, La, Ce, Nd, or Hf in an atomic ratio than the amount of In in an atomic ratio because Al, Ti, Ga, Y, Zr, La, Ce, Nd, or Hf is a metal element which is strongly bonded to oxygen.

In the case where the oxide film 336b is In-M-Zn oxide, the proportions of In and M when summation of In and M is assumed to be 100 atomic % are preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %.

Further, in the case where each of the oxide semiconductor film 336a and the oxide film 336b is In-M-Zn oxide (M represents Al, Ti, Ga, Y, Zr, La, Ce, Nd, or Hf), the proportion of M atoms (M represents Al, Ti, Ga, Y, Zr, La, Ce, Nd, or Hf) in the oxide film 336b is higher than that in the oxide semiconductor film 336a. Typically, the proportion of M in each of the films is 1.5 or more times, preferably twice or more, more preferably three or more times as high as that in the oxide semiconductor film 336a.

Furthermore, in the case where each of the oxide semiconductor film 336a and the oxide film 336b is In-M-Zn oxide film (M represents Al, Ti, Ga, Y, Zr, La, Ce, Nd, or Hf), when In:M:Zn=$x_1$:$y_1$:$z_1$ [atomic ratio] is satisfied in the oxide film 336b and In:M:Zn=$x_2$:$y_2$:$z_2$ [atomic ratio] is satisfied in the oxide semiconductor film 336a, $y_1/x_1$ is higher than $y_2/x_2$. It is preferable that $y_1/x_1$ be 1.5 or more times as high as $y_2/x_2$. It is further preferable that $y_1/x_1$ be twice or more as high as $y_2/x_2$. It is still further preferable that $y_1/x_1$ be three or more times as high as $y_2/x_2$. In this case, it is preferable that in the oxide film 336b, $y_1$ be higher than or equal to $x_1$ because a transistor including the oxide semiconductor film can have stable electric characteristics. However, when $y_1$ is larger than or equal to three or more times $x_1$, the field-effect mobility of the transistor including the oxide semiconductor film is reduced. Accordingly, $y_1$ is preferably smaller than three times $x_1$.

For example, for the oxide semiconductor film 336a, an In—Ga—Zn oxide with an atomic ratio of In:Ga:Zn=1:1:1 or 3:1:2 can be used. For the oxide film 336b, an In—Ga—Zn oxide with an atomic ratio of In:Ga:Zn=1:3:n (n is an integer greater than or equal to 2 and less than or equal to 8), 1:6:m (m is an integer greater than or equal to 2 and less than or equal to 10), or 1:9:6 can be used. Note that the atomic ratio of each of the oxide semiconductor film 336a and the oxide film 336b can allow a difference within a range of ±20%. In the oxide semiconductor film 336a, a percentage of Zn is preferably higher than or equal to a percentage of Ga because a CAAC-OS is easily formed.

The oxide film 336b also serves as a film which relieves damage to the oxide semiconductor film 336a at the time of forming the insulating film 312b later.

The thickness of the oxide film 336b is greater than or equal to 3 nm and less than or equal to 100 nm, preferably greater than or equal to 3 nm and less than or equal to 50 nm.

The oxide film 336b may have a non-single-crystal structure, for example, like the oxide semiconductor film 336a. The non-single crystal structure includes a c-axis aligned crystalline oxide semiconductor (CAAC-OS) which is described later, a polycrystalline structure, a microcrystalline structure described later, or an amorphous structure, for example.

Note that the oxide semiconductor film 336a and the oxide film 336b may each be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

Here, the oxide film 336b is provided between the oxide semiconductor film 336a and the insulating film 312a. Hence, if trap states are formed between the oxide film 336b and the insulating film 312a owing to impurities and defects, electrons flowing in the oxide semiconductor film 336a are less likely to be captured by the trap states because there is a distance between the trap states and the oxide semiconductor film 336a. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 336a and the trap states, capture of the electrons by the trap states can be reduced, and accordingly a fluctuation of the threshold voltage can be reduced.

Further, impurities from the outside can be blocked by the oxide film 336b, and accordingly, the amount of impurities which move from the outside to the oxide semiconductor film 336a can be reduced. Further, an oxygen vacancy is less likely to be formed in the oxide film 336b. Consequently, the impurity concentration and the amount of oxygen vacancies in the oxide semiconductor film 336a can be reduced.

Note that the oxide semiconductor film 336a and the oxide film 336b are not formed by simply stacking each film, but are formed to form a continuous junction (here, in particular, a structure in which the energy of the bottom of the conduction band is changed continuously between each film). In other words, a stacked-layer structure in which there exist no impurity which forms a defect level such as a trap center or a recombination center at each interface is provided. If an impurity exists between the oxide semiconductor film 336a and the oxide film 336b which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

In FIG. 28, the multilayer film 336 has a two-layer structure of the oxide semiconductor film 336a and the oxide film 336b; however the multilayer film 336 may have a three-layer structure in which a film similar to the oxide film 336b is further provided between the insulating film 306 and the oxide semiconductor film 336a. In this case, the thickness of the oxide film provided between the insulating film 306 and the oxide semiconductor film 336a is preferably less than that of the oxide semiconductor film 336a. When the oxide film has a thickness greater than or equal to 1 nm and less than or equal to 5 nm, preferably greater than or equal to 1 nm and less than or equal to 3 nm, the amount of change in the threshold voltage of the transistor can be reduced.

Modification Example 6

Regarding Oxide Semiconductor Film

The structure of the multilayer film including the oxide semiconductor film in Modification Example 5 can be changed as appropriate. Here, description is made using the transistor 103.

Figure 29:
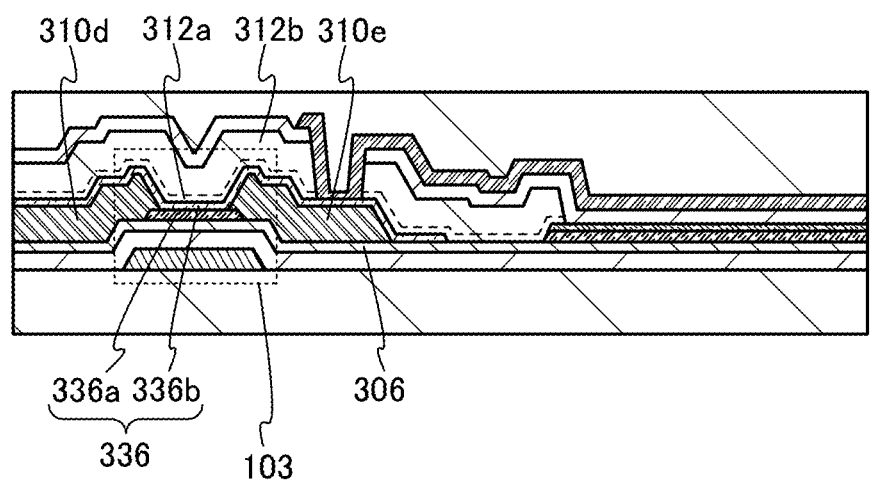
FIG. 29 is a cross-sectional view illustrating one embodiment of a transistor.

As illustrated in FIG. 29, a multilayer film 336 including an oxide semiconductor film is formed between the insulating film 306 and the insulating film 312a.

The multilayer film 336 includes the oxide semiconductor film 336a formed between the insulating film 306 and the conductive films 310d and 310e and the oxide film 336b formed over the oxide semiconductor film 336a and the conductive films 310d and 310e. Further, part of the oxide semiconductor film 336a serves as a channel region. Furthermore, the insulating film 312a is formed in contact with the multilayer film 336, and the oxide film 336b is formed in contact with the insulating film 312a. That is, the oxide film 336b is provided between the oxide semiconductor film 336a and the insulating film 312a.

The transistor 103 in this modification example is a transistor in which the contact resistance between the oxide semiconductor film 336a and the conductive films 310d and 310e is lower than that of the transistor in Modification Example 5 and the on-state current is improved as compared to the transistor in Modification Example 5 because the conductive films 310d and 310e are in contact with the oxide semiconductor film 336a.

Further, since the conductive films 310d and 310e are in contact with the oxide semiconductor film 336a in the transistor 103 in this modification example, the oxide film 336b can be thickened without increase of the contact resistance between the oxide semiconductor film 336a and the conductive films 310d and 310e. Thus, it is possible to inhibit formation of a trap state, which occurs due to plasma damage at the time of forming the insulating film 312b, mixing of a constituent element of the insulating films 312a and 312b, or the like, in the vicinity of the interface between the oxide semiconductor film 336a and the oxide film 336b. That is, the transistor in this modification example can achieve both improvement of on-state current and reduction of change in threshold voltage.

Modification Example 7

Regarding Transistor Structure

In the transistors 102 and 103 in Embodiment 1 and Embodiment 2, a plurality of gate electrodes facing each other with an oxide semiconductor film provided therebetween can be provided as needed. Here, description is made using the transistor 103.

Figure 30:
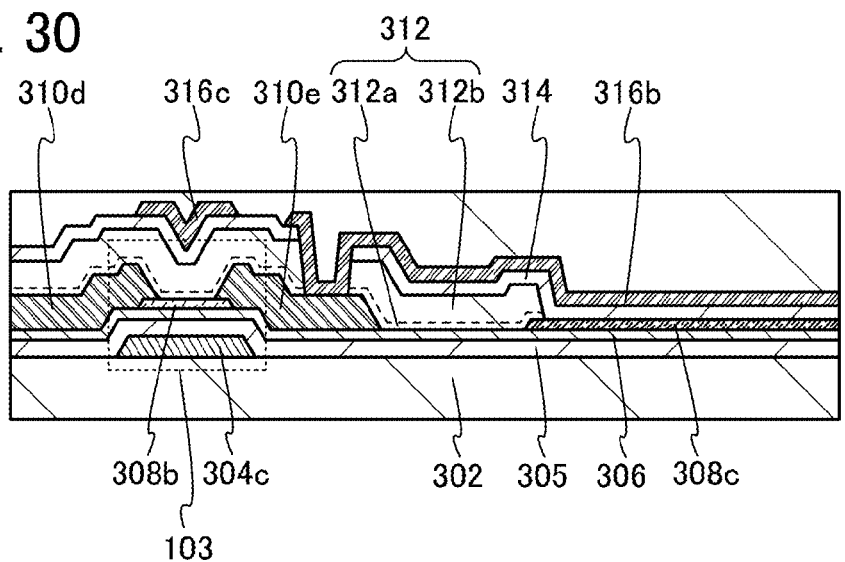
FIG. 30 is a cross-sectional view illustrating one embodiment of a transistor.

The transistor 103 in FIG. 30 includes the conductive film 304c provided over the substrate 302, the insulating film 305 and the insulating film 306 which are formed over the substrate 302 and the conductive film 304c, the oxide semiconductor film 308b overlapping the conductive film 304c with the insulating films 305 and 306 provided therebetween, and the conductive film 310d and the conductive film 310e which are in contact with the oxide semiconductor film 308b. Further, the insulating film 312 in which the insulating film 312a and the insulating film 312b are stacked and the insulating film 314 are formed over the insulating film 306, the oxide semiconductor film 308b, and the conductive films 310d and 310e. In addition, the conductive film 316c overlapping the oxide semiconductor film 308b with the insulating films 312 and 314 provided therebetween is provided.

The conductive film 304c and the conductive film 316c face each other with the oxide semiconductor film 308b provided therebetween. The conductive films 304c and 316c each function as a gate electrode. The conductive film 316c is preferably formed at the same time as the light-transmitting conductive film 316b because the number of steps can be reduced.

The transistor 103 in this modification example includes the conductive film 304c and the conductive film 316c facing each other with the oxide semiconductor film 308b provided therebetween. By applying different potentials to the conductive film 304c and the conductive film 316c, the threshold voltage of the transistor 103 can be controlled.

Note that the structures, methods, and the like described in this embodiment can be used as appropriate in combination with any of the structures, methods, and the like described in the other embodiments and examples.

Embodiment 5

In this embodiment, one embodiment which can be applied to the oxide semiconductor films 308a, 308b, the light-transmitting conductive film 308c, and the multilayer film 336 in any of the transistors included in the semiconductor device described in the above embodiment is described. Note that here, the oxide semiconductor film is used as an example; further, the oxide film included in the multilayer film can have a similar structure.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may include a CAAC-OS. Furthermore, the oxide semiconductor film may include an amorphous oxide semiconductor and an oxide semiconductor having a crystal grain. Described below are the single-crystal oxide semiconductor, the CAAC-OS, the polycrystalline oxide semiconductor, the microcrystalline oxide semiconductor, and the amorphous oxide semiconductor.

<Single Crystal Oxide Semiconductor>

The single crystal oxide semiconductor has, for example, a low impurity concentration and a low density of defect states (a small amount of oxygen vacancies), and thus has a low carrier density. Therefore, a transistor using the single crystal oxide semiconductor for a channel region is unlikely to be normally on. Further, the single crystal oxide semiconductor has a low density of defect states and thus has a low density of trap states in some cases. Therefore, a transistor using the single crystal oxide semiconductor for a channel region has a small variation in electrical characteristics and high reliability in some cases.

<CAAC-OS>

The CAAC-OS is one of oxide semiconductor films including a plurality of crystal parts, and most of the crystal parts each fit inside a cube whose one side is less than 100 nm. Thus, there is a case where a crystal part included in the CAAC-OS fits inside a cube whose one side is less than 10 nm, less than 5 nm, or less than 3 nm. The density of defect states of the CAAC-OS is lower than that of the microcrystalline oxide semiconductor film. The CAAC-OS is described in detail below.

In a transmission electron microscope (TEM) image of the CAAC-OS, a boundary between crystal parts, that is, a grain boundary is not clearly observed. Thus, in the CAAC-OS, a reduction in electron mobility due to the grain boundary is less likely to occur.

According to the TEM image of the CAAC-OS observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS is formed is referred to as a formation surface) or a top surface of the CAAC-OS, and is arranged in parallel to the formation surface or the top surface of the CAAC-OS.

On the other hand, according to the TEM image of the CAAC-OS observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

On the other hand, when the CAAC-OS is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor of $InGaZnO_4$, six peaks appear. The six peaks are derived from crystal planes equivalent to the (110) plane. On the other hand, in the case of a CAAC-OS, a peak is not clearly observed even when φ scan is performed with 2θ fixed at around 56°.

According to the above results, in the CAAC-OS having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS is changed by etching or the like, the c-axis might not be necessarily parallel to a normal vector of a formation surface or a normal vector of a top surface of the CAAC-OS.

Further, the degree of crystallinity in the CAAC-OS is not necessarily uniform. For example, in the case where crystal growth leading to the CAAC-OS occurs from the vicinity of the top surface of the film, the degree of the crystallinity in the vicinity of the top surface is higher than that in the vicinity of the formation surface in some cases. Further, when an impurity is added to the CAAC-OS, the crystallinity in a region to which the impurity is added is changed, and the degree of crystallinity in the CAAC-OS varies depending on regions.

Note that when the CAAC-OS with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS. It is preferable that in the CAAC-OS, a peak of 2θ appear at around 31° and a peak of 2θ do not appear at around 36°.

Figure 31:
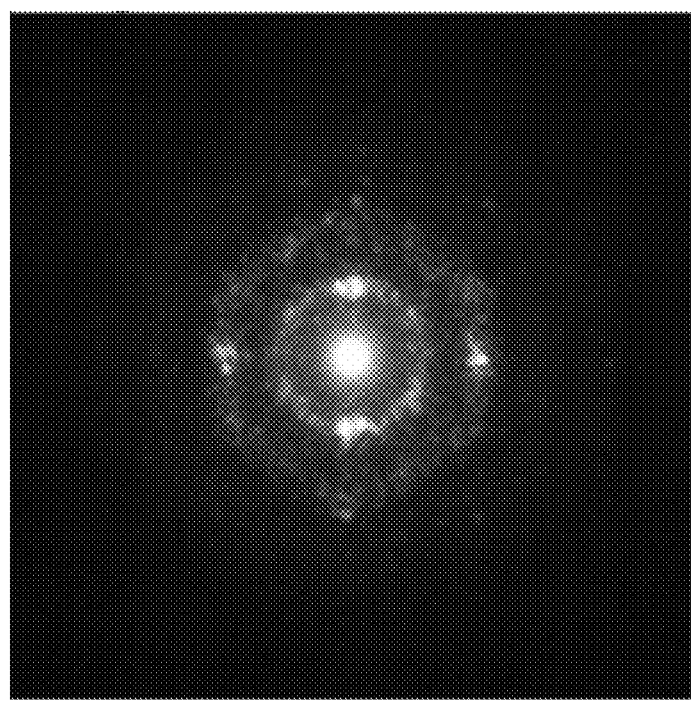
FIG. 31 shows a nanobeam electron diffraction pattern of an oxide semiconductor.

Further, for example, spots (luminescent spots) are observed in an electron diffraction pattern of the CAAC-OS in some cases. An electron diffraction pattern obtained with an electron beam having a beam diameter of 10 nmφ or smaller, or 5 nmφ or smaller, is called a nanobeam electron diffraction pattern. FIG. 31 is an example of a nanobeam electron diffraction pattern of a sample including CAAC-OS. Here, the sample is cut in the direction perpendicular to a surface where the CAAC-OS is formed and the thickness thereof is reduced to about 40 nm. Further, an electron beam with a diameter of 1 nmφ enters from the direction perpendicular to the cut surface of the sample. FIG. 31 shows that spots are observed in the nanobeam electron diffraction pattern of the CAAC-OS.

The CAAC-OS can be obtained by reducing the impurity concentration, for example. The impurity herein means an element other than main components of the oxide semiconductor, such as hydrogen, carbon, silicon, or a transition metal element. In particular, an element such as silicon has a higher strength to bond with oxygen than that of a metal element included in the oxide semiconductor. Therefore, when the element takes oxygen away in the oxide semiconductor, the atomic arrangement in the oxide semiconductor is disrupted, whereby the crystallinity of the oxide semiconductor is lowered in some cases. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

In the CAAC-OS, distribution of crystal parts is not necessarily uniform. For example, in the formation process of the CAAC-OS, in the case where crystal growth occurs from a surface side of the oxide semiconductor, the proportion of crystal parts in the vicinity of the surface of the oxide semiconductor is higher than that in the vicinity of the surface where the oxide semiconductor is formed in some cases. Further, when an impurity is added to the CAAC-OS, the crystal part in a region to which the impurity is added may have low crystallinity.

Further, the CAAC-OS can be formed, for example, by reducing the density of defect states. In an oxide semiconductor, for example, oxygen vacancies cause an increase in the density of defect states. The oxygen vacancies serve as carrier traps or serve as carrier generation sources when hydrogen is captured therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

Note that of the CAAC-OS, the absorption coefficient calculated by a constant photocurrent method (CPM) is lower than $1\times10^{-3}$/cm, preferably lower than $1\times10^{-4}$/cm, further preferably lower than $5\times10^{-5}$/cm. The absorption coefficient has a positive correlation with an energy corresponding to the localized levels due to oxygen vacancies and entry of impurities (the energy calculated from the wavelength); thus, the density of defect levels in the CAAC-OS is extremely low.

A part of the absorption coefficient which is called an urbach tail due to the band tail is removed from a curve of the absorption coefficient obtained by the CPM measurement, whereby the absorption coefficient due to the defect levels can be calculated from the following formula. Note that the urbach tail indicates a constant gradient region on a curve of the absorption coefficient obtained by the CPM measurement, and the gradient is called urbach energy.

$$\int \frac{\alpha(E) - \alpha_u}{E} dE \qquad \text{[Formula 1]}$$

Here, α(E) indicates the absorption coefficient at each energy level and $\alpha_u$ indicates the absorption coefficient due to the urbach tail.

With the use of the highly purified intrinsic or substantially highly purified intrinsic CAAC-OS in a transistor, variation in the electrical characteristics of the transistor due to irradiation with visible light or ultraviolet light is small.

<Method for Forming CAAC-OS>

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal part is the direction parallel to a normal vector of the surface where the CAAC-OS is formed or a normal vector of the surface of the CAAC-OS. The crystal part is formed by film formation or by performing treatment for crystallization such as heat treatment after film formation.

There are three methods for forming a CAAC-OS.

The first method is to form an oxide semiconductor film at a temperature higher than or equal to 100° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C. to form, in the oxide semiconductor film, crystal parts in which the c-axes are aligned in the direction parallel to a normal vector of a surface where the oxide semiconductor film is formed or to a normal vector of a surface of the oxide semiconductor film.

The third method is to form a first oxide semiconductor film with a small thickness, then heat it at a temperature higher than or equal to 200° C. and lower than or equal to 700° C., and form a second oxide semiconductor film to form, in the second oxide semiconductor film, crystal parts in which the c-axes are aligned in the direction parallel to a normal vector of a surface where the second oxide semiconductor film is formed or to a normal vector of a surface of the second oxide semiconductor film.

Here, the first method for forming a CAAC-OS is described.

<Target and Formation Method Thereof>

The CAAC-OS is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a surface on which the CAAC-OS is formed while maintaining its crystal state, whereby the CAAC-OS can be deposited.

For the deposition of the CAAC-OS, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas with a dew point of −80° C. or lower, preferably −100° C. or lower, more preferably −120° C. or lower is used.

By increasing the heating temperature of the surface on which the CAAC-OS is formed (e.g., the substrate heating temperature) during the deposition, migration of a sputtered particle is likely to occur after the sputtered particle reaches the surface on which the CAAC-OS is formed. Specifically, the temperature of the surface on which the CAAC-OS is formed during the deposition is higher than or equal to 100° C. and lower than or equal to 740° C., preferably higher than or equal to 200° C. and lower than or equal to 500° C. By increasing the temperature of the surface on which the CAAC-OS is formed during the deposition, when the flat-plate-like or the pellet-like sputtered particle reaches the surface on which the CAAC-OS is formed, migration occurs on the surface on which the CAAC-OS is formed, so that a flat plane of the sputtered particle is attached to the surface on which the CAAC-OS is formed. The diameter (equivalent circle diameter) of the plane of the sputtered particle, which is parallel to the a-b plane, is approximately greater than or equal to 1 nm and less than or equal to 30 nm or greater than or equal to 1 nm and less than or equal to 10 nm, though it differs depending on the kind of oxide. Note that the flat-plate-like or the pellet-like sputtered particle may have a hexagonal cylinder shape whose hexagonal plane is parallel to the a-b plane. In such a case, a direction perpendicular to the hexagonal plane is a c-axis direction.

When a cation of oxygen is ejected to a sputtering target in the sputtering, it is possible to reduce plasma damage at the deposition. Thus, when the ion collides with the surface of the sputtering target, a lowering in crystallinity of the sputtering target can be suppressed or a change of the sputtering target into an amorphous state can be suppressed.

When a cation of oxygen or argon is ejected to a sputtering target in the sputtering, in the case where a flat-plate-like or the pellet-like sputtered particle having a hexagonal columnar shape is sputtered, the corners of a hexagonal plane can be positively charged. When the corners of the hexagonal plane are positively charged, positive charges repel each other in one sputtered particle. Thus, flat-plate or pellet shapes of the sputtered particles can be maintained.

It is preferable to use a direct-current (DC) power source to positively charge the corners of the plane of the flat-plate-like or the pellet-like sputtered particle. Note that a radio frequency (RF) power source or an alternating-current (AC) power source can be used. Note that it is difficult to use an RF power source for a sputtering apparatus which is capable of deposition to a large-sized substrate. In addition, a DC power source is preferred to an AC power source from the viewpoint below.

In the AC power source, adjacent targets alternately have a cathode potential and an anode potential. In the case where the flat-plate-like or the pellet-like sputtered particle is positively charged, positive charges in the sputtered particle repel each other, whereby flat-plate or pellet shapes of the sputtered particles can be maintained. However, in the case where the AC power source is used, there is time during which an electric field is not applied instantaneously; therefore, some charges of the flat-plate-like or the pellet-like sputtered particle are lost and the structure of the sputtered particle might be broken. Thus, a DC power source is preferred to an AC power source.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based compound target is described below.

The polycrystalline In—Ga—Zn-based compound target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 3:1:2, 1:3:2, 1:6:4, or 1:9:6. The kinds of powder and the molar ratio for mixing powder may be determined as appropriate depending on the desired sputtering target.

With use of the sputtering target in the way as described above, an oxide semiconductor film having a uniform thickness and a uniform crystal orientation can be formed.

<Polycrystalline Oxide Semiconductor>

A polycrystalline oxide semiconductor includes a plurality of crystal grains. A polycrystalline oxide semiconductor includes, for example, amorphous parts in some cases.

In an image obtained with a TEM, for example, crystal grains can be found in the polycrystalline oxide semiconductor in some cases. In most cases, the size of a crystal grain in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in the TEM image, a boundary between crystal grains or a boundary between an amorphous part and a crystal grain can be found in the polycrystalline oxide semiconductor in some cases. Moreover, in the TEM image, a grain boundary can be found in the polycrystalline oxide semiconductor in some cases.

The polycrystalline oxide semiconductor may include a plurality of crystal grains, and the alignment of crystals may be different in the plurality of crystal grains. When a polycrystalline oxide semiconductor is analyzed by an out-of-plane method with use of an XRD apparatus, a peak at $2\theta$ of around 31° which shows alignment or plural kinds of peaks showing different alignment appears in some cases. Further, spots are observed in a nanobeam electron diffraction pattern of the polycrystalline oxide semiconductor in some cases.

The polycrystalline oxide semiconductor has high crystallinity and thus has high electron mobility in some cases. Accordingly, a transistor including the polycrystalline oxide semiconductor in a channel region has high field-effect mobility. Note that there are cases in which an impurity is segregated at the grain boundary between the crystals in the polycrystalline oxide semiconductor. Moreover, the grain boundary of the polycrystalline oxide semiconductor becomes a defect state. Since the grain boundary of the polycrystalline oxide semiconductor may serve as a carrier trap or a carrier generation source, a transistor using the polycrystalline oxide semiconductor for a channel region has larger variation in electrical characteristics and lower reliability than a transistor using a CAAC-OS for a channel region in some cases.

The polycrystalline oxide semiconductor can be formed by high-temperature heat treatment or laser light treatment.

<Microcrystalline Oxide Semiconductor>

In an image obtained with the TEM, crystal parts cannot be found clearly in the microcrystalline oxide semiconductor in some cases. In most cases, the size of a crystal part in a microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Figure 32:
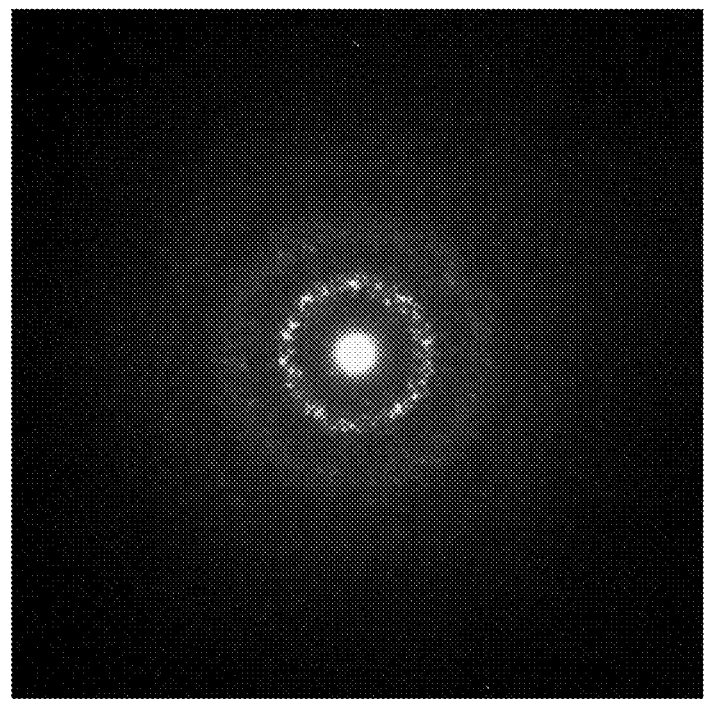
FIG. 32 shows a nanobeam electron diffraction pattern of an oxide semiconductor.

FIG. 32 shows an example of nanobeam electron diffraction performed on a sample including an nc-OS film. The measurement position is changed. Here, the sample is cut in the direction perpendicular to a surface where an nc-OS film is formed and the thickness thereof is reduced to be less than or equal to 10 nm. Further, an electron beam with a diameter of 1 nm enters from the direction perpendicular to the cut surface of the sample. FIG. 32 shows that, when a nanobeam electron diffraction is performed on the sample including the nc-OS film, a diffraction pattern exhibiting a crystal plane is obtained, but orientation along a crystal plane in a particular direction is not observed.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Thus, the nc-OS film has a higher carrier density than the CAAC-OS film in some cases. The oxide semiconductor film having a high carrier density has high electron mobility in some cases. Thus, a transistor including the nc-OS film has high field-effect mobility in some cases. The nc-OS film has a higher defect state density than the CAAC-OS film, and thus has a lot of carrier traps in some cases. Consequently, a transistor including the nc-OS film has larger variation in electric characteristics and lower reliability than a transistor including the CAAC-OS film. The nc-OS film can be formed easily as compared to the CAAC-OS film because the nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

<Method of Forming Microcrystalline Oxide Semiconductor Film>

Next, a method of forming the microcrystalline oxide semiconductor film is described below. The microcrystalline oxide semiconductor film is formed by a sputtering method in an atmosphere containing oxygen at a temperature of higher than or equal to a room temperature and lower than or equal to 75° C., preferably higher than or equal to a room temperature and lower than or equal to 50° C. With the use of the atmosphere containing oxygen, oxygen vacancies in the microcrystalline oxide semiconductor film can be reduced and a film including a microcrystal part can be formed.

A reduction of oxygen vacancies in the microcrystalline oxide semiconductor film allows the formation of a film having stable physical properties. In particular, in the case where a semiconductor device is manufactured with the use of a microcrystalline oxide semiconductor film, oxygen vacancies in the microcrystalline oxide semiconductor film serve as donors, and electrons that are carriers are generated in the microcrystalline oxide semiconductor film, which causes change in electrical characteristics of the semiconductor device. Thus, a semiconductor device formed using a microcrystalline oxide semiconductor film in which oxygen vacancies are reduced can be highly reliable.

Note that it is preferable to increase the oxygen partial pressure in the deposition atmosphere because the oxygen vacancies in the microcrystalline oxide semiconductor film can be further reduced. More specifically, the oxygen partial pressure in the deposition atmosphere is preferably greater than or equal to 33%.

Note that for a target used in formation of a microcrystalline oxide semiconductor film by a sputtering method, a target and a forming method which are similar to those of the CAAC-OS can be used.

Note that the nc-OS can be formed easily as compared to the CAAC-OS because the nc-OS can be formed even when a relatively large amount of impurities are included; thus, depending on the purpose, the nc-OS can be favorably used in some cases. For example, the nc-OS may be formed by a deposition method such as a sputtering method using an AC power supply. The sputtering method using an AC power supply allows a film to be formed with high uniformity over a large substrate, so that a semiconductor device including a transistor using the nc-OS for a channel region can be manufactured with high productivity.

<Amorphous Oxide Semiconductor>

An amorphous oxide semiconductor, for example, has disordered atomic arrangement and no crystal part. An amorphous oxide semiconductor, for example, does not have a specific shape as in quartz and regularity in atomic arrangement.

In an image obtained with a TEM, for example, crystal parts cannot be found clearly in the amorphous oxide semiconductor film in some cases.

When an amorphous oxide semiconductor is analyzed by an out-of-plane method with an XRD apparatus, a peak which shows alignment does not appear in some cases. Further, a halo pattern is observed in an electron diffraction pattern of an amorphous oxide semiconductor film in some cases. In other cases, a halo pattern is observed instead of a spot in a nano-beam electron diffraction pattern of the amorphous oxide semiconductor film.

The amorphous oxide semiconductor can be formed in some cases, for example, by introducing a high-concentration impurity such as hydrogen. Thus, the amorphous oxide semiconductor contains impurities at a high concentration.

When an oxide semiconductor contains a high-concentration impurity, a defect state such as an oxygen vacancy is formed in the oxide semiconductor in some cases. This means that an amorphous oxide semiconductor with a high-concentration impurity has a high density of defect states. In addition, since the amorphous oxide semiconductor has low crystallinity, the density of defect states of the amorphous oxide semiconductor is higher than that of the CAAC-OS or the nc-OS.

Accordingly, the amorphous oxide semiconductor has much higher carrier density than the nc-OS. Therefore, a transistor including the amorphous oxide semiconductor for a channel region tends to be normally on. Thus, in some cases, such an amorphous oxide semiconductor can be applied to a transistor which needs to be normally on. Since the amorphous oxide semiconductor has a high density of defect states, density of carrier traps might be increased. Consequently, a transistor including the amorphous oxide semiconductor for a channel region has larger variation in electric characteristics and lower reliability than a transistor including the CAAC-OS or the nc-OS for a channel region. Note that the amorphous oxide semiconductor can be formed by a deposition method in which a relatively large amount of impurity is contained, and thus can be easily obtained and preferably used depending on the application. For example, the amorphous oxide semiconductor may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor for a channel region can be manufactured with high productivity.

Note that when the oxide semiconductor has few defects, the density thereof is increased. When the oxide semiconductor has high crystallinity, the density thereof is increased. When the oxide semiconductor has a lower concentration of impurities such as hydrogen, the density thereof is increased. The single-crystal oxide semiconductor has higher density than the CAAC-OS in some cases. The CAAC-OS has higher density than the microcrystalline oxide semiconductor in some cases. The polycrystalline oxide semiconductor has higher density than the microcrystalline oxide semiconductor in some cases. The microcrystalline oxide semiconductor has higher density than the amorphous oxide semiconductor in some cases.

Embodiment 6

In this embodiment, a human interface to which the semiconductor device of one embodiment of the present invention can be applied is described. In particular, a structure example of a sensor that can detect proximity or touch of an object (hereinafter referred to as a touch sensor) is described.

For a touch sensor, a variety of types such as a capacitive type, a resistive type, a surface acoustic wave type, and an infrared type can be employed.

Examples of the capacitive touch sensor are typically of a surface capacitive type, a projected capacitive type, and the like. Further, examples of the projected capacitive type are of a self capacitive type, a mutual capacitive type, and the like mainly in accordance with the difference in the driving method. Here, the use of a mutual capacitive type is preferable because of simultaneous sensing of multiple points (also referred to as multipoint sensing or multi-touch).

Besides the touch sensor described here in detail, a sensor that can detect the operation (gesture) of an object (e.g., a finger or a hand), eye movements of users, or the like by a camera (including an infrared camera) or the like can be used as a human interface.

<Example of Detection Method of Sensor>

FIGS. 33A and 33B are schematic diagrams each illustrating a structure of a mutual capacitive touch sensor and input and output waveforms. The touch sensor includes a pair of electrodes. Capacitance is formed between the pair of electrodes. Input voltage is input to one of the pair of electrodes. Further, a detection circuit which detects current flowing in the other electrode (or a potential of the other electrode) is provided.

For example, in the case where a rectangular wave is used as an input voltage waveform as illustrated in FIG. 33A, a waveform having a sharp peak is detected as an output current waveform.

Further, in the case where an object having conductivity is proximate to or touches a capacitor as illustrated in FIG. 33B, the charge capacity between the electrodes is decreased; accordingly, the current value of the output is decreased.

By detecting a change in capacitance by using a change in output current (or potential) with respect to input voltage in this manner, proximity or a touch of an object can be detected.

<Structure Example of Touch Sensor>

FIG. 33C illustrates a structure example of a touch sensor provided with a plurality of capacitors arranged in a matrix.

The touch sensor includes a plurality of wirings extending in an X direction (the horizontal direction of this figure) and a plurality of wirings extending in a Y direction (the vertical direction of this figure) which intersect with the plurality of wirings. Capacitance is formed between two wirings intersecting with each other.

One of input voltage and a common potential (including a grounded potential and a reference potential) is input to each of the wirings extending in the X direction. Further, a detection circuit (e.g., a source meter or a sense amplifier) is electrically connected to the wirings extending in the Y direction and can detect current (or potential) flowing through the wirings.

The touch sensor can perform sensing two dimensionally in such a manner that the touch sensor sequentially scans the plurality of wirings extending in the X direction so that input voltage is input and detects a change in current (or potential) flowing through the wirings extending in the Y direction.

<Structure Example of Touchscreen>

A structure example of a touchscreen including a touch sensor and a display portion including a plurality of pixels and a case where the touchscreen is incorporated in an electronic device are described below.

Figure 34A:
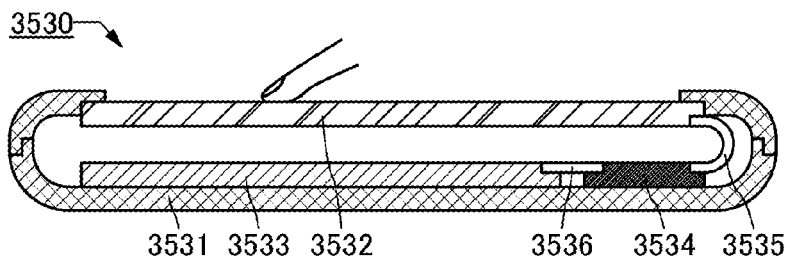
FIGS. 34A to 34E illustrate structural examples of a touch-screen and an electronic device of one embodiment.

FIG. 34A is a schematic cross-sectional view of an electronic device including a touchscreen.

An electronic device 3530 includes a housing 3531 and at least a touchscreen 3532, a battery 3533, and a control portion 3534, which are provided in the housing 3531. The touchscreen 3532 is electrically connected to the control portion 3534 through a wiring 3535. The control portion 3534 controls image display on a display portion and the sensing operation of the touch sensor. The battery 3533 is electrically connected to the control portion 3534 through a wiring 3536 to supply electric power to the control portion 3534.

The touchscreen 3532 is provided so that its surface is not covered. An image can be displayed on the exposed surface of the touchscreen 3532 and the proximity or the contact of an object can be detected.

Figure 34B:
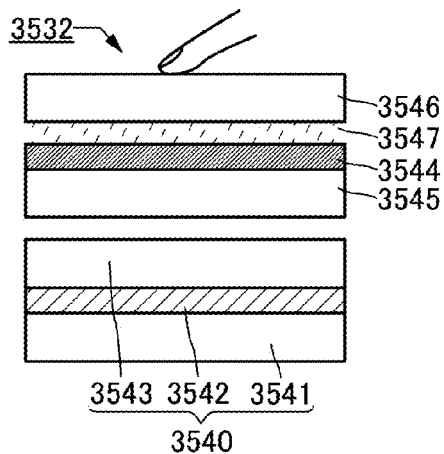
Figure 34C:
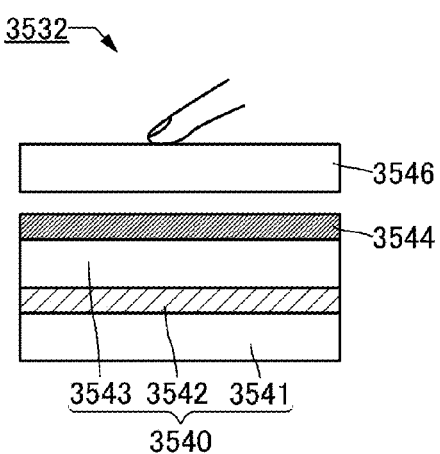
Figure 34D:
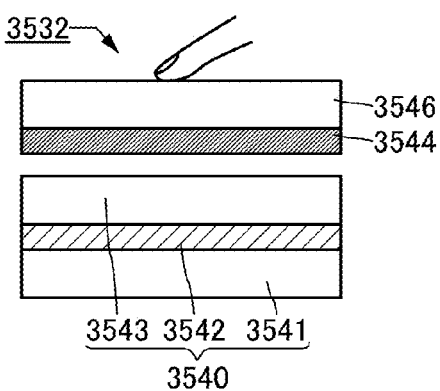

FIGS. 34B to 34D each illustrate a structure example of a touchscreen.

The touchscreen 3532 illustrated in FIG. 34B includes a display panel 3540 in which a display portion 3542 is provided between a first substrate 3541 and a second substrate 3543, a third substrate 3545 provided with a touch sensor 3544, and a protective substrate 3546.

As the display panel 3540, a variety of display devices such as a liquid crystal display device including a liquid crystal element and an electronic paper can be used.

Note that the touchscreen 3532 may additionally include a backlight, a polarizing plate, and the like in accordance with the structure of the display panel 3540.

An object comes in contact with or close to one of the surfaces of the protective substrate 3546; thus, the mechanical strength of at least the surface is preferably high. For example, a tempered glass which has been subjected to physical or chemical treatment by an ion exchange method, a thermal tempering method, or the like and has a surface to which compressive stress has been applied can be used as the protective substrate 3546. Alternatively, a flexible substrate with a coated surface, such as a plastic substrate can be used.

Note that a protective film or an optical film may be provided over the protective substrate 3546.

The touch sensor 3544 is provided on at least one of the surfaces of the third substrate 3545. Alternatively, a pair of electrodes included in the touch sensor 3544 may be formed on both surfaces of the third substrate 3545. A flexible film may be used as the third substrate 3545 for thickness reduction of the touchscreen. The touch sensor 3544 may be held between a pair of substrates (provided with a film).

Although the protective substrate 3546 and the third substrate provided with the touch sensor 3544 are bonded to each other by a bonding layer 3547 in FIG. 34B, the protective substrate 3546 and the third substrate are not necessarily bonded to each other. The third substrate 3545 and the display panel 3540 may be bonded to each other by the bonding layer.

In the touchscreen 3532 illustrated in FIG. 34B, the display panel and the substrate provided with the touch sensor are separately provided. The touchscreen having such a structure can also be referred to as an externally attached touchscreen. In such a structure, the display panel and the substrate provided with the touch sensor are separately formed and then they are overlapped with each other, so that the display panel can have a touch sensor function. Thus, the touchscreen can be easily manufactured without a special manufacturing process.

In the touchscreen 3532 illustrated in FIG. 34C, the touch sensor 3544 is provided on a surface of the second substrate 3543 which is on the protective substrate 3546 side. The touchscreen having such a structure can also be referred to as an on-cell touchscreen. With such a structure, the number of substrates needed can be reduced, which results in reductions in the thickness and weight of the touchscreen.

In the touchscreen 3532 illustrated in FIG. 34D, the touch sensor 3544 is provided on one of the surfaces of the protective substrate 3546. With such a structure, the display panel and the touch sensor can be separately manufactured; thus, the touchscreen can be easily manufactured. Furthermore, the number of substrates needed can be reduced, which results in reductions in the thickness and weight of the touchscreen.

Figure 34E:
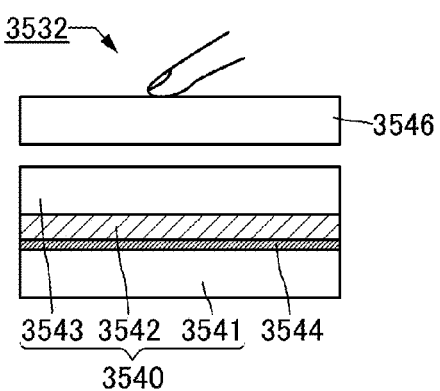

In the touchscreen 3532 illustrated in FIG. 34E, the touch sensor 3544 is provided between the pair of substrates in the display panel 3540. The touchscreen having such a structure can also be referred to as an in-cell touchscreen. With such a structure, the number of substrates needed can be reduced, which results in reductions in the thickness and weight of the touchscreen. Such a touchscreen can be achieved, for example, in such a manner that a circuit functioning as a touch sensor is formed using a transistor, a wiring, an electrode, and the like included in the display portion 3542 on the first substrate 3541 or the second substrate 3543. Further, in the case of using an optical touch sensor, a photoelectric conversion element may be provided.

<Structural Example of in-Cell Touchscreen>

A structure example of a touchscreen incorporating the touch sensor into a display portion including a plurality of pixels is described below. Here, an example where a liquid crystal element is used as a display element provided in the pixel is shown.

Figure 35A:
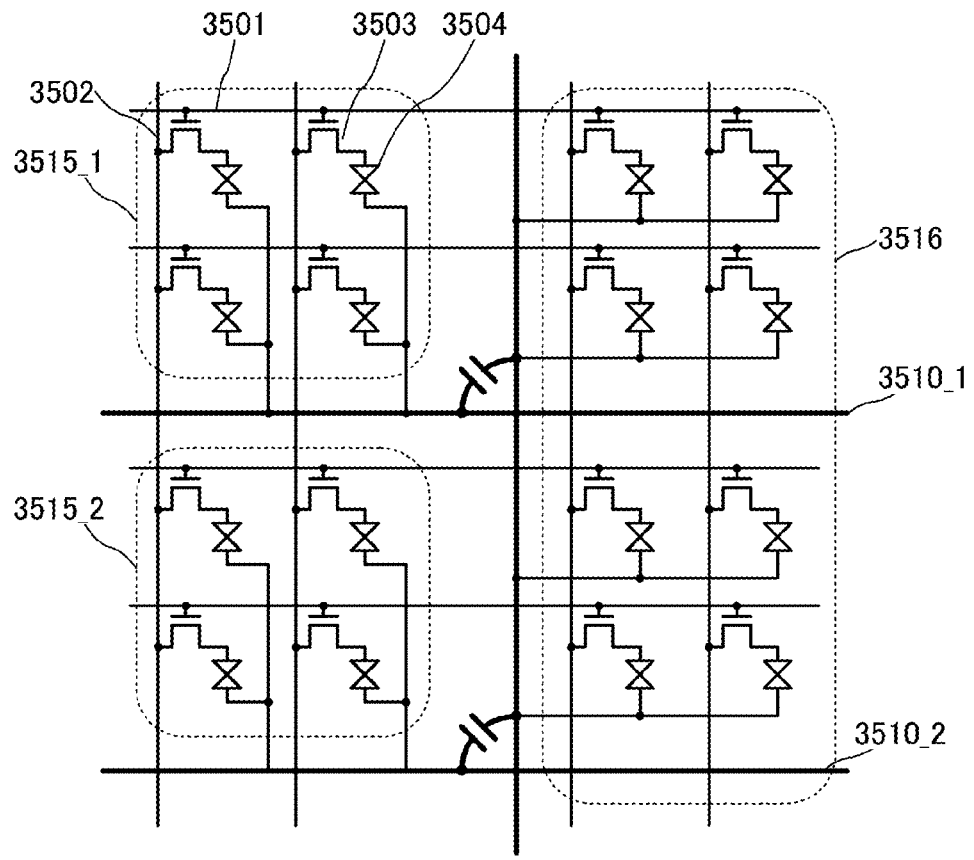
FIGS. 35A and 35B illustrate a pixel provided with a touch sensor of one embodiment.

FIG. 35A is an equivalent circuit diagram of part of a pixel circuit provided in the display portion of the touchscreen exemplified in this structure example.

Each pixel includes at least a transistor 3503 and a liquid crystal element 3504. In addition, a gate of the transistor 3503 is electrically connected to a wiring 3501 and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to intersect with each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that only part of the pixel circuit is illustrated in FIGS. 35A and 35B, and actually, these two kinds of blocks are repeatedly arranged in the X direction and the Y direction.

The wiring 3510_1 (or 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Further, the wiring 3511 extending in the Y direction is electrically connected to the linear block 3516.

Figure 35B:
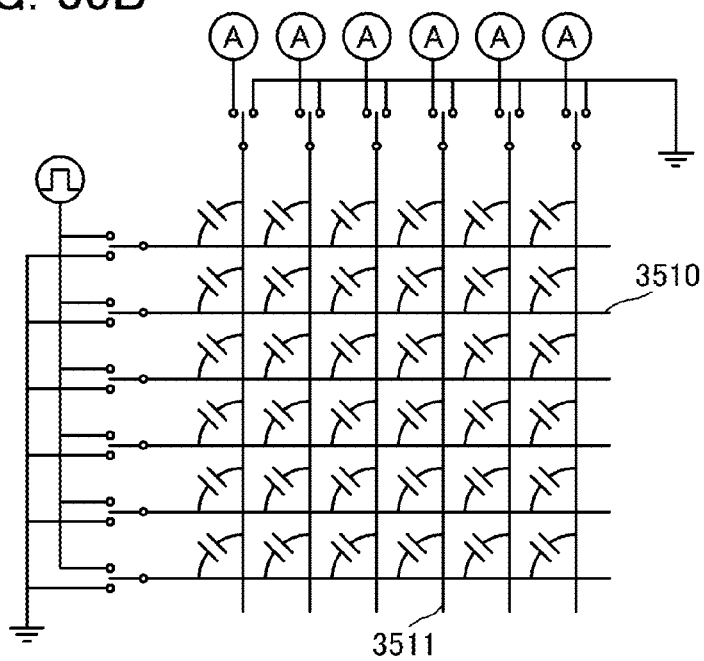

FIG. 35B is an equivalent circuit diagram in which a plurality of wirings 3510 extending in the X direction and the plurality of wirings 3511 extending in the Y direction are illustrated. Input voltage or a common potential can be input to each of the wirings 3510 extending in the X direction. Further, a ground potential can be input to each of the wirings 3511 extending in the Y direction, or the wirings 3511 can be electrically connected to the detection circuit.

<Example of Operation of Touchscreen>

Operation of the above-described touchscreen is described with reference to FIGS. 36A to 36C.

Figure 36A:
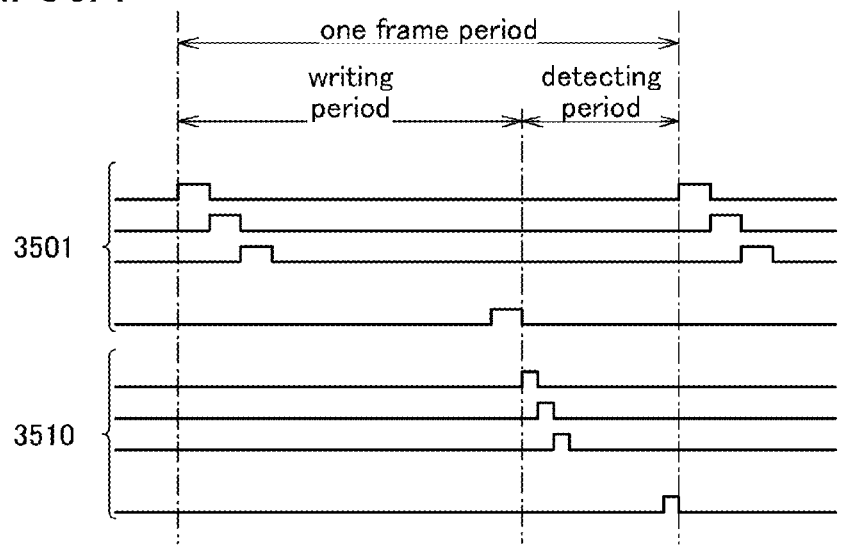
FIGS. 36A to 36C illustrate operations of touch sensors and pixels of one embodiment.

As illustrated in FIG. 36A, one frame period is divided into a writing period and a detecting period. The writing period is a period in which image data is written to a pixel, and the wirings 3510 (also referred to as gate lines) are sequentially selected. On the other hand, the detecting period is a period in which sensing is performed by a touch sensor, and the wirings 3510 extending in the X direction are sequentially selected and input voltage is input.

Figure 36B:
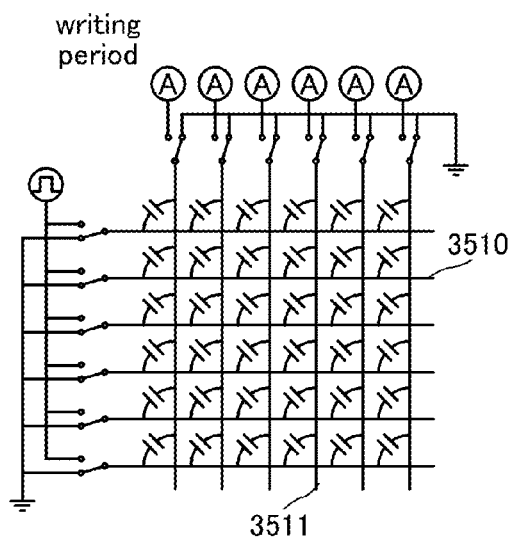

FIG. 36B is an equivalent circuit diagram in the writing period. In the writing period, a common potential is input to both the wiring 3510 extending in the X direction and the wiring 3511 extending in the Y direction.

Figure 36C:
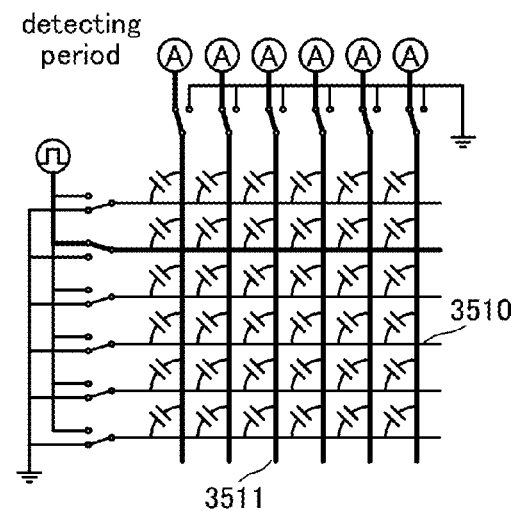

FIG. 36C is an equivalent circuit diagram at some point in time in the detection period. In the detection period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

It is preferable that a period in which an image is written and a period in which sensing is performed by a touch sensor be separately provided as described above. Thus, a decrease in sensitivity of the touch sensor caused by noise generated when data is written to a pixel can be suppressed.

Embodiment 7

Figure 37:
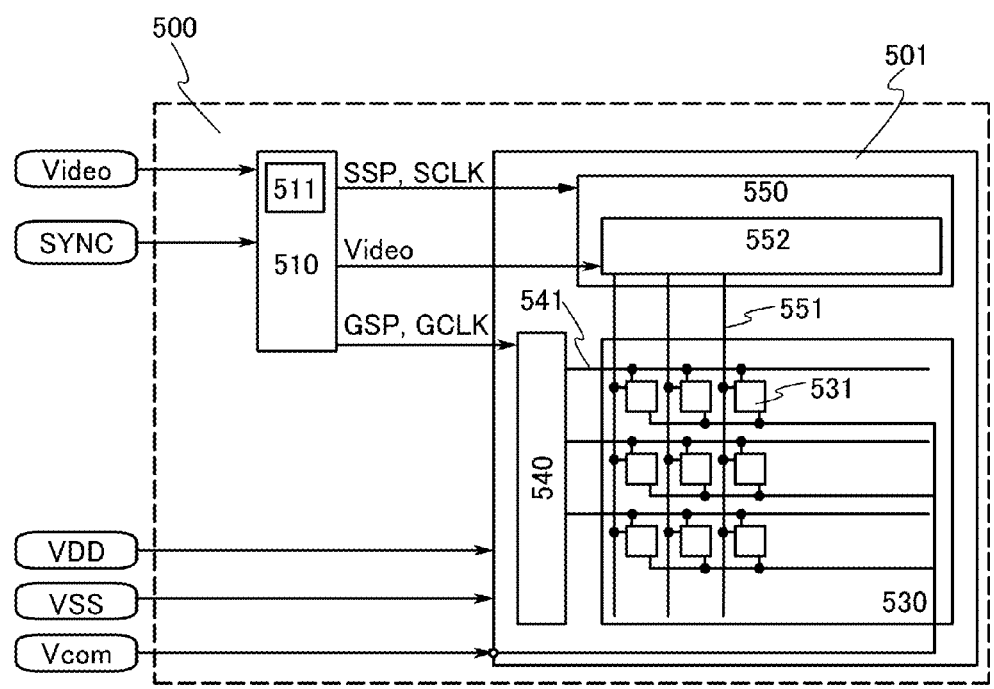
FIG. 37 is a block diagram illustrating a structural example of a semiconductor device.
Figure 38:
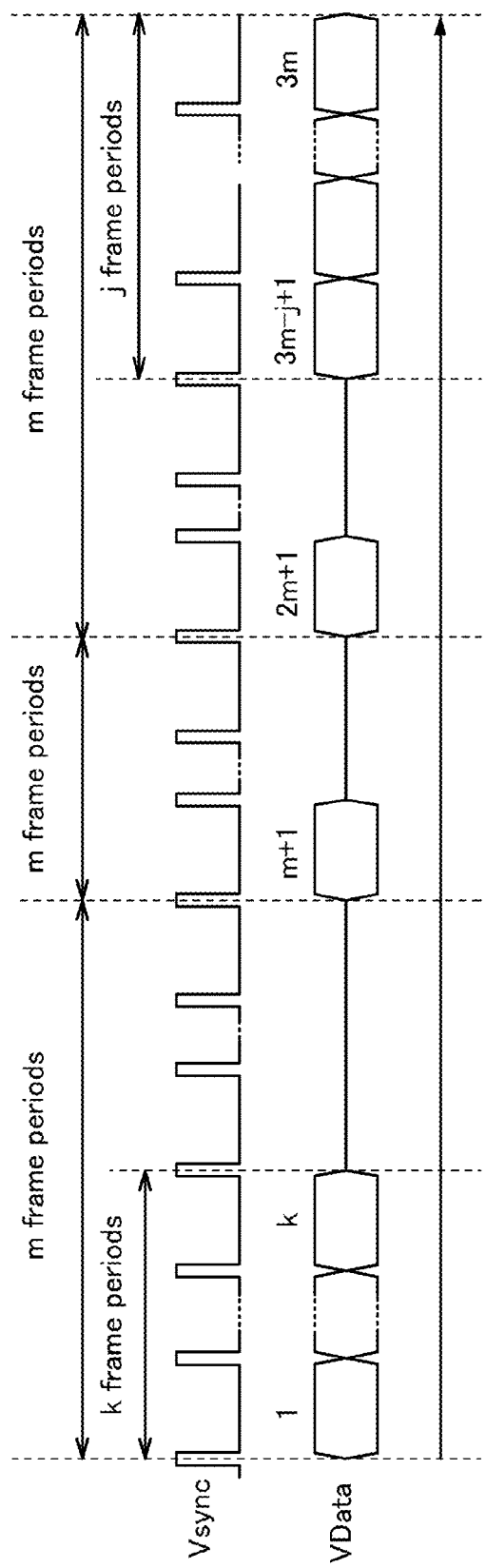
FIG. 38 is a timing chart illustrating one example of a method for driving a semiconductor device.

In this embodiment, a driving method for reducing power consumption of a display device is described. By using the driving method in this embodiment, power consumption of a display device including an oxide semiconductor transistor in a pixel can be further reduced. With reference to FIGS. 37 and 38, low power consumption of a liquid crystal display device, which is an example of the display device, is described below.

FIG. 37 is a block diagram illustrating a structural example of a liquid crystal display device in this embodiment. As shown in FIG. 37, a liquid crystal display device 500 includes a liquid crystal panel 501 as a display module, a control circuit 510, and a counter circuit.

An image signal (Video), which is digital data, and a synchronization signal (SYNC) for controlling rewriting of a screen of the liquid crystal panel 501 are input to the liquid crystal display device 500. Examples of a synchronization signal include a horizontal synchronization signal (Hsync), a vertical synchronization signal (Vsync), and a reference clock signal (CLK).

The liquid crystal panel 501 includes a display portion 530, a scan line driver circuit 540, and a data line driver circuit 550. The display portion 530 includes a plurality of pixels 531. The pixels 531 in the same row are connected to the scan line driver circuit 540 through a common scan line 541, and the pixels 531 in the same column are connected to the data line driver circuit 550 through a common data line 551.

A high power supply voltage (VDD) and a low power supply voltage (VSS), which serve as power supply voltages, and a common voltage (hereinafter referred to as Vcom) are supplied to the liquid crystal panel 501. The common voltage (Vcom) is supplied to each pixel 531 in the display portion 530.

The data line driver circuit 550 processes an input image signal to generate a data signal, and outputs the data signal to the data line 551. The scan line driver circuit 540 outputs, to the scan line 541, a scan signal for selecting the pixel 531 into which a data signal is to be written.

The pixel 531 includes a switching element whose electrical connection to the data line 551 is controlled by a scan signal. When the switching element is turned on, a data signal is written into the pixel 531 through the data line 551.

An electrode to which Vcom is applied corresponds to a common electrode.

The control circuit 510 controls the whole liquid crystal display device 500 and includes a circuit which generates control signals for circuits included in the liquid crystal display device 500.

The control circuit 510 includes a control circuit generation circuit which generates control signals for the scan line driver circuit 540 and the data line driver circuit 550 on the basis of the synchronization signal (SYNC). Examples of a control signal for the scan line driver circuit 540 include a start pulse (GSP) and a clock signal (GCLK). Examples of a control signal for the data line driver circuit 550 include a start pulse (SSP) and a clock signal (SCLK). For example, the control circuit 510 generates a plurality of clock signals with the same cycle and shifted phases as the clock signals (GCLK and SCLK).

Further, the control circuit 510 controls output of an image signal (Video), which is input from the outside of the liquid crystal display device 500, to the data line driver circuit 550.

The data line driver circuit 550 includes a digital/analog conversion circuit (hereinafter referred to as a D-A conversion circuit 552). The D-A conversion circuit 552 converts an image signal to an analog signal, thereby generating a data signal.

Note that in the case where an image signal input to the liquid crystal display device 500 is an analog signal, the image signal is converted to a digital signal in the control circuit 510 and output to the liquid crystal panel 501.

An image signal is image data for each frame. The control circuit 510 has a function of performing image processing on the image signal and controlling output of the image signal to the data line driver circuit 550 on the basis of data obtained by the processing. For that function, the control circuit 510 includes a motion detection portion 511 which detects motion in the image data for each frame. The control circuit 510 stops output of an image signal to the data line driver circuit 550 when the motion detection portion 511 determines that there is no motion, and restarts the output of an image signal when the motion detection portion 511 determines that there is motion.

There is no particular limitation on the image processing for detecting motion which is performed in the motion detection portion 511. An example of a method for detecting motion is to obtain difference data from image data for two consecutive frames. It can be determined whether there is motion or not from the obtained difference data. Another example of the method is to detect a motion vector.

In addition, the liquid crystal display device 500 may be provided with an image signal correction circuit which corrects an input image signal. For example, an image signal is corrected such that a voltage higher than a voltage corresponding to the gray scale of the image signal is written into the pixel 531. Such correction can shorten the response time of the liquid crystal element. A method in which the control circuit 510 is driven with an image signal corrected in this manner is referred to as overdriving. In the case of performing high frame rate driving in which the liquid crystal display device 500 is driven at an integral multiple of the frame frequency of an image signal, image data for interpolation between two frames or image data for performing black display between two frames may be generated in the control circuit 510.

Next, the operation of the liquid crystal display device 500 for displaying an image with motion, such as a moving image, and an image without motion, such as a still image, is described with reference to a timing chart in FIG. 38. FIG. 38 shows the signal waveforms of a vertical synchronization signal (Vsync) and a data signal (Vdata) output to the data line 551 from the data line driver circuit 550.

FIG. 38 is a timing chart of the liquid crystal display device 500 during 3m frame periods. Here, there is motion in image data in the first k frame periods and the last j frame periods and there is no motion in image data in the other frame periods. Note that k and j are each an integer greater than or equal to 1 and less than or equal to m−2.

In the first k frame periods, the motion detection portion 511 determines that there is motion in image data for each frame. The control circuit 510 outputs data signals (Vdata) to the data line 551 on the basis of the result of determination by the motion detection portion 511.

The motion detection portion 511 performs image processing for detecting motion and determines that there is no motion in image data for the (k+1)-th frame. Then, the control circuit 510 stops output of image signals (Video) to the data line driver circuit 550 in the (k+1)-th frame period on the basis of the result of determination by the motion detection portion 511. Thus, output of the data signal (Vdata) from the data line driver circuit 550 to the data line 551 is stopped. Further, the control circuit 510 stops the supply of control signals (e.g., a start pulse signal and a clock signal) to the scan line driver circuit 540 and the data line driver circuit 550 in order to stop rewriting of the display portion 530. The control circuit 510 does not output an image signal to the data line driver circuit 550 nor output control signals to the scan line driver circuit 540 and the data line driver circuit 550, thereby keeping rewriting of the display portion 530 stopped, until the motion detection portion 511 determines that there is motion in image data.

Note that, in this specification, "not to supply" a signal to a liquid crystal panel means to apply voltage which is different from a predetermined voltage for operating a circuit to a wiring for supplying the signal, or to bring the wiring into an electrically floating state.

When rewriting of the display portion 530 is stopped, an electric field in one direction is kept applied to the liquid crystal element, which might lead to deterioration of liquid crystal in the liquid crystal element. In the case where such a problem is likely to occur, it is preferable that signals be supplied to the scan line driver circuit 540 and the data line driver circuit 550 from the control circuit 510 and data signals with an inverted polarity be written into the data line 551 at predetermined timings to invert the direction of the electric field applied to the liquid crystal element, regardless of the result of determination by the motion detection portion 511.

Note that the polarity of a data signal input to the data line 551 is determined relative to Vcom. The polarity is positive when the voltage of the data signal is higher than Vcom, and is negative when the voltage of the data signal is lower than Vcom.

Specifically, as shown in FIG. 38, in the (m+1)-th frame period, the control circuit 510 outputs control signals to the scan line driver circuit 540 and the data line driver circuit 550 and outputs an image signal (Video) to the data line driver circuit 550. The data line driver circuit 550 outputs, to the data line 551, a data signal (Vdata) which has an inverted polarity with respect to a data signal (Vdata) output to the data line 551 in the k-th frame period. In this manner, a data signal (Vdata) with an inverted polarity is written into the data line 551 in the (m+1)-th frame period and in the (2m+1)-th frame period, which are periods in which no motion is detected in image data. Rewriting of the display portion 530 is intermittently performed in periods in which there is no change in image data; thus, it is possible to reduce power consumption due to rewriting and prevent deterioration of the liquid crystal element.

When the motion detection portion 511 determines that there is motion in image data for any frame after the (2m+1)-th frame, the control circuit 510 controls the scan line driver circuit 540 and the data line driver circuit 550 to perform rewriting of the display portion 530.

As described above, with the driving method in FIG. 38, the polarity of a data signal (Vdata) is inverted every m frame periods regardless of whether there is motion in image data (Video) or not. Meanwhile, the display portion 530 is rewritten every frame in periods in which an image with motion is displayed and is rewritten every m frames in periods in which an image without motion is displayed. Consequently, power consumed owing to rewriting of the display portion can be reduced. This can prevent an increase in power consumption due to an increase in driving frequency and the number of pixels.

As described above, in the liquid crystal device 500, the method for driving the liquid crystal display device is switched between in a moving image display mode and in a still image display mode; thus, it is possible to provide a liquid crystal display device with low power consumption while inhibiting deterioration of liquid crystal and maintaining display quality.

In the case where a still image is displayed, when a pixel is rewritten every one frame, human eyes perceive the rewriting of the pixel as flickers in some cases, which causes eyestrain. The pixel is not frequently rewritten in the display period of the still image in the liquid crystal device of this embodiment, which is effective for reducing eyestrain.

Thus, with the use of a liquid crystal panel in which a backplane is formed using an oxide semiconductor transistor, a middle size liquid crystal display device with high resolution and low power consumption, which is very suitable for a portable electronic device, can be provided.

Note that, in order to prevent deterioration of the liquid crystal, the interval between polarity inversions of data signals (here, m frame periods) is set to two seconds or shorter, preferably one second or shorter.

Although the detection of motion in image data is performed in the motion detection portion 511 in the control circuit 510, the detection of motion is not necessarily performed only in the motion detection portion 511. Data on whether there is motion or not may be input to the control circuit 510 from the outside of the liquid crystal display device 500.

Determination that there is no motion in image data is not always based on image data for two consecutive frames; the number of frames required for the determination may be set as appropriate depending on the usage mode of the liquid crystal display device 500. For example, rewriting of the display portion 530 may be stopped when there is no motion in image data for m consecutive frames.

Note that although description of this embodiment is made using a liquid crystal display device as a display device, the driving method in this embodiment can be used for other display devices, e.g., a light-emitting display device.

Note that the structures, methods, and the like described in this embodiment can be used as appropriate in combination with any of the structures, methods, and the like described in the other embodiments and examples.

Embodiment 8

The semiconductor device which is one embodiment of the present invention can be applied to a variety of electronic appliances (including game machines). Examples of electronic appliances include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console, and the like. Examples of these electronic appliances are illustrated in FIGS. 39A to 39C.

Figure 39A:
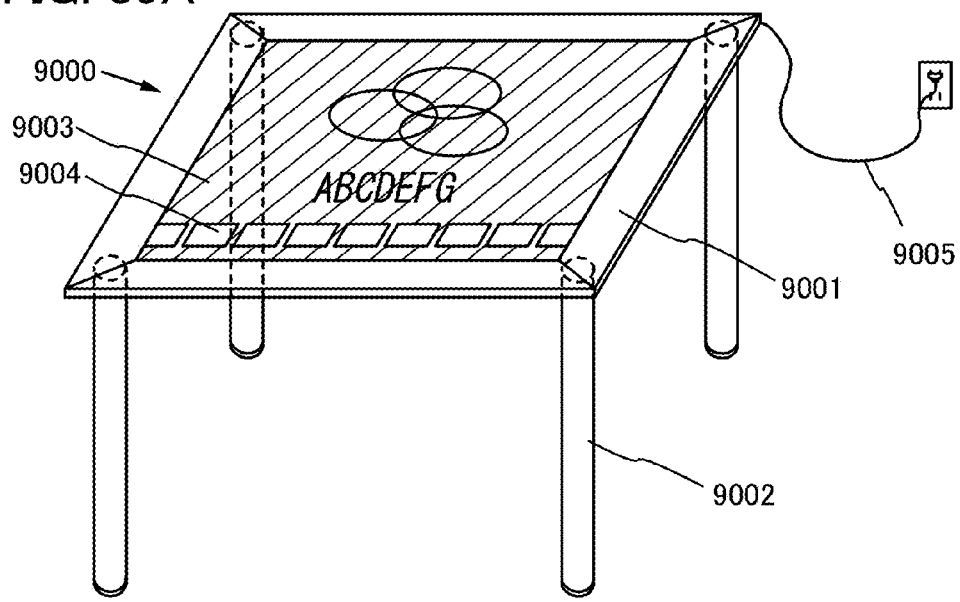
FIGS. 39A to 39C each illustrate an electronic appliance including a semiconductor device of one embodiment of the present invention.
Figure 39B:
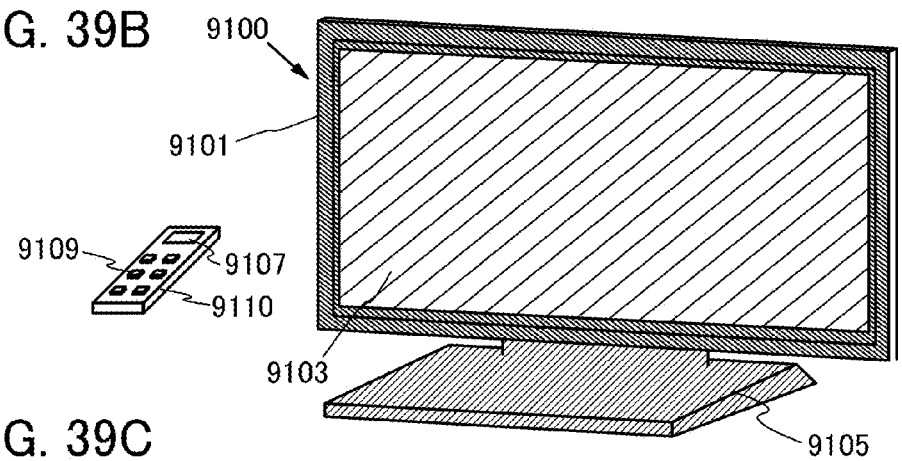
Figure 39C:
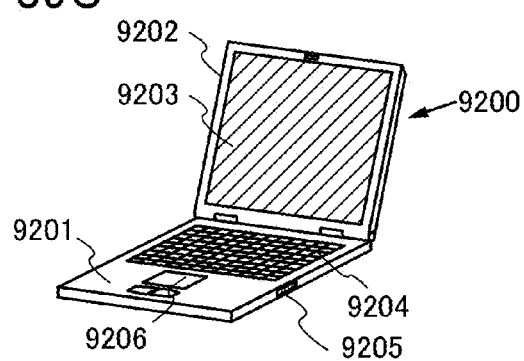

FIG. 39A illustrates a table 9000 having a display portion. In the table 9000, a display portion 9003 is incorporated in a housing 9001 and an image can be displayed on the display portion 9003. The housing 9001 is supported by four leg portions 9002. Further, a power cord 9005 for supplying power is provided for the housing 9001.

The semiconductor device described in any of the above embodiments can be used for the display portion 9003. Thus, the display portion 9003 can have high display quality.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen.

Further, the screen of the display portion 9003 can be placed perpendicular to a floor with a hinge provided for the housing 9001; thus, the table can also be used as a television device. When a television device having a large screen is set in a small room, an open space is reduced; however, when a display portion is incorporated in a table, a space in the room can be efficiently used.

FIG. 39B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 39B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

Any of the semiconductor devices described in the above embodiments can be used for the display portions 9103 and 9107. Thus, the television device can have high display quality.

FIG. 39C illustrates a computer 9200, which includes a main body 9201, a housing 9202, a display portion 9203, a keyboard 9204, an external connection port 9205, a pointing device 9206, and the like.

Any of the semiconductor devices described in the above embodiments can be used for the display portion 9203. Thus, the computer 9200 can have high display quality.

The display portion 9203 has a touch-input function. When a user touches displayed buttons which are displayed on the display portion 9203 of the computer 9200 with his/her fingers or the like, the user can carry out operation of the screen and input of information. Further, when the computer may be made to communicate with home appliances or control the home appliances, the display portion 9203 may function as a control device which controls the home appliances by operation on the screen. For example, with the use of the semiconductor device having an image sensor function, the display portion 9203 can have a touch-input function.

Figure 40A:
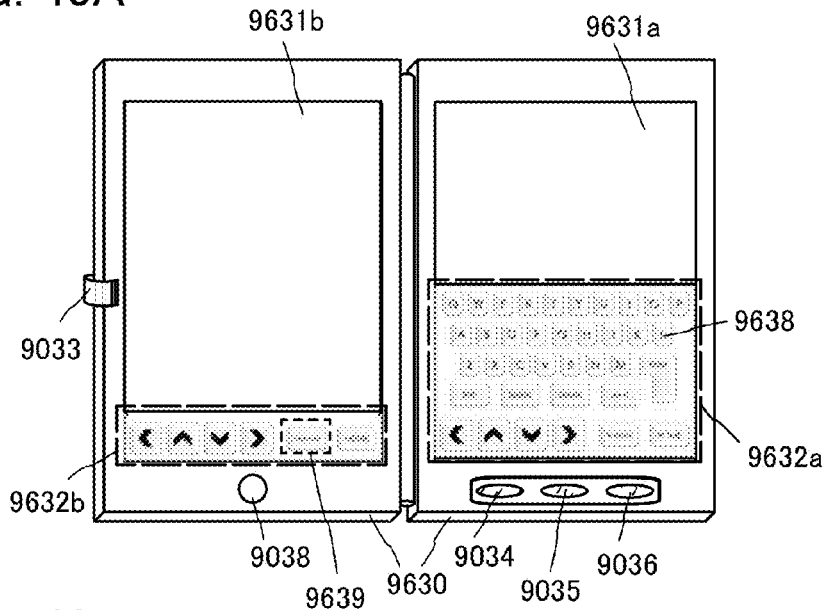
FIGS. 40A to 40C illustrate an electronic appliance including a semiconductor device of one embodiment of the present invention.
Figure 40B:
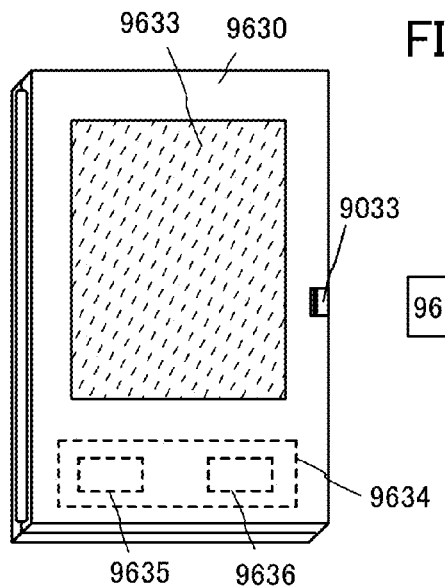

FIGS. 40A and 40B illustrate a foldable tablet terminal. In FIG. 40A, the tablet terminal is opened and includes a housing 9630, a display portion 9631a, a display portion 9631b, a display-mode switching button 9034, a power button 9035, a power-saving-mode switching button 9036, a clip 9033, and an operation button 9038.

Any of the semiconductor devices described in the above embodiments can be used for the display portion 9631a and the display portion 9631b. Thus, the display quality of the tablet terminal can be improved.

Part of the display portion 9631a can be a touch panel region 9632a and data can be input when a displayed operation key 9638 is touched. Although a structure in which a half region in the display portion 9631a has only a display function and the other half region also has a touch panel function is illustrated as an example, the structure of the display portion 9631a is not limited thereto. The whole area of the display portion 9631a may have a touch screen function. For example, the whole area of the display portion 9631a can display keyboard buttons and serve as a touch screen while the display portion 9631b can be used as a display screen.

Like the display portion 9631a, part of the display portion 9631b can be a touch screen region 9632b. When a keyboard display switching button 9639 displayed on the touch panel is touched with a finger, a stylus, or the like, a keyboard can be displayed on the display portion 9631b.

Touch input can be performed concurrently on the touch screen regions 9632a and 9632b.

The display-mode switching button 9034 can switch display orientation (e.g., between landscape mode and portrait mode) and select a display mode (switch between monochrome display and color display), for example. The power-saving-mode switching button 9036 can control display luminance in accordance with the amount of external light in use of the tablet terminal detected by an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 40A, one embodiment of the present invention is not limited to this example. The display portion 9631a and the display portion 9631b may have different areas or different display quality. For example, one of them may be a display panel that can display higher-definition images than the other.

In FIG. 40B, the tablet terminal is folded and includes the housing 9630, a solar cell 9633, and a charge and discharge control circuit 9634. Note that in FIG. 40B, an example in which the charge and discharge control circuit 9634 includes the battery 9635 and the DCDC converter 9636 is illustrated.

Since the tablet can be folded in two, the housing 9630 can be closed when not in use. Thus, the display portions 9631a and 9631b can be protected, thereby providing a tablet with high endurance and high reliability for long-term use.

In addition, the tablet terminal illustrated in FIGS. 40A and 40B can have a function of displaying various kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached on the surface of the tablet terminal, supplies electric power to a touch screen, a display portion, an image signal processor, and the like. Note that the solar cell 9633 can be provided on one or both surfaces of the housing 9630, so that the battery 9635 can be charged efficiently. The use of a lithium ion battery as the battery 9635 is advantageous in downsizing or the like.

Figure 40C:
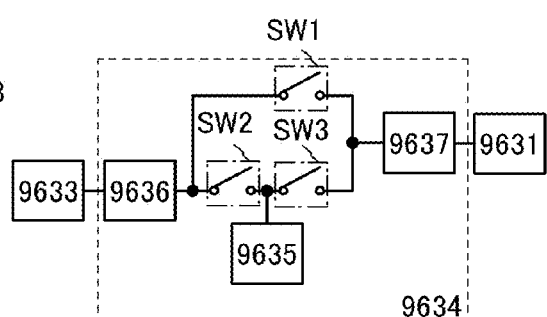

The structure and operation of the charge and discharge control circuit 9634 illustrated in FIG. 40B are described with reference to a block diagram of FIG. 40C. The solar cell 9633, the battery 9635, the DCDC converter 9636, a converter 9637, switches SW1 to SW3, and the display portion 9631 are shown in FIG. 40C, and the battery 9635, the DCDC converter 9636, the converter 9637, and the switches SW1 to SW3 correspond to the charge/discharge control circuit 9634 in FIG. 40B.

First, an example of the operation in the case where power is generated by the solar cell 9633 using external light is described. The voltage of power generated by the solar battery is raised or lowered by the DCDC converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Note that the structures and the like described in this embodiment can be combined as appropriate with any of the structures and the like described in the other embodiments.

Example 1

In this example, a liquid crystal display device was fabricated using Embodiment 1. A structure of the fabricated liquid crystal display device and evaluation of alignment of liquid crystal molecules are described.

First, a process for fabricating Sample 1 is described. In this example, Sample 1 is described using the pixel portion (along the C-D line) in FIGS. 4A to 4C, FIGS. 5A to 5C, FIGS. 6A to 6C, and FIGS. 7A to 7C.

First, as illustrated in FIG. 4A, a glass substrate was used as the substrate 302, and the conductive film 304c was formed over the substrate 302.

A 200-nm-thick tungsten film was formed by a sputtering method, a mask was formed over the tungsten film by a first photolithography process, and part of the tungsten film was etched using the mask by a dry etching method, so that the conductive film 304c was formed.

Next, over the conductive film 304c, the insulating film 305 and the insulating film 306 each of which functions as a gate insulating film were formed.

The insulating film 305 was formed by stacking a 50-nm-thick first silicon nitride film, a 300-nm-thick second silicon nitride film, and a 50-nm-thick third silicon nitride film by a plasma CVD method.

The insulating film 306 was formed using a 50-nm-thick silicon oxynitride film by a plasma CVD method.

Next, as illustrated in FIG. 4B, the oxide semiconductor film 307 was formed over the insulating film 306.

As the oxide semiconductor film 307, a 35-nm-thick In—Ga—Zn oxide film was formed by a sputtering method. The composition ratio of a target used for forming the In—Ga—Zn oxide film was In:Ga:Zn=1:1:1.

Then, a mask was formed over the oxide semiconductor film 307 by a second photolithography process, and part of the oxide semiconductor film 307 was etched using the mask by a wet etching method, so that the oxide semiconductor films 308b and 308d were formed as illustrated in FIG. 4C.

Next, as illustrated in FIG. 5A, the conductive film 309 was formed over the insulating film 306 and the oxide semiconductor film 308b.

The conductive film 309 was formed by stacking a 50-nm-thick tungsten film, a 400-nm-thick aluminum film, and a 200-nm-thick titanium film by a sputtering method.

Then, a mask was formed over the conductive film 309 by a third photolithography process, and part of the conductive film 309 was etched using the mask by a dry etching method, so that the conductive films 310d and 310e were formed as illustrated in FIG. 5B.

Next, as illustrated in FIG. 5C, the insulating films 311a and 311b were formed over the insulating film 306, the oxide semiconductor films 308b and 308d, and the conductive films 310d and 310e.

As the insulating film 311a, a 50-nm-thick silicon oxynitride film was formed by a plasma CVD method. Note that the insulating film 311a is an insulating film which transmits oxygen.

As the insulating film 311b, a 400-nm-thick silicon oxynitride film was formed by a plasma CVD method. Note that the insulating film 311b is an insulating film containing oxygen at a higher proportion than the stoichiometric composition and from which part of oxygen is released by heat treatment.

Then, a mask was formed over the insulating film 311b by a fourth photolithography process, and part of the insulating film 311a and the insulating film 311b was etched using the mask by a dry etching method, so that the insulating film 312 having the opening 362 was formed as illustrated in FIG. 6A.

Next, by heat treatment, water, nitrogen, hydrogen, or the like was released from the insulating film 312 and part of oxygen contained in the insulating film 312 was supplied to the oxide semiconductor film 308b. Here, the heat treatment was performed in an atmosphere of nitrogen and oxygen at 350° C. for one hour.

Next, as illustrated in FIG. 6B, the insulating film 313 was formed over the insulating film 312 and the oxide semiconductor film 308d.

The insulating film 313 was formed by stacking a 100-nm-thick silicon oxynitride film formed by a plasma CVD method and a 200-nm-thick silicon oxide film formed by a plasma CVD method using organosilane.

Then, a mask was formed over the insulating film 313 by a fifth photolithography process, and part of the insulating films 312 and 313 was etched using the mask by a dry etching method, so that the opening 364c was formed as illustrated in FIG. 6C.

Next, as illustrated in FIG. 7A, the conductive film 315 was formed.

As the conductive film 315, a 100-nm-thick ITO film including silicon oxide was formed by a sputtering method. After that, heat treatment was performed in a nitrogen atmosphere at 250° C. for one hour.

Then, a mask was formed over the conductive film 315 by a sixth photolithography process, and part of the conductive film 315 was etched using the mask by a wet etching method, so that the conductive film 316b was formed as illustrated in FIG. 7B.

Next, as illustrated in FIG. 7C, the planarization film 317 was formed over the insulating film 314 and the conductive film 316b.

A 400-nm-thick acrylic resin film was formed as the planarization film 317 by applying a composition to the insulating film 314 and the conductive film 316b and baking the composition.

Next, the alignment film 318 (see FIG. 3) was formed over the planarization film 317.

Through these steps, the element portion was formed over the substrate 302. This sample is referred to as Sample 1.

Further, a sample which is identical to Sample 1 except that the planarization film is not provided in an element portion was formed. This sample is referred to as Sample 2.

Figure 41A:
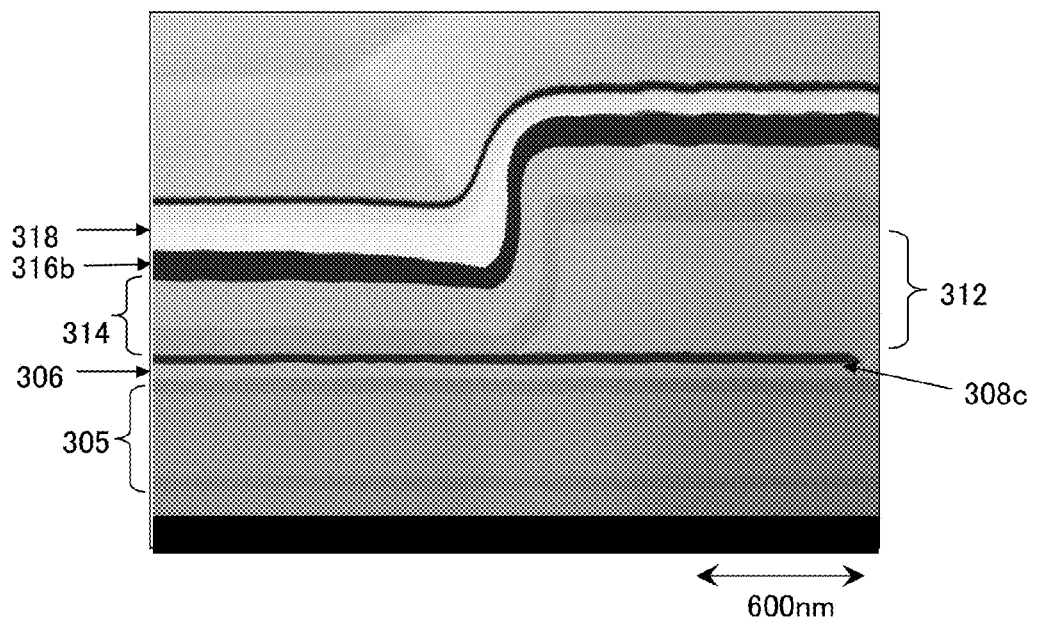
FIGS. 41A and 41B are STEM images.
Figure 41B:
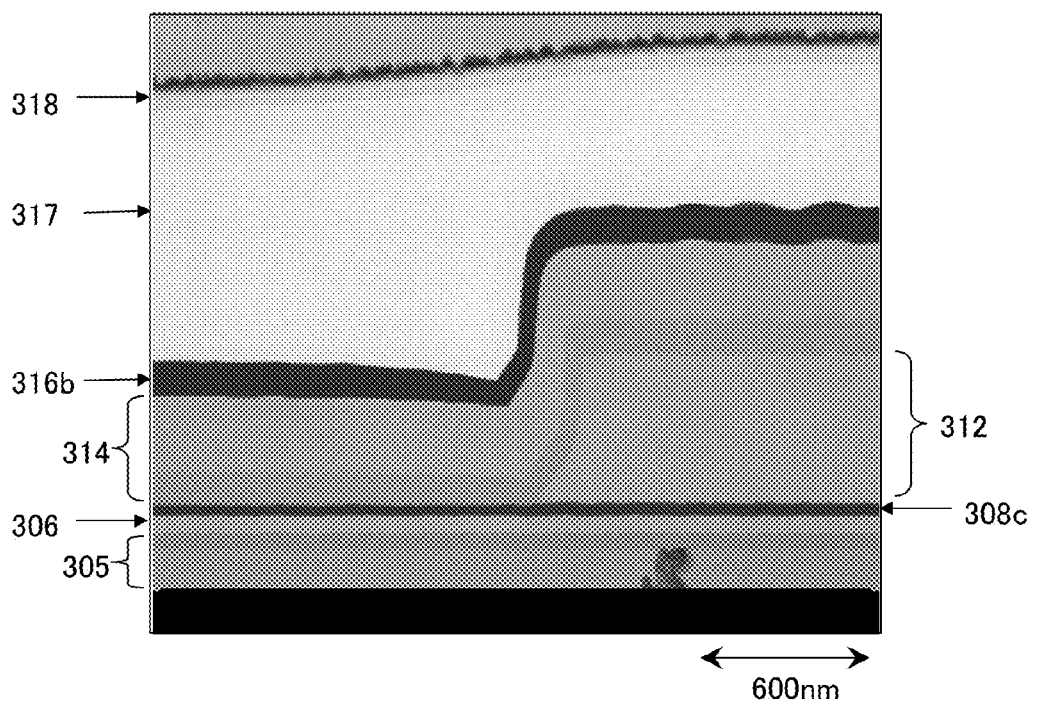

FIGS. 41A and 41B show images of Sample 1 and Sample 2 observed by scanning transmission electron microscopy (STEM).

FIG. 41A is a STEM image of a cross section in the vicinity of the opening in the insulating film 312 in Sample 2. FIG. 41B is a STEM image of a cross section in the vicinity of the opening in the insulating film 312 in Sample 1.

As shown in FIG. 41B, the thickness of the planarization film 317 in the depressed portion of the light-transmitting conductive film 316b is greater than that of the insulating film 312. That is, the depressed portion of the light-transmitting conductive film 316b is filled with the planarization film 317. Further, the planarization film 317 is also formed over the light-transmitting conductive film 316b over the insulating film 312, so that the alignment film 318 formed over the planarization film 317 has less step difference.

On the other hand, as shown in FIG. 41A, in Sample 2 in which the planarization film 317 is not formed, the alignment film 318 has a step. Further, the alignment film 318 in the depressed portion of the light-transmitting conductive film 316b is thicker than the alignment film 318 over the light-transmitting conductive film 316b over the insulating film 312. In other words, the uniformity of the thickness of the alignment film 318 is low.

Next, as in Embodiment 1, the substrate 342 was formed, over which the light-blocking film 344, the colored film 346, the conductive film 348, the conductive film 350, and the alignment film 352 were formed. Then, sealant was provided over the substrate 342 and then a liquid crystal material was dropped between the substrate 342 and the sealant by a dispenser method. Then, the substrate 302 and the substrate 342 were bonded by the sealant, so that a liquid crystal display device was fabricated.

Here, a liquid crystal display device fabricated using Sample 1 is referred to as Sample 3. Further, a liquid crystal display device fabricated using Sample 2 is referred to as Sample 4.

Figure 42A:
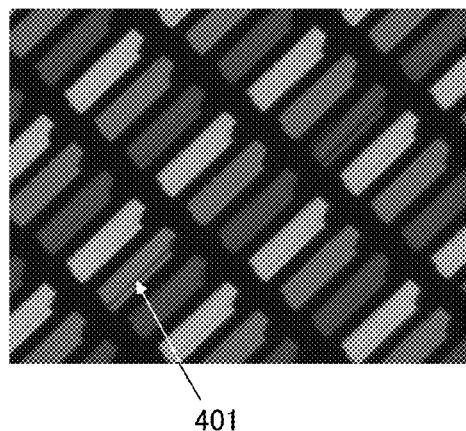
FIGS. 42A to 42D are images observed with a polarizing microscope.
Figure 42B:
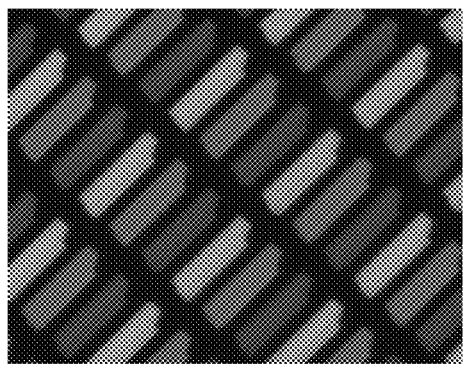
Figure 42C:
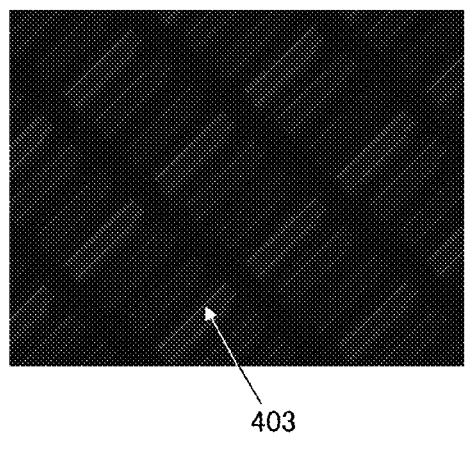
Figure 42D:
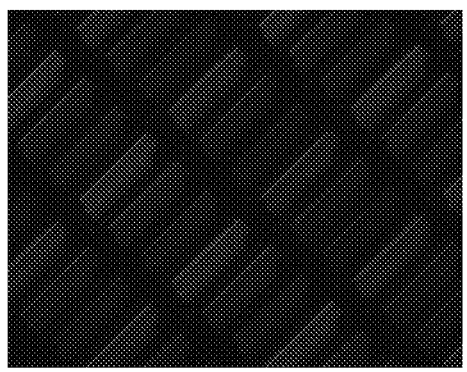

Next, alignment of the liquid crystal molecules in Sample 3 and Sample 4 was evaluated. Here, a pixel portion was observed with a polarizing microscope. FIG. 42A shows an image of the pixel portion in Sample 4 when the transmittance of light from the backlight is 100%, and FIG. 42B shows an image of the pixel portion in Sample 3 when the transmittance of light from the backlight is 100%. Further, FIG. 42C shows an image of the pixel portion in Sample 4 when the transmittance of light from the backlight is 0%, and FIG. 42D shows an image of the pixel portion in Sample 3 when the transmittance of light from the backlight is 0%.

In FIG. 42A, a line defect 401 due to disclination is observed; however, in FIG. 42B, a display defect is not observed. Further, in FIG. 42C, light leakage 403 is observed; however, in FIG. 42D, a display defect is not observed. From the above, the depressed portion of the light-transmitting conductive film is filled with the planarization film, whereby display defects of the liquid crystal display device can be reduced.

Figure 43A:
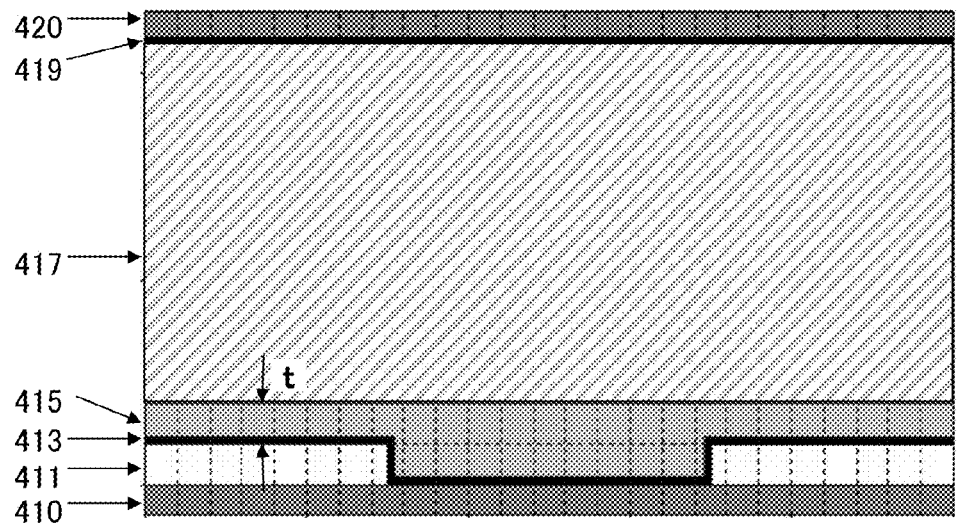
FIGS. 43A and 43B show calculation results.
Figure 43B:
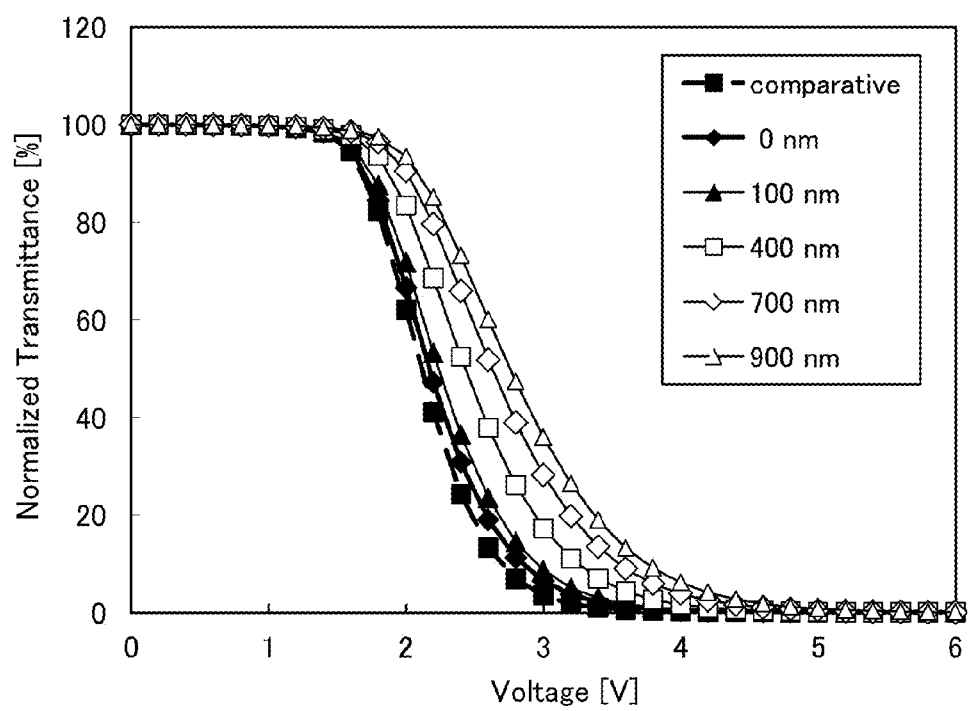

FIGS. 43A and 43B show calculation results of the relation between the thickness of the planarization film and the driving voltage of the liquid crystal display device.

FIG. 43A is a model diagram used for calculation. A 500-nm-thick insulating film 411 was provided over a substrate 410. Note that a plurality of insulating films 411 was provided and a distance between the insulating films 411 was 10 μm. A 100-nm-thick pixel electrode 413 was provided over the substrate 410 and the insulating films 411. A planarization film 415 was provided over the pixel electrode 413 to fill a depressed portion of the pixel electrode 413. An acrylic resin was used for the planarization film 415. A 100-nm-thick pixel electrode 419 was provided over the substrate 420. A liquid crystal layer 417 was provided between the planarization film 415 and the pixel electrode 419. A gap (cell gap) between the pixel electrode 413 and the pixel electrode 419 was 4 µm.

FIG. 43B shows calculation results of the driving voltage of the liquid crystal display device by changing the thickness t of the planarization film 415 provided over the insulating film 411. Here, calculation in the cases where the thickness t was 0 nm, 100 nm, 400 nm, 700 nm, and 900 nm was performed. As a comparative example, the driving voltage of the liquid crystal display device in which the planarization film 415 was not provided was calculated. FIG. 43B shows the relation between the driving voltage and the transmittance. In FIG. 43B, the horizontal axis represents the driving voltage of the liquid crystal display device, and the vertical axis represents the normalized transmittance.

As shown in FIG. 43B, when the planarization film is provided over the pixel electrode, the driving voltage is increased. Further, as the planarization film is thicker, the driving voltage is increased. However, a voltage of the liquid crystal display device in which the planarization film is provided over the pixel electrode is almost the same as a voltage of the liquid crystal display device in which the planarization film is not provided over the pixel electrode. Thus, the planarization film can be provided over the pixel electrode.

Example 2

In this example, a liquid crystal display device was fabricated using Embodiment 2. A structure of the fabricated liquid crystal display device and evaluation of alignment of liquid crystal molecules are described.

First, a process for fabricating Sample 5 is described. In this example, Sample 1 is described using the pixel portion (along the C-D line) in FIGS. 4A to 4C, FIGS. 5A to 5C, and FIGS. 24A to 24C. The description of formong steps similar to those in Sample 1 is omitted here.

In a manner similar to that of Example 1, through the steps in FIGS. 4A to 4C and FIGS. 5A to 5C, the conductive film 304c which functions as a gate electrode, the insulating films 305 and 306 each of which functions as a gate insulating film, the oxide semiconductor films 308b and 308d, the conductive films 310d and 310e, and the insulating film 311 were formed over the substrate 302. Note that in the process, the first to third patterning are performed to form the conductive film 304c, the oxide semiconductor films 308b and 308d, and the conductive films 310d and 310e.

Next, as illustrated in FIG. 24A, a mask 330 was formed over desired regions over the insulating film 311 by fourth patterning.

Then, as illustrated in FIG. 24B, a mask 332 in which an angle between the side surface of the mask 330 and the surface of the insulating film 311 is reduced and whose side surface is curved was formed by performing heat treatment.

Here, the mask 332 was formed by performing the heat treatment at 170° C. in a nitrogen atmosphere for 15 minutes.

Next, the insulating film 311 was etched using the mask 332 by dry etching, whereby the insulating film 312 having the opening 362 was formed as illustrated in FIG. 24C.

Then, as illustrated in FIG. 7A, the conductive film 315 was formed as in Example 1.

Then, a mask was formed over the conductive film 315 by a sixth photolithography process, and part of the conductive film 315 was etched using the mask by a wet etching method, so that the conductive film 316b was formed as illustrated in FIG. 7B.

Next, the alignment film 318 (see FIG. 3) was formed over the conductive film 316b.

Through these steps, the element portion was formed over the substrate 302. This sample is referred to as Sample 5.

Further, a sample which is identical to Sample 5 except that the insulating film 312 having the opening 362 is formed in an element portion by etching the insulating film 311 using the mask 330 and not performing the heat treatment for forming the mask 332 illustrated in FIG. 24B was formed. This sample is referred to as Sample 6.

FIGS. 44A to 44E show images of Sample 5 and Sample 6 obtained with a scanning electron microscope (SEM).

Figure 44A:
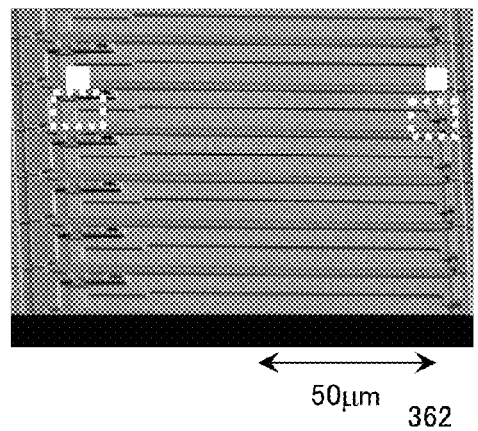
FIGS. 44A to 44E are STEM images.

FIG. 44A shows a SEM image of Sample 6 observed from an alignment film 318 side. Further, FIG. 44B shows a SEM image of a region surrounded by the dashed line A in FIG. 44A with a high magnification, and FIG. 44C shows a SEM image of a region surrounded by the dashed line B in FIG. 44A with a high magnification.

Figure 44B:
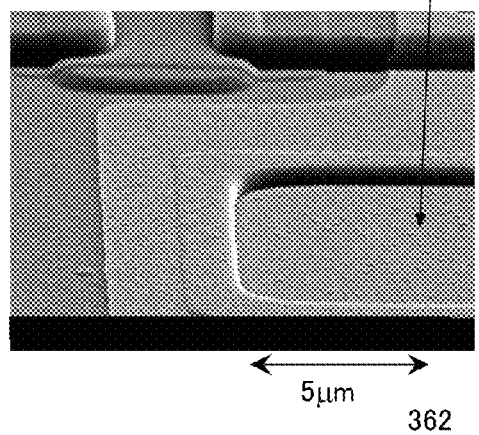
Figure 44C:
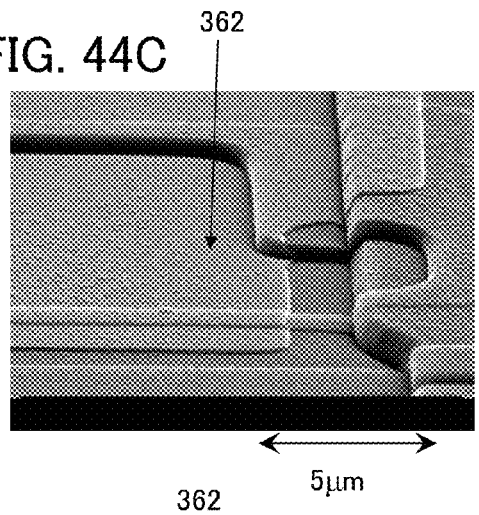
Figure 44D:
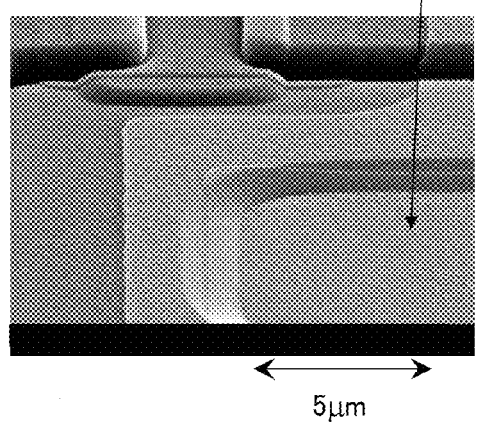
Figure 44E:
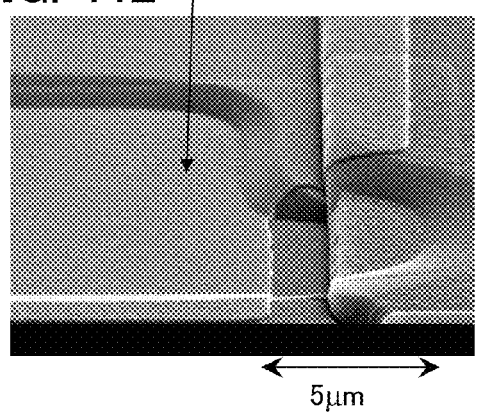

Further, FIGS. 44D and 44E show high magnification SEM images of Sample 5 in the same as those of FIGS. 44B and 44C.

Note that the SEM image of FIG. 44A was taken at 1000-fold magnification and the SEM images of FIGS. 44B to 44E were taken at 10000-fold magnification.

A taper angle at an end portion of the opening 362 in FIGS. 44D and 44E is smaller than that in FIGS. 44B and 44C.

Figure 45A:
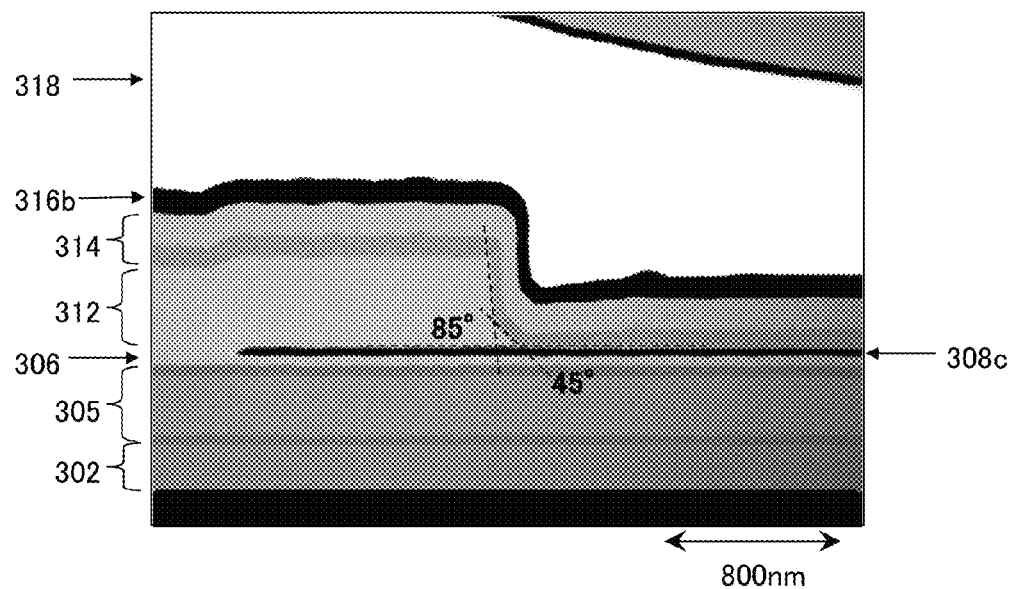
FIGS. 45A and 45B are STEM images.
Figure 45B:
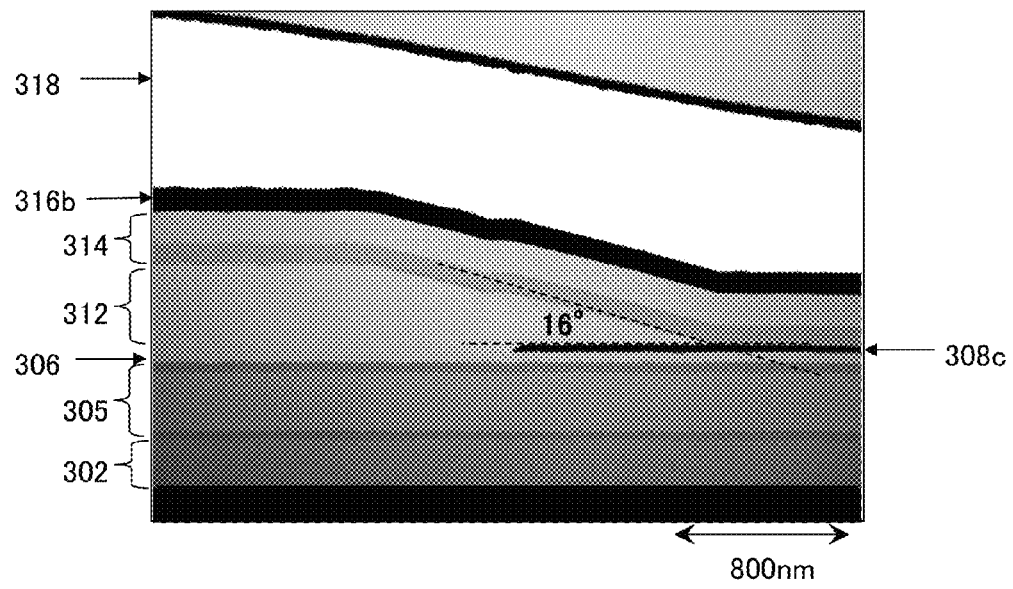

Next, a taper angle between a surface of the light-transmitting conductive film 308c and a side surface of the insulating film 312 was observed. FIGS. 45A and 45B each show the observation result of a cross section of the insulating film in Sample 6 and Sample 5. FIGS. 45A and 45B show STEM images taken at 40000-fold magnification.

FIG. 45A is a STEM image of a cross section in the vicinity of the opening in the insulating film 312 in Sample 6. FIG. 45B is a STEM image of a cross section in the vicinity of the opening in the insulating film 312 in Sample 5.

As shown in Sample 5 in FIG. 45B, the taper angle between the surface of the light-transmitting conductive film 308c and the side surface of the insulating film 312 is 16°. On the other hand, as shown in Sample 6 in FIG. 45A, the taper angle between the surface of the light-transmitting conductive film 308c and the side surface of the insulating film 312 has two steps. The taper angle on the light-transmitting conductive film 308c side is 45°, and the taper angle on the insulating film 314 side is 85°.

As described above, by forming the insulating film 312 having the opening 362 as in Embodiment 2, the step difference of the light-transmitting conductive film 316b formed over the insulating film 312 can be reduced.

Next, as in Embodiment 1, the substrate 342 was formed, over which the light-blocking film 344, the colored film 346, the insulating film 348, the conductive film 350, and the alignment film 352 were formed. Then, sealant was provided over the substrate 342 and then a liquid crystal material was dropped between the substrate 342 and the sealant by a dispenser method. Then, the substrate 302 and the substrate 342 were bonded by the sealant, so that a liquid crystal display device was fabricated.

Here, a liquid crystal display device fabricated using Sample 5 is referred to as Sample 7. Further, a liquid crystal display device fabricated using Sample 6 is referred to as Sample 8.

Figure 46A:
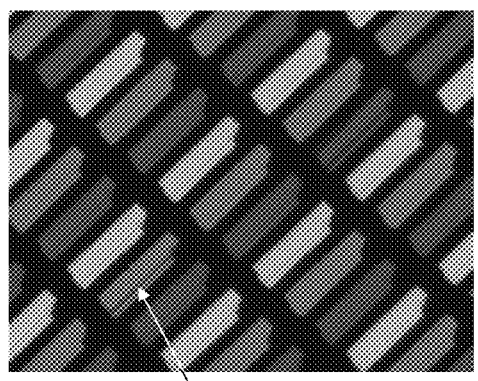
FIGS. 46A to 46D are images observed with a polarizing microscope.
Figure 46B:
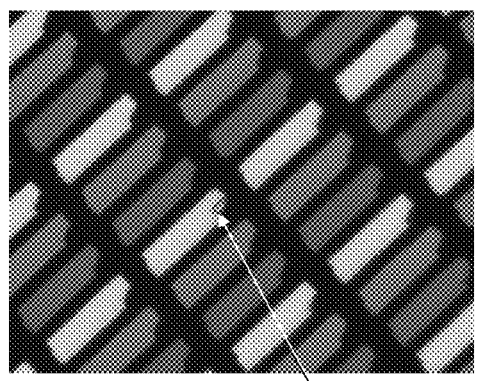
Figure 46C:
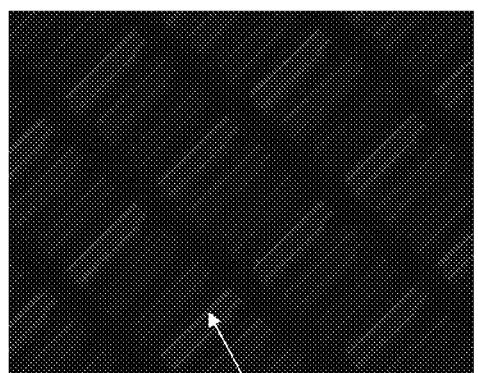
Figure 46D:
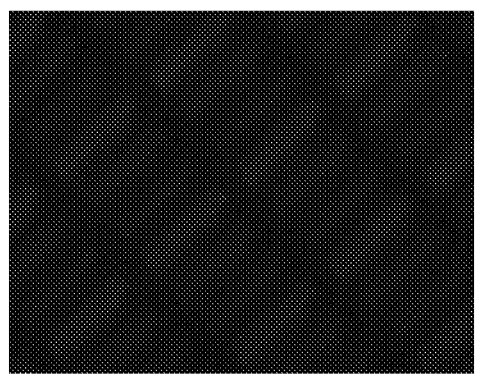

Next, alignment of the liquid crystal molecules in Sample 7 and Sample 8 was evaluated. Here, a pixel portion was observed with a polarizing microscope. FIG. 46A shows an image of the pixel portion in Sample 8 when the transmittance of light from the backlight is 100%, and FIG. 46B shows an image of the pixel portion in Sample 7 when the transmittance of light from the backlight is 100%. Further, FIG. 46C shows an image of the pixel portion in Sample 8 when the transmittance of light from the backlight is 0%, and FIG. 46D shows an image of the pixel portion in Sample 7 when the transmittance of light from the backlight is 0%.

In FIG. 46A, a line defect 431 due to disclination is observed. Further, also in FIG. 46B, a line defect 433 due to disclination is observed. However, the line defect 433 in FIG. 46B is smaller than the line defect 431 in FIG. 46A. Further, in FIG. 46C, light leakage 403 is observed; however, in FIG. 46D, a display defect is not observed. From the above, when the taper angle of the insulating film having the opening is reduced, display defects of the liquid crystal display device can be reduced.

Example 3

In this example, the resistances of an oxide semiconductor film and a multilayer film will be described with reference to FIGS. 47A to 47D and FIG. 48.

First, the structure of a sample is described with reference to FIGS. 47A to 47D.

Figure 47A:
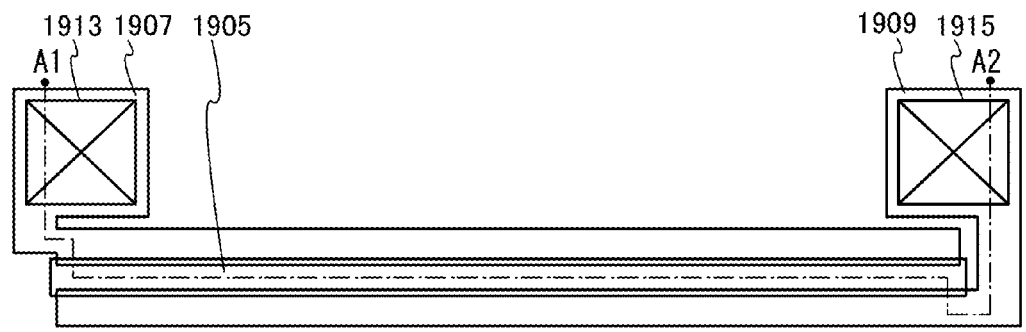
FIGS. 47A to 47D illustrate structures of samples.
Figure 47B:
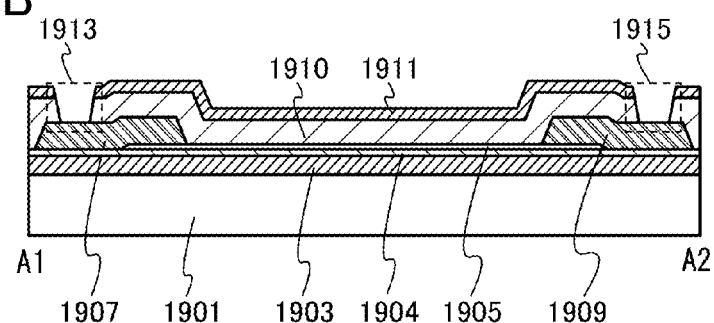
Figure 47C:
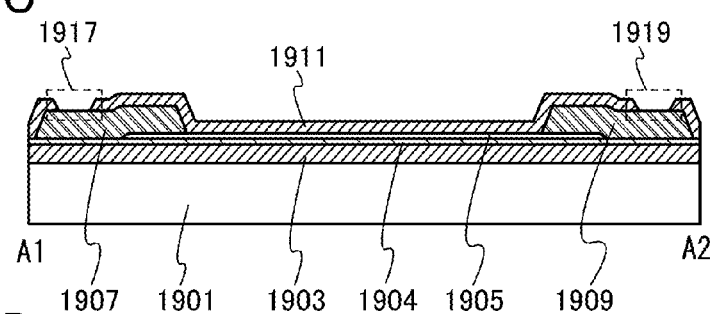
Figure 47D:
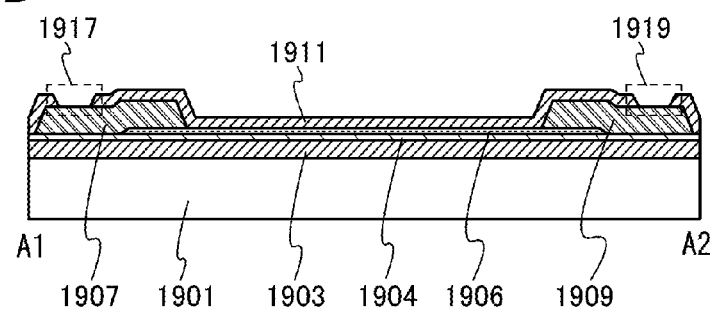

FIG. 47A is a top view of Sample 9, Sample 10, Sample 11, and Sample 12, and FIGS. 47B to 47D are cross-sectional views taken along dashed-and-dotted line A1-A2 in FIG. 47A. Note that the top views of Samples 9 to 12 are the same, and the cross-sectional views thereof are different because the stacked-layer structures of the cross sections are different. The cross-sectional views of Sample 9, Sample 10, and Samples 11 and 12 are illustrated in FIG. 47B, FIG. 47C, and FIG. 47D, respectively.

As for Sample 9, an insulating film 1903 is formed over a glass substrate 1901, an insulating film 1904 is formed over the insulating film 1903, and an oxide semiconductor film 1905 is formed over the insulating film 1904. The both ends of the oxide semiconductor film 1905 are covered with a conductive film 1907 and a conductive film 1909 each serving as an electrode, and the oxide semiconductor film 1905 and the conductive films 1907 and 1909 are covered with an insulating film 1910 and an insulating film 1911. Note that an opening portion 1913 and an opening portion 1915 are provided in the insulating films 1910 and 1911, and the conductive film 1907 and the conductive film 1909 are exposed through the opening portion 1913 and the opening portion 1915, respectively.

As for Sample 10, the insulating film 1903 is formed over the glass substrate 1901, the insulating film 1904 is formed over the insulating film 1903, and the oxide semiconductor film 1905 is formed over the insulating film 1904. The both ends of the oxide semiconductor film 1905 are covered with the conductive films 1907 and 1909 each serving as an electrode, and the oxide semiconductor film 1905 and the conductive films 1907 and 1909 are covered with the insulating film 1911. Note that an opening portion 1917 and an opening portion 1919 are provided in the insulating film 1911, and the conductive film 1907 and the conductive film 1909 are exposed through the opening portion 1917 and the opening portion 1919, respectively.

In each of Samples 11 and 12, the insulating film 1903 is formed over the glass substrate 1901, the insulating film 1904 is formed over the insulating film 1903, and a multilayer film 1906 is formed over the insulating film 1904. The both ends of the multilayer film 1906 are covered with the conductive films 1907 and 1909 each serving as an electrode, and the multilayer film 1906 and the conductive films 1907 and 1909 are covered with the insulating film 1911. Note that the opening portions 1917 and 1919 are provided in the insulating film 1911, and the conductive film 1907 and the conductive film 1909 are exposed through the opening portion 1917 and the opening portion 1919, respectively.

As described above, the structures of the insulating films in contact with the top surface of the oxide semiconductor film 1905 or the multilayer film 1906 are different in Samples 9 to 12. In Sample 9, the oxide semiconductor film 1905 and the insulating film 1910 are in contact with each other; in Sample 10, the oxide semiconductor film 1905 and the insulating film 1911 are in contact with each other; and in Samples 11 and 12, the multilayer film 1906 and the insulating film 1911 are in contact with each other.

Next, methods for forming the samples are described.

First, a method for forming Sample 9 is described.

A 400-nm-thick silicon nitride film was formed as the insulating film 1903 over the glass substrate 1901 by a plasma CVD method.

Next, a 50-nm-thick silicon oxynitride film was formed as the insulating film 1904 over the insulating film 1903 by a plasma CVD method.

Next, a 35-nm-thick IGZO film was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process, so that the oxide semiconductor film 1905 was formed.

Next, the conductive films 1907 and 1909 were formed over the insulating film 1903 and the oxide semiconductor film 1905 in such a manner that a 50-nm-thick tungsten film, a 400-nm-thick aluminum film, and a 100-nm-thick titanium film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1910 by a plasma CVD method.

Next, a mask is formed over the insulating film 1911 through a photolithography process and then etching treatment was performed on the insulating film 1911, so that the opening portions 1913 and 1915 were formed in the insulating films 1910 and 1911.

Through the above process, Sample 9 was formed.

Next, a method for forming Sample 10 is described.

Next, a 450-nm-thick silicon oxynitride film was formed as the insulating film 1910 over the insulating film 1903, the oxide semiconductor film 1905, the conductive film 1907, and the conductive film 1909 of Sample 9 by a plasma CVD method, and then heat treatment was performed at 350° C. under a mixed atmosphere of nitrogen and oxygen for one hour. After that, the insulating film 1910 was removed.

Next, a 50-nm-thick silicon nitride film was formed as the insulating film 1911 over the insulating film 1904, the oxide semiconductor film 1905, the conductive film 1907, and the conductive film 1909 by a plasma CVD method.

Next, a mask is formed over the insulating film 1911 through a photolithography process and then etching treatment was performed on the insulating film 1911, so that the opening portions 1917 and 1919 were formed in the insulating film 1911.

Through the above process, Sample 10 was formed.

Next, a method for forming Sample 11 is described.

As for Sample 11, the multilayer film 1906 was used instead of the oxide semiconductor film 1905 of Sample 10. The multilayer film 1906 was formed over the insulating film 1904 in such a manner that a 10-nm-thick IGZO film with a metal oxide target containing In, Ga, and Zn at an atomic ratio of 1:3:2, a 10-nm-thick IGZO film with a metal oxide target containing In, Ga, and Zn at an atomic ratio of 1:1:1, and then a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, Sample 11 was formed.

Next, a method for forming Sample 12 is described.

As for Sample 12, the multilayer film 1906 was used instead of the oxide semiconductor film 1905 of Sample 10. The thickness of the IGZO film included in the multilayer film 1906 in Sample 12 is different from that in Sample 11. The multilayer film 1906 was formed over the insulating film 1904 in such a manner that a 20-nm-thick IGZO film with a metal oxide target containing In, Ga, and Zn at an atomic ratio of 1:3:2, a 15-nm-thick IGZO film with a metal oxide target containing In, Ga, and Zn at an atomic ratio of 1:1:1, and then a 10-nm-thick IGZO film using a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, Sample 12 was formed.

Next, the sheet resistance of the oxide semiconductor film 1905 provided in each of Samples 9 and 10 and the sheet resistance of the multilayer film 1906 provided in each of Samples 11 and 12 were measured. In Sample 9, a probe is made contact with the opening portions 1913 and 1915 to measure the sheet resistance of the oxide semiconductor film 1905. In each of Samples 10 to 12, a probe is made contact with the opening portions 1917 and 1919 to measure the sheet resistance of the oxide semiconductor film 1905 or the multilayer film 1906. Note that in the oxide semiconductor film 1905 in each of Samples 9 and 10 and the multilayer film 1906 in each of Samples 11 and 12, the widths of the conductive films 1907 and 1909 facing each other were each 1 mm and the distance between the conductive films 1907 and 1909 was 10 μm. Further, in each of Samples 9 to 12, the potential of the conductive film 1907 was a ground potential, and 1 V was applied to the conductive film 1909.

Figure 48:
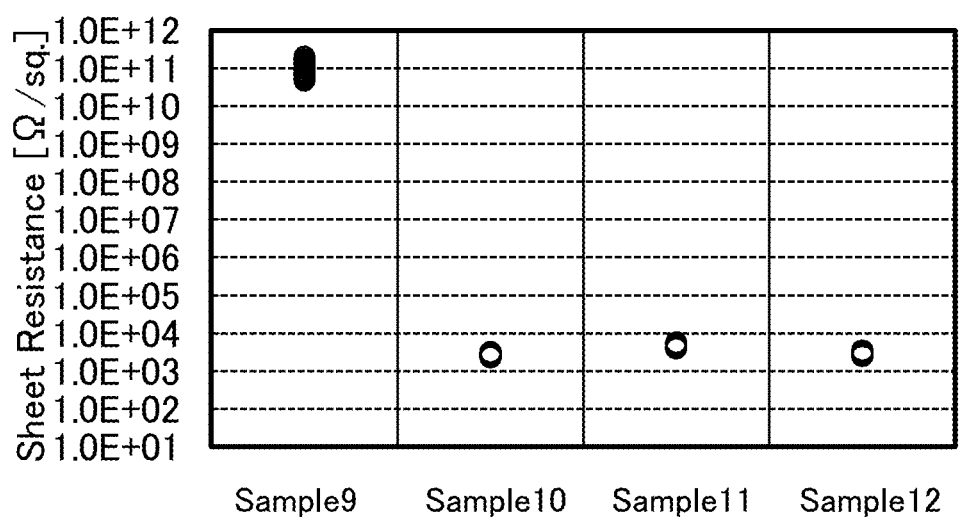
FIG. 48 is a graph showing sheet resistance.

FIG. 48 shows the sheet resistance of Samples 9 to 12.

The sheet resistance of Sample 9 was about $1 \times 10^{11}$ Ω/sq. The sheet resistance of Sample 10 was about 2620 Ω/sq. The sheet resistance of Sample 11 was about 4410 Ω/sq. The sheet resistance of Sample 12 was about 2930 Ω/sq.

In the above manner, the oxide semiconductor films 1905 and the multilayer films 1906 have different values of sheet resistance because the insulating films in contact with the oxide semiconductor film 1905 and the insulating films in contact with the multilayer film 1906 were different.

Note that when the above sheet resistances of Samples 9 to 12 were converted into resistivity, the resistivities of Sample 9, Sample 10, Sample 11, and Sample 12 were $3.9 \times 10^5$ Ωcm, $9.3 \times 10^{-3}$ Ωcm, $1.3 \times 10^{-2}$ Ωcm, and $1.3 \times 10^{-2}$ Ωcm, respectively.

In Sample 9, the silicon oxynitride film used as the insulating film 1910 was formed in contact with the top surface of the oxide semiconductor film 1905. The oxide semiconductor film 1905 is not contact with the silicon nitride film used as the insulating film 1911. On the other hand, the silicon nitride film used as the insulating film 1911 was formed in contact with the top surface of the oxide semiconductor film 1905 in Sample 10 and was formed in contact with the top surface of the multilayer film 1906 in each of Samples 11 and 12. When the oxide semiconductor film 1905 or the multilayer film 1906 is thus provided in contact with the silicon nitride film used as the insulating film 1911, defects, typically oxygen vacancies are generated in the oxide semiconductor film 1905 or the multilayer film 1906, and hydrogen contained in the silicon nitride film is transferred to or diffused into the oxide semiconductor film 1905 or the multilayer film 1906. Accordingly, the conductivity of the oxide semiconductor film 1905 or the multilayer film 1906 is improved.

For example, in the case where an oxide semiconductor film is used for a channel formation region of a transistor, it is preferable to employ a structure in which a silicon oxynitride film is provided in contact with the oxide semiconductor film as shown in Sample 9. Further, as a light-transmitting conductive film used for an electrode of a capacitor, it is preferable to employ a structure in which a silicon nitride film is provided in contact with an oxide semiconductor film or a multilayer film as shown in the Samples 10 to 12. With such a structure, even when an oxide semiconductor film or a multilayer film which is used for a channel formation region of a transistor and an oxide semiconductor film or a multilayer film which is used for an electrode of a capacitor are formed through the same process, the resistivity of the oxide semiconductor film and the resistivity of the multilayer film can be made different from each other.

Next, the sheet resistance values of Samples 10 and 11 which were preserved under a high-temperature high-humidity environment were measured. The conditions of the samples used here are described below. Here, the conditions are partly different from those of Samples 10 and 11. Therefore, samples which have the same structure as Samples 10 and 11 and which were formed under the different formation conditions are referred to as Sample 10a and Sample 11a.

First, a method for forming Sample 10a is described.

The insulating film 1903 and the insulating film 1904 were formed over the glass substrate 1901.

Next, a 35-nm-thick IGZO film was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process and then heat treatment was performed at 350° C. or 450° C., so that the oxide semiconductor film 1905 was formed.

Next, the conductive film 1907 and the conductive film 1909 were formed over the insulating film 1903 and the oxide semiconductor film 1905 in such a manner that a 50-nm-thick titanium film and a 400-nm-thick copper film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1904, the oxide semiconductor film 1905, the conductive film 1907, and the conductive film 1909 by a plasma CVD method. Note that the film formation temperature of the silicon nitride film was 220° C. or 350° C.

Next, a mask is formed over the insulating film 1911 through a photolithography process and then etching treatment was performed on the insulating film 1911, so that the opening portion 1913 and 1915 were formed in the insulating films 1910 and 1911.

Through the above process, Sample 10a was formed.

Next, a method for forming Sample 11a is described.

As for Sample 11a, the multilayer film 1906 was used instead of the oxide semiconductor film 1905 of Sample 10a. The multilayer film 1906 was formed over the insulating film 1904 in such a manner that a 10-nm-thick IGZO film with a metal oxide target containing In, Ga, and Zn at an atomic ratio of 1:1:1, and a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process and then heat treatment was performed at 350° C. or 450° C., so that the multilayer film 1906 was formed.

Through the above process, Sample 11a was formed.

Next, the sheet resistance of the oxide semiconductor film 1905 provided in Sample 10a and the sheet resistance of the multilayer film 1906 provided in Sample 11a were measured. In each of Samples 10a and 11a, a probe is made contact with the opening portions 1917 and 1919 to measure the sheet resistance of the oxide semiconductor film 1905 or the multilayer film 1906. Note that in the oxide semiconductor film 1905 in Sample 10a and the multilayer film 1906 in Sample 11a, a width W in which the conductive films 1907 and 1909 face each other was 1.5 mm and a distance D between the conductive films 1907 and 1909 was 10 µm. Further, in each of Samples 10a and 11a, the potential of the conductive film 1907 was a ground potential, and 1 V was applied to the conductive film 1909. The sheet resistance values of Samples 10a and 11a were measured after Samples 10a and 11a were preserved at 60° C. under an atmosphere with a humidity of 95% for 60 hours and 130 hours.

Figure 49:
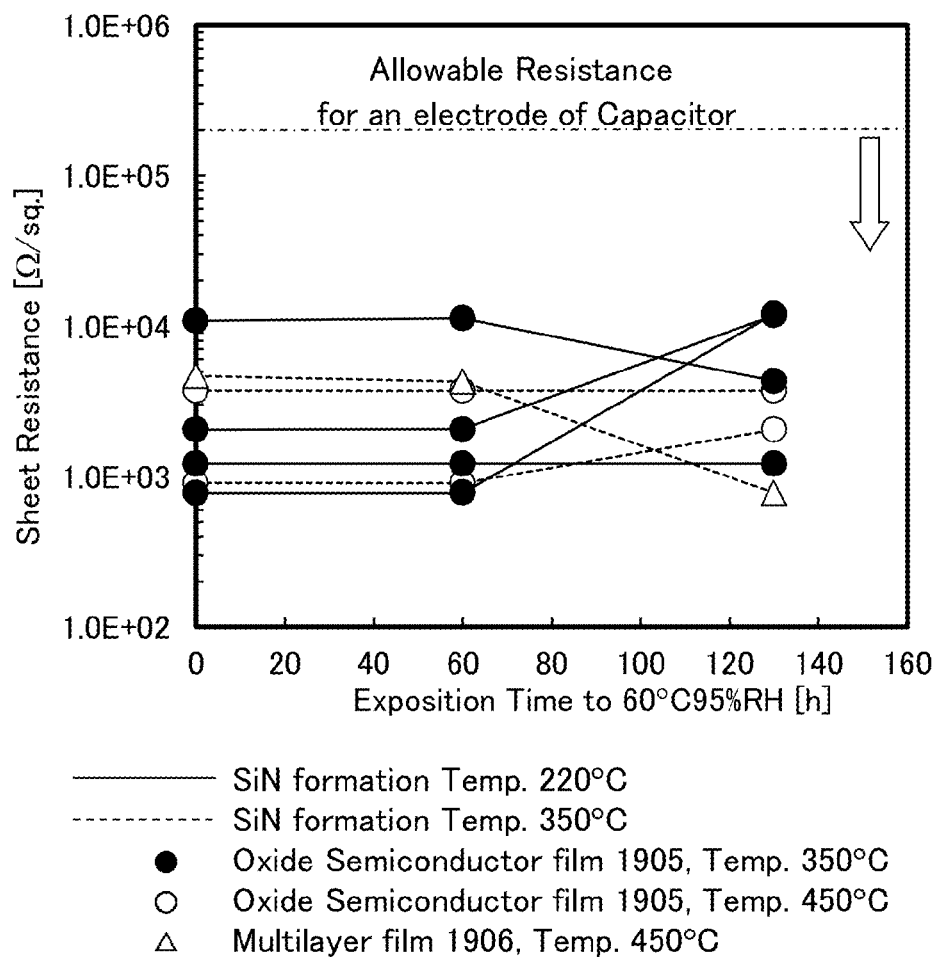
FIG. 49 is a graph showing sheet resistance.

FIG. 49 shows the sheet resistance values of Samples 10a and 11a. Note that in FIG. 49, the film formation temperature of the silicon nitride film formed as the insulating film 1911 in each sample is 220° C. (a solid line) or 350° C. (a dashed line). In addition, black circle and triangle indicate the samples each subjected to heat treatment at 350° C. after the formation of the oxide semiconductor film 1905, and white circle and triangle indicate the samples each subjected to heat treatment at 450° C. after the formation of the oxide semiconductor film 1905 or the multilayer film 1906. The circles indicate the samples each including the oxide semiconductor film 1905, i.e., Sample 10a. The triangles indicate the samples each including the multilayer film 1906, i.e., Sample 11a. Still, measurements results corresponding to the multilayer film 1906 subjected to a 350° C. thermal treatment, i.e., the sample 11a, are not plotted in the graph of FIG. 49.

FIG. 49 shows that Samples 10a and 11a had low sheet resistance values and satisfied a preferable sheet resistance value for an electrode of a capacitor, which is 0.2 Ω/sq., and that the amount of change over time in the sheet resistance values of Samples 10a and 11a was small. As described above, the amount of change in the sheet resistance value of the oxide semiconductor film or the multilayer film in contact with the silicon nitride film is small under a high-temperature high-humidity environment; therefore, the oxide semiconductor film or the multilayer film can be used as a light-transmitting conductive film which is used for an electrode of a capacitor.

Figure 50:
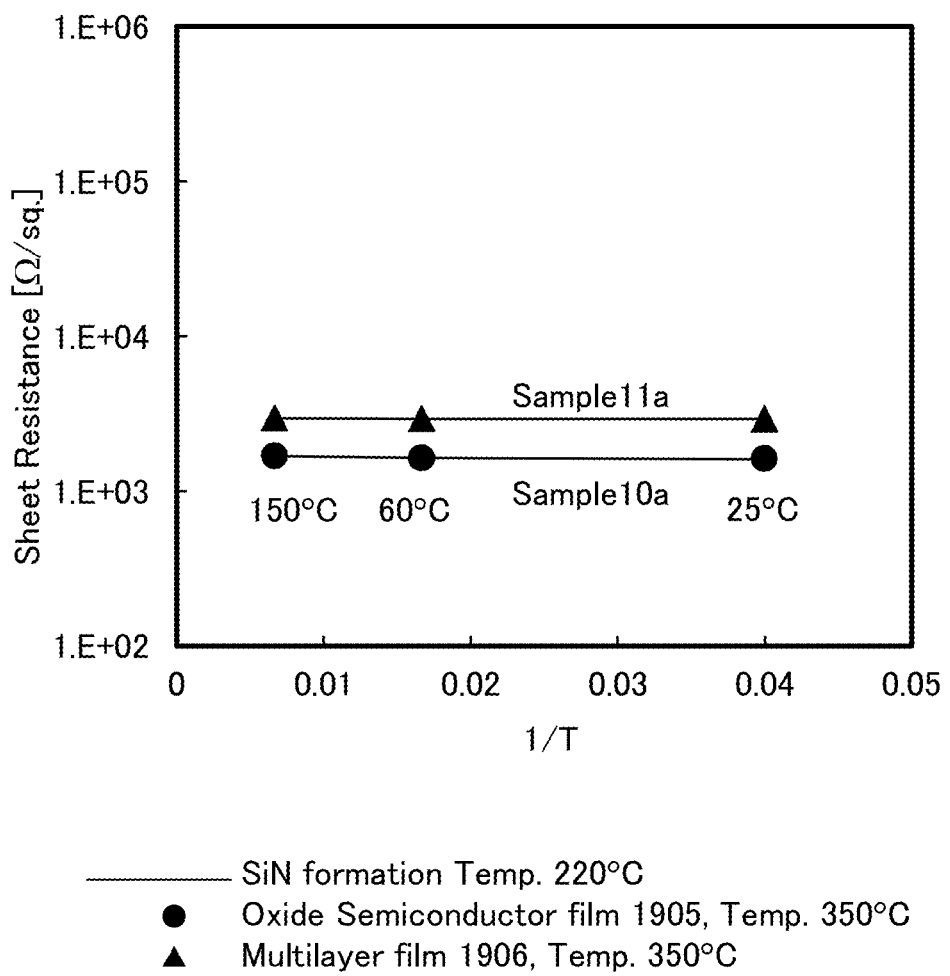
FIG. 50 is a graph showing sheet resistance.

Next, the sheet resistance values of Samples 10a and 11a when the substrate temperature was 25° C., 60° C., or 150° C. were measured, and the measurement results are shown in FIG. 50. Note that here, as each of Samples 10a and 11a, a sample which includes the silicon nitride film formed as the insulating film 1911 at 220° C. and which was subjected to heat treatment at 350° C. after the formation of the oxide semiconductor film 1905 or the multilayer film 1906 was used. The black circles indicate measurement results regarding the sample 10a while the black triangles indicate measurements results regarding the sample 11a.

FIG. 50 shows that the sheet resistance value of the oxide semiconductor film 1905 or the multilayer film 1906 was not changed even when the substrate temperature was raised. In other words, the oxide semiconductor film or the multilayer film in contact with the silicon nitride film is a degenerated semiconductor. The amount of change in the sheet resistance value of the oxide semiconductor film or the multilayer film in contact with the silicon nitride film was small even when the substrate temperature was changed; therefore, the oxide semiconductor film or the multilayer film can be used as a light-transmitting conductive film which is used for an electrode of a capacitor.

Note that the structure described in this example can be used as appropriate in combination with any of the structures in the other embodiments and examples.

Example 4

In this example, analysis of impurities in an oxide semiconductor film and an insulating film formed over the oxide semiconductor film will be described with reference to FIGS. 51A and 51B.

In this example, two kinds of samples (hereinafter Sample 13 and Sample 14) were formed as samples for impurity analysis.

First, a method for forming Sample 13 is described below.

As for Sample 13, an IGZO film was formed over a glass substrate and a silicon nitride film was formed thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that as for the IGZO film, a 100-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

In addition, as for the silicon nitride film, a 100-nm-thick silicon nitride film was formed by a PE-CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 220° C.

Next, a method for forming Sample 14 is described below.

An IGZO film was formed over a glass substrate and a silicon oxynitride film and a silicon nitride film were stacked thereover. After that, heat treatment at 450° C. under a nitrogen atmosphere for one hour and then heat treatment at 450°

C. under a mixed gas atmosphere of nitrogen and oxygen (the proportion of the nitrogen was 80%, and the proportion of the oxygen was 20%) for one hour were successively performed.

Note that the film formation conditions of the IGZO film and the silicon nitride film were similar to those of Sample 13. In addition, as for the silicon oxynitride film, a 50-nm-thick silicon oxynitride film was formed by a PE-CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, a 400-nm-thick silicon oxynitride film was formed by a PE-CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C.

Figure 51A:
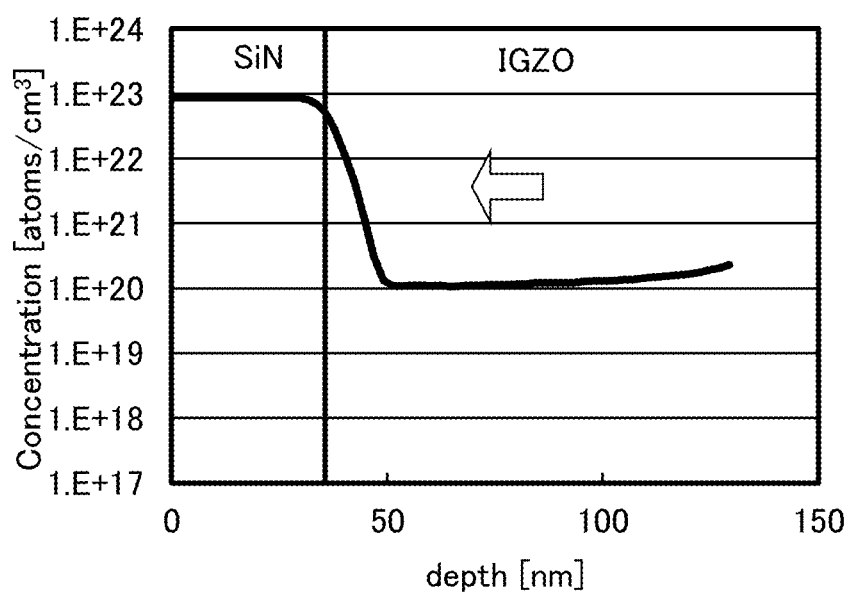
FIGS. 51A and 51B show results of SIMS measurement.
Figure 51B:
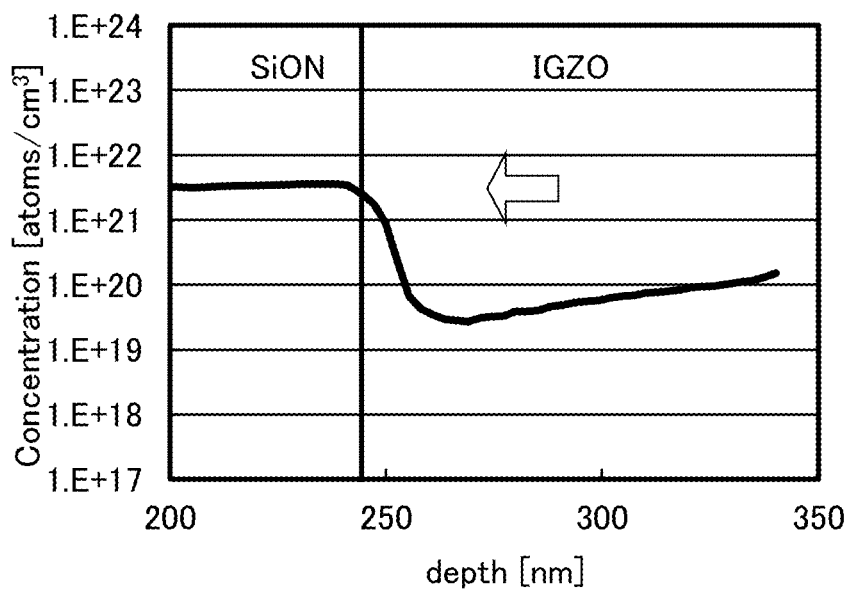

FIGS. 51A and 51B show the results of the impurity analysis of Samples 13 and 14.

Note that the impurity analysis was performed in the direction shown by the arrow in each of FIGS. 51A and 51B by secondary ion mass spectrometry (SIMS). That is, the measurement was performed from the glass substrate side.

FIG. 51A shows the concentration profile of hydrogen (H) which was obtained by measurement of Sample 13. FIG. 51B shows the concentration profile of hydrogen (H) which was obtained by measurement of Sample 14.

FIG. 51A shows that the concentration of hydrogen (H) in the IGZO film is $1.0 \times 10^{20}$ atoms/cm$^3$ and the concentration of hydrogen (H) in the silicon nitride film is $1.0 \times 10^{23}$ atoms/cm$^3$. FIG. 51B shows that the concentration of hydrogen (H) in the IGZO film is $5.0 \times 10^{19}$ atoms/cm$^3$ and the concentration of hydrogen (H) in the silicon oxynitride film is $3.0 \times 10^{21}$ atoms/cm$^3$.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) in the film in the thickness direction are analyzed by SIMS, an average value in a region where the film is provided, the value is not greatly changed, and an almost constant level of strength can be obtained is employed as the concentrations of hydrogen (H).

A difference between the IGZO films in the concentration of hydrogen (H) was found in this manner by changing the structure of the insulating film in contact with the IGZO film.

For example, in the case where any of the above IGZO films is formed in a channel formation region of a transistor, it is preferable to employ a structure in which a silicon oxynitride film is provided in contact with the IGZO film as shown Sample 14.

As a light-transmitting conductive film used for an electrode of a capacitor, it is preferable to employ a structure in which a silicon nitride film is provided in contact with the IGZO film as shown in Sample 13. With such a structure, even when an IGZO film which is used for a channel formation region of a transistor and an IGZO film which is used for an electrode of a capacitor are formed through the same process, the hydrogen concentrations of the IGZO films can be made different from each other.

Example 5

In this example, the amounts of defects in an oxide semiconductor film and a multilayer film will be described with reference to FIGS. 52A to 52C and FIG. 53.

First, the structures of samples are described.

Sample 15 includes a 35-nm-thick oxide semiconductor film formed over a quartz substrate and a 100-nm-thick nitride insulating film formed over the oxide semiconductor film.

Sample 16 and Sample 17 each include a 30-nm-thick multilayer film formed over a quartz substrate and a 100-nm-thick nitride insulating film formed over the multilayer film. Note that in the multilayer film of Sample 16, a 10-nm-thick first IGZO film, a 10-nm-thick second IGZO film, and a 10-nm-thick third IGZO film are stacked in this order. In the multilayer film of Sample 17, a 20-nm-thick first IGZO film, a 15-nm-thick second IGZO film, and a 10-nm-thick third IGZO film are stacked in this order. Samples 16 and 17 are different from Sample 15 in that the multilayer film is included instead of the oxide semiconductor film.

Sample 18 includes a 100-nm-thick oxide semiconductor film formed over a quartz substrate, a 250-nm-thick oxide insulating film formed over the oxide semiconductor film, and a 100-nm-thick nitride insulating film formed over the oxide insulating film. Sample 18 is different from Samples 15 to 17 in that the oxide semiconductor film is not in contact with the nitride insulating film but in contact with the oxide insulating film.

Next, methods for forming the samples are described.

First, a method for forming Sample 15 is described.

A 35-nm-thick IGZO film was formed as the oxide semiconductor film over the quartz substrate. As for the IGZO film, the 35-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

Next, as first heat treatment, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Next, a 100-nm-thick silicon nitride film was formed as the nitride insulating film over the oxide semiconductor film. As for the silicon nitride film, the 100-nm-thick silicon nitride film was formed by a PE-CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 350° C.

Next, as second heat treatment, heat treatment was performed at 250° C. under a nitrogen atmosphere for one hour.

Through the above process, Sample 15 was formed.

Next, a method for forming Sample 16 is described.

As for Sample 16, the multilayer film was formed instead of the oxide semiconductor film of Sample 15. As for the multilayer film, the 10-nm-thick first IGZO film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C. Then, the 10-nm-thick second IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C. Then, the 10-nm-thick third IGZO film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C.

Other steps are similar to those of Sample 15. Through the above process, Sample 16 was formed.

Next, a method for forming Sample 17 is described.

As for Sample 17, the multilayer film was formed instead of the oxide semiconductor film of Sample 15. As for the multilayer film, the 20-nm-thick first IGZO film was formed over the quartz substrate under the same conditions as the first IGZO film of Sample 16. Then, the 15-nm-thick second IGZO film was formed by a sputtering method under the same conditions as the second IGZO film of Sample 16. Then, the 10-nm-thick third IGZO film was formed under the same conditions as the third IGZO film of Sample 16.

Other steps are similar to those of Sample 15. Through the above process, Sample 17 was formed.

Next, a method for forming Sample 18 is described.

As for Sample 18, the 100-nm-thick oxide semiconductor film was formed over the quartz substrate under the same conditions as Sample 15.

Next, first heat treatment was performed under conditions similar to those of Sample 15.

Next, a 50-nm-thick first silicon oxynitride film and a 200-nm-thick second silicon oxynitride film were stacked over the oxide semiconductor film as the oxide insulating film. Here, the 50-nm-thick first silicon oxynitride film was formed by a PE-CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, the 200-nm-thick second silicon oxynitride film was formed by a PE-CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C. Note that the second silicon oxynitride film is a film containing oxygen at a higher proportion than oxygen in the stoichiometric composition.

Next, a 100-nm-thick silicon nitride film was formed over the oxide insulating film under the same conditions as Sample 15.

Next, second heat treatment was performed under conditions similar to those of Sample 15.

Through the above process, Sample 18 was formed.

Next, Samples 15 to 18 were measured by ESR. In the ESR measurement performed at a predetermined temperature, a value of a magnetic field ($H_0$) where a microwave is absorbed is used for an equation $g=h\nu/\beta H_0$, so that a parameter of a g-factor can be obtained. Note that the frequency of the microwave is denoted by $\nu$, and the Planck constant and the Bohr magneton are denoted by, respectively, h and β which are both constants.

Here, the ESR measurement was performed under the conditions as follows. The measurement temperature was room temperature (25° C.), the high-frequency power (power of microwaves) of 8.92 GHz was 20 mW, and the direction of a magnetic field was parallel to a surface of each sample.

Figure 52A:
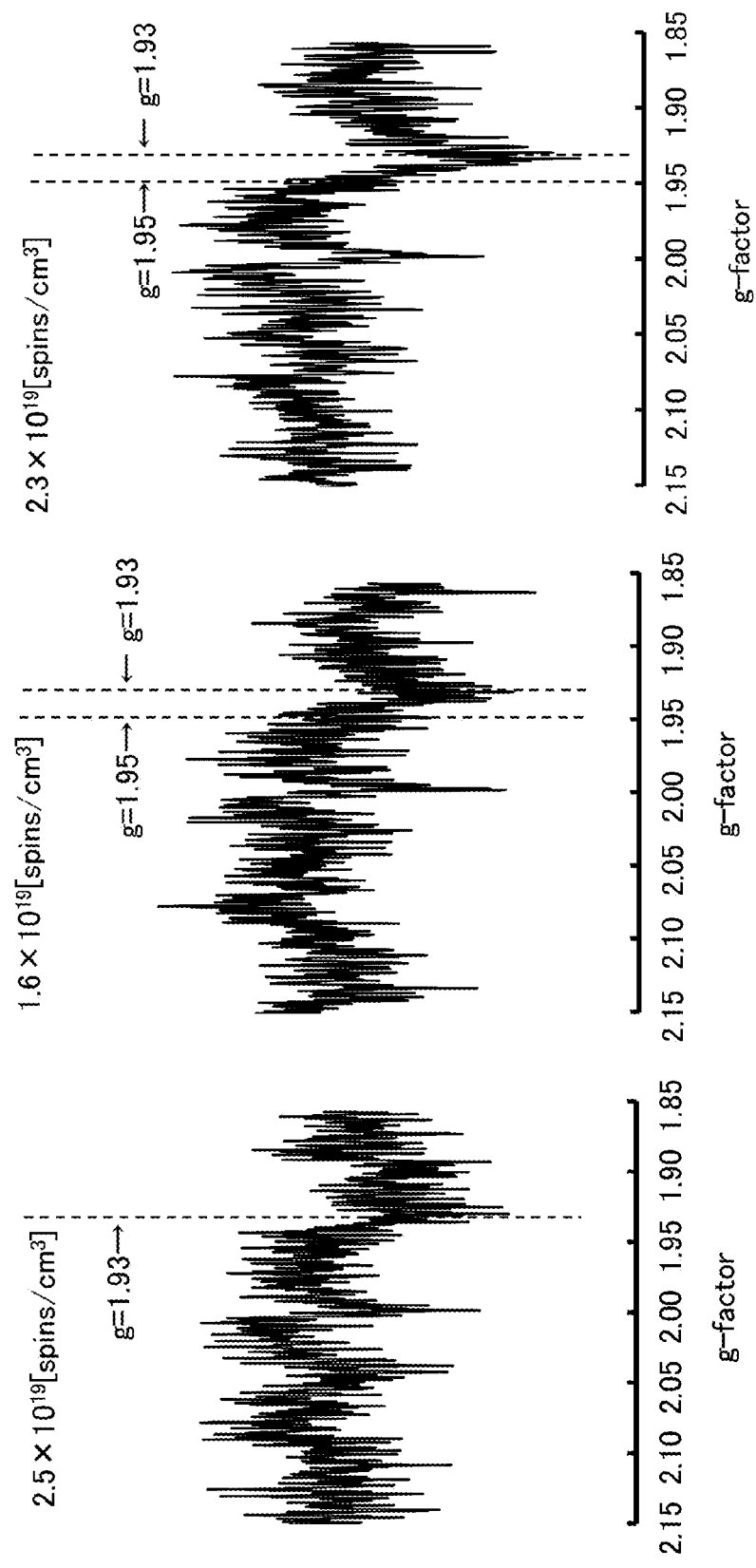
FIGS. 52A to 52C show results of ESR measurement.
Figure 52B:
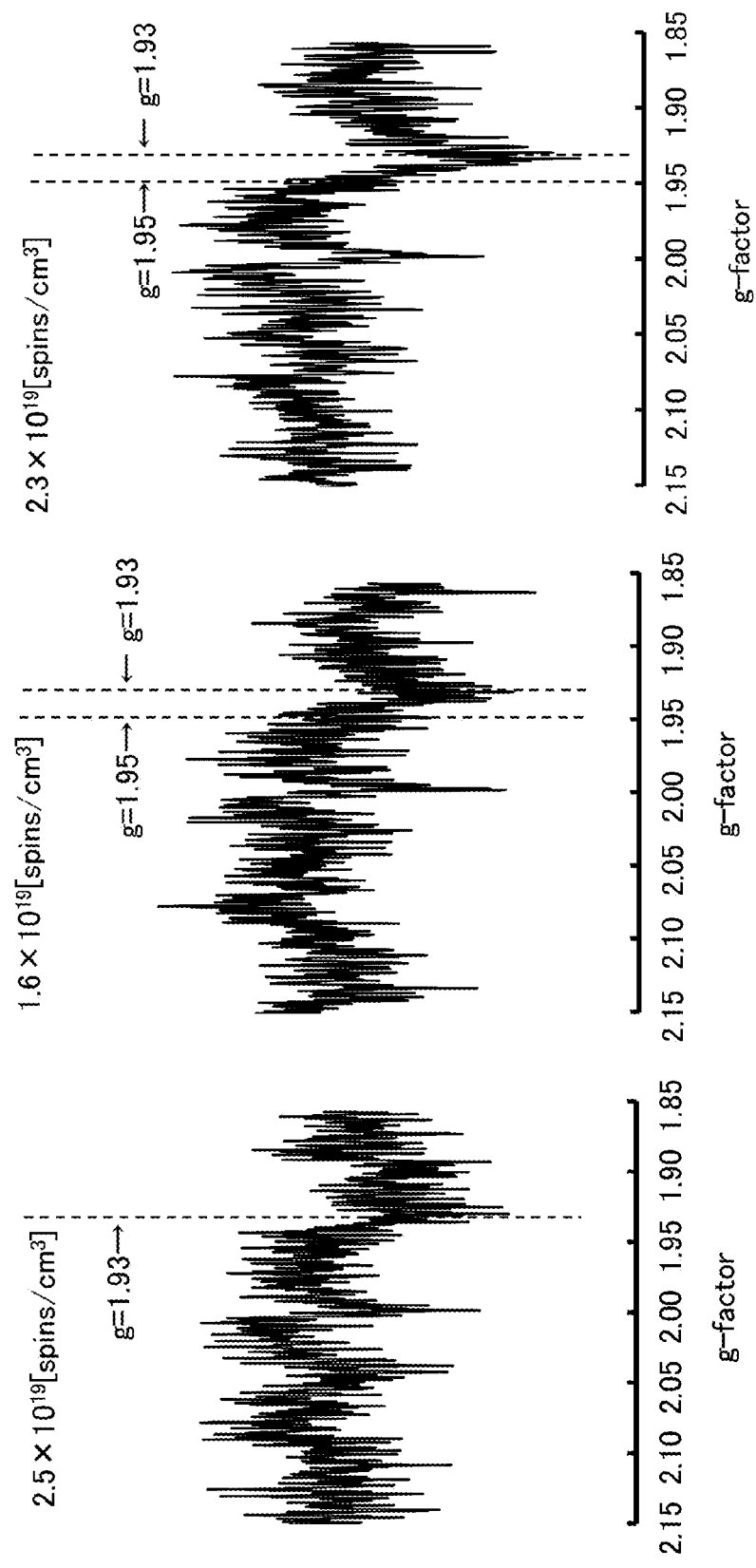
Figure 52C:
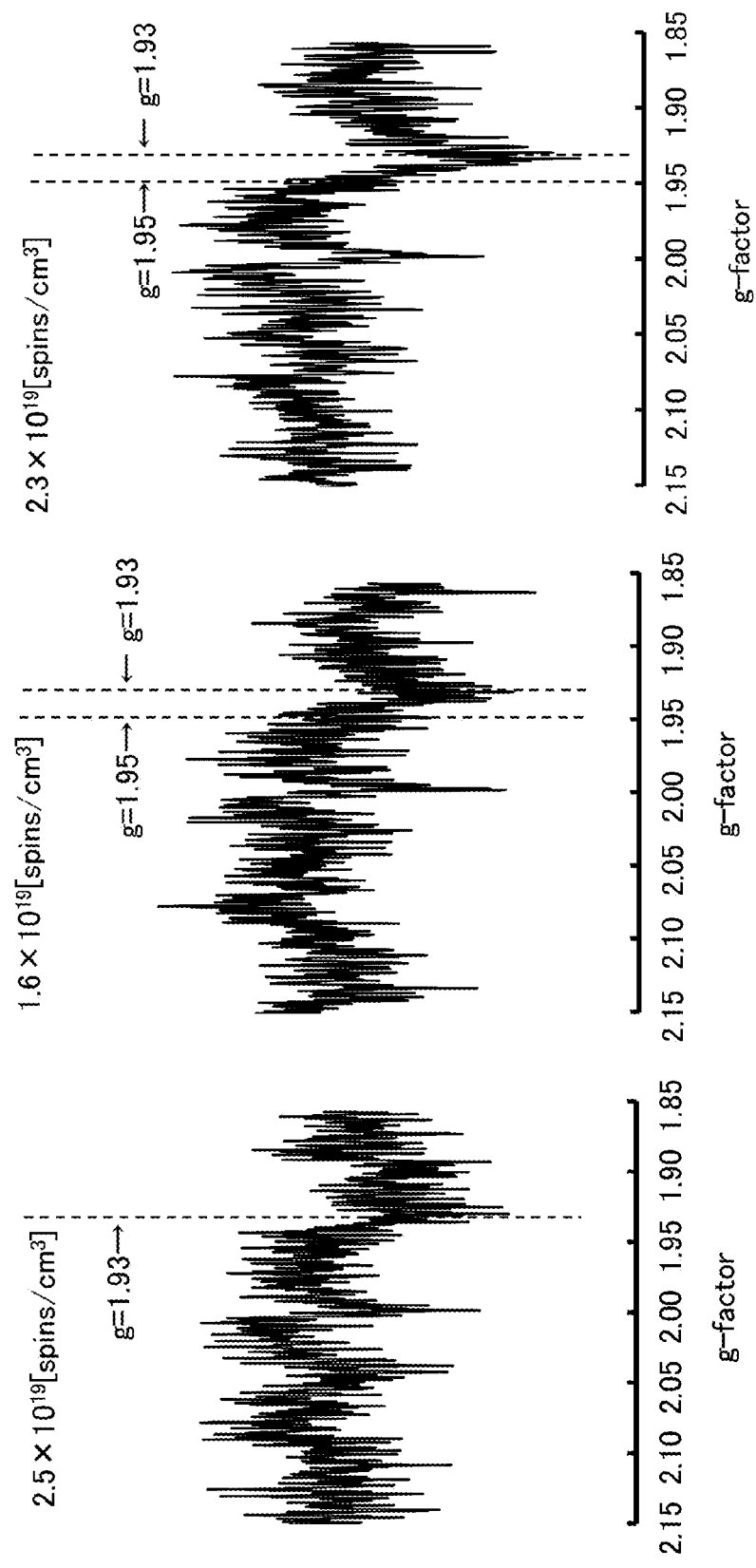

FIG. 52A shows a first derivative curve obtained by ESR measurement of the oxide semiconductor film in Sample 15; and FIGS. 52B and 52C show first derivative curves obtained by ESR measurement of the multilayer films in Samples 16 and 17. FIG. 52A shows the measurement result of Sample 15, FIG. 52B shows the measurement result of Sample 16, and FIG. 52C shows the measurement result of Sample 17.

Figure 53:
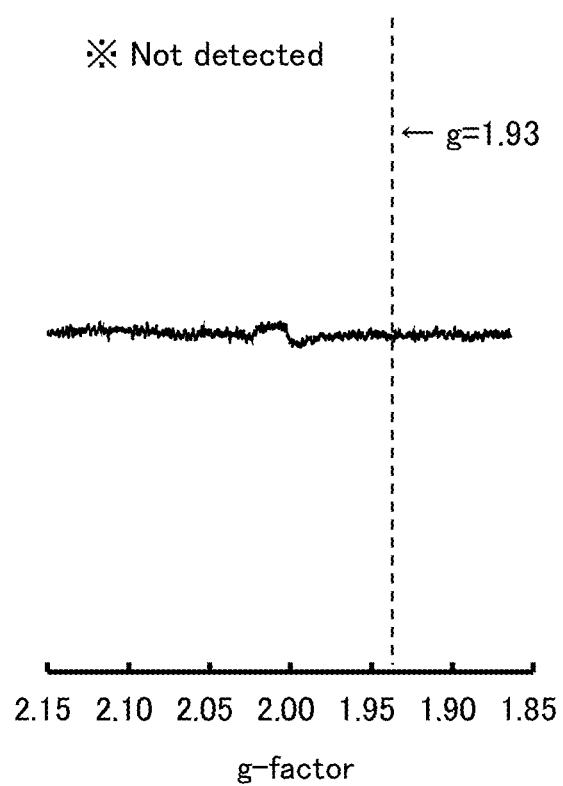
FIG. 53 is a graph showing results of ESR measurement.

FIG. 53 shows a first derivative curve obtained by ESR measurement of the oxide semiconductor film in Sample 18.

In FIGS. 52A to 52C, Sample 15 has signal symmetry due to defects having a g-factor of 1.93 in the oxide semiconductor film. Samples 16 and 17 each have signal symmetry due to a defect having a g-factor of 1.95 in the multilayer film. As for Sample 15, the spin density corresponding to a g-factor of 1.93 was $2.5 \times 10^{19}$ spins/cm$^3$, in Sample 16, the total spin densities corresponding to g-factors of 1.93 and 1.95 were $1.6 \times 10^{19}$ spins/cm$^3$, and in Sample 17, the total spin densities corresponding to g-factors of 1.93 and 1.95 were $2.3 \times 10^{19}$ spins/cm$^3$. That is, it is found that the oxide semiconductor film and the multilayer film include defects. Note that an oxygen vacancy is an example of the defect in the oxide semiconductor film and the multilayer film.

Although, in FIG. 53, the thickness of the oxide semiconductor film of Sample 18 is thicker than the oxide semiconductor film of Sample 15 and the multilayer films of Samples 16 and 17, signal symmetry due to a defect was not detected, i.e., the number of defects was less than or equal to the lower limit of detection (here, the lower limit of detection was $3.7 \times 10^{16}$ spins/cm$^3$). Accordingly, it is found that the number of defects in the oxide semiconductor film cannot be detected.

It is found that when a nitride insulating film, here the silicon nitride film formed by a PE-CVD method is in contact with an oxide semiconductor film or a multilayer film, defects, typically oxygen vacancies are generated in the oxide semiconductor film or the multilayer film. On the other hand, when an oxide insulating film, here the silicon oxynitride film, is provided on an oxide semiconductor film, excess oxygen contained in the silicon oxynitride film, i.e., oxygen contained at a higher proportion than oxygen in the stoichiometric composition is diffused into the oxide semiconductor film and thus the number of defects in the oxide semiconductor film is not increased.

As described above, as shown in Samples 15 to 17, the oxide semiconductor film or the multilayer film which is in contact with the nitride insulating film has a number of defects, typically oxygen vacancies, and has a high conductivity and therefore can be used as an electrode of a capacitor. On the other hand, as shown in Sample 18, an oxide semiconductor film or a multilayer film which is in contact with the oxide insulating film has a small number of oxygen vacancies and low conductivity and therefore can be used as a channel formation region of a transistor.

Here, the cause of a reduction in resistivity of the oxide semiconductor film or the multilayer film which is in contact with the nitride insulating film is described below.

<Energy and Stability Between Existing Modes of Hydrogen (H)>

First, the energy and stability in a mode of H which exists in an oxide semiconductor film is described with calculated results. Here, $InGaZnO_4$ was used as the oxide semiconductor film.

The structure used for the calculation is based on an 84-atom bulk model in which twice the number of a hexagonal unit cell of the $InGaZnO_4$ is arranged along the a-axis and b-axis.

Figure 54A:
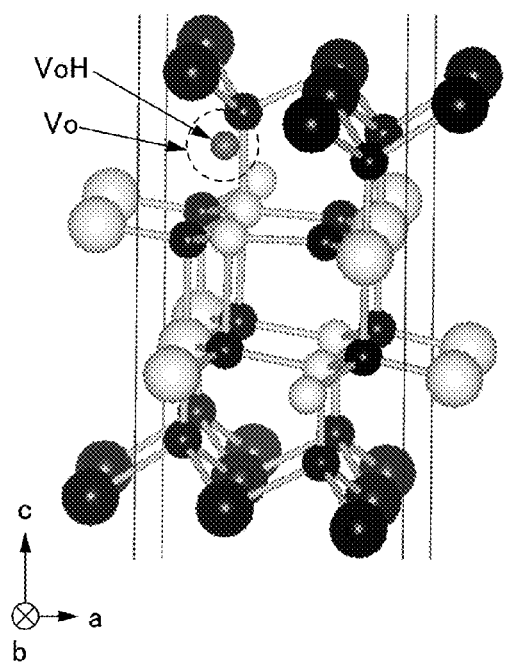
FIGS. 54A to 54D illustrate bulk models of $InGaZnO_4$.
Figure 54B:
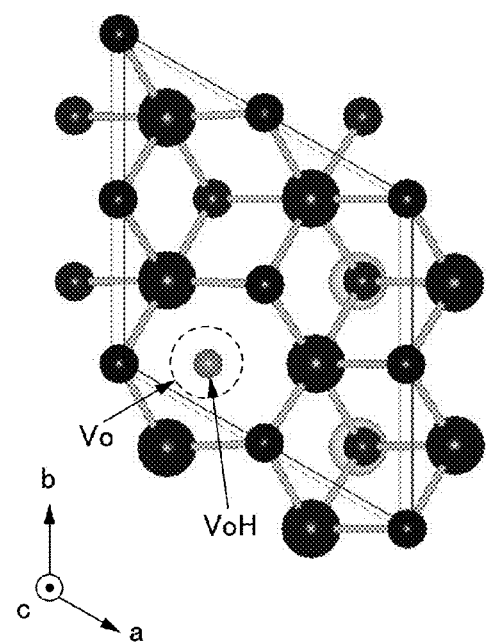

As the bulk model, a model in which one O atom bonded to three In atoms and one Zn atom is substituted with a H atom was prepared (see FIG. 54A). FIG. 54B shows a diagram in which the a-b plane of the InO layer in FIG. 54A is viewed from the c-axis direction. A region from which one O atom bonded to three In atoms and one Zn atom is removed is shown as an oxygen vacancy Vo, which is shown in a dashed line in FIGS. 54A and 54B. In addition, a H atom in the oxygen vacancy Vo is expressed as VoH.

Figure 54C:
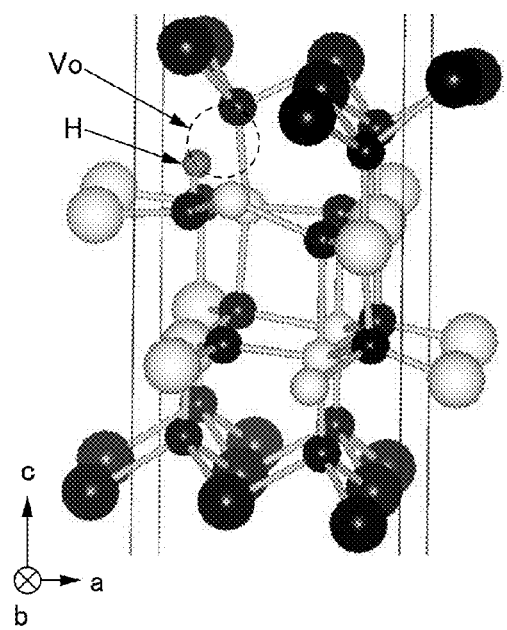
Figure 54D:
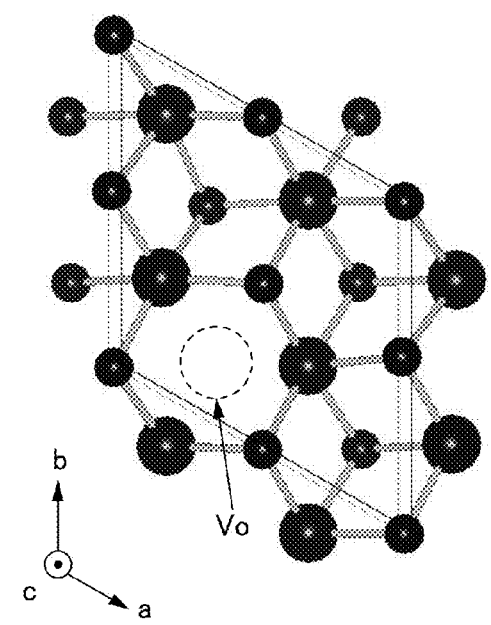

In the bulk model, one O atom bonded to three In atoms and one Zn atom is removed, whereby an oxygen vacancy Vo is formed. A model in which, in the vicinity of the oxygen vacancy Vo, a H atom is bonded to one O atom to which one Ga atom and two Zn atoms are bonded on the a-b plane was prepared (see FIG. 54C). FIG. 54D shows a diagram in which the a-b plane of the InO layer in FIG. 54C is viewed from the c-axis direction. In FIGS. 54C and 54D, an oxygen vacancy Vo is shown in a dashed line. A model in which an oxygen vacancy Vo is formed and, in the vicinity of the oxygen vacancy Vo, a H atom is bonded to one O atom to which one Ga atom and two Zn atoms are bonded on the a-b plane is expressed as Vo+H.

Optimization calculation was performed on the above two models with a fixed lattice constant to calculate the total energy. Note that as the value of the total energy is smaller, the structure becomes more stable.

In the calculation, first principles calculation software VASP (The Vienna Ab initio Simulation Package) was used. The calculation conditions are shown in Table 1.

TABLE 1

| Software | VASP |
|---|---|
| Pseudopotential | PAW |
| Functional | GGA/PBE |
| Cut-off energy | 500 eV |
| K-point | 4 × 4 × 1 |

As pseudopotential of electronic states, a potential generated by a projector augmented wave (PAW) method was used, and as a functional, generalized-gradient-approximation/Perdew-Burke-Ernzerhof (GGA/PBE) was used.

In addition, the total energy of the two models which were obtained by the calculations is shown in Table 2.

TABLE 2

| Model | Total Energy |
|---|---|
| VoH | −456.084 eV |
| Vo+H | −455.304 eV |

According to Table 2, the total energy of VoH is lower than that of Vo+H by 0.78 eV. Thus, VoH is more stable than Vo+H. Accordingly, when a H atom comes close to an oxygen vacancy (Vo), the H atom might be easily trapped in the oxygen vacancy (Vo) than bonding with an O atom.

<Thermodynamic State of VoH>

Next, the formation energy and the charge state of VoH which is generated by a H atom trapped in an oxygen vacancy (Vo) is described with calculated results. The formation energy of VoH is different depending on the charge state and also depends on the Fermi energy. Thus, the stable charge state of VoH is different depending on the Fermi energy. Here, (VoH)$^+$ denotes a state in which one electron is discharged by VoH, (VoH)$^-$ denotes a state in which one electron is trapped by VoH, and (VoH)$^0$ denotes a state in which an electron is not transferred. The formation energies of (VoH)$^+$, (VoH)$^-$, and (VoH)$^0$ were calculated.

In the calculation, the first principles calculation software VASP was used. The calculation conditions are shown in Table 3.

TABLE 3

| Software | VASP |
|---|---|
| Pseudopotential | PAW |
| Functional | HSE06 |
| Cut-off energy | 800 eV |
| Number of k-point sampling | 2 × 2 × 1 (opt.) 4 × 4 × 1 (single) |
| Spin polarization | setup |
| Shielding parameter | 0.2 |
| Fraction of the nonolcal Fock-exchange | 0.25 |
| Number of atoms | 84 |

As pseudopotential calculation of electronic states, a potential generated by a projector augmented wave (PAW) method was used, and as a functional, Heyd-Scuseria-Ernzerhof (HSE) DFT hybrid factor (HSE06) was used.

Note that the formation energy of an oxygen vacancy was calculated as follows: a dilute limit of the concentration of oxygen vacancies was assumed, and excessive expansion of electrons and holes to the conduction band and the valence band was corrected. In addition, shift of the valence band due to the defect structure was corrected using the average electrostatic potential with the top of the valence band of a complete crystal serving as the origin of energy.

Figure 55A:
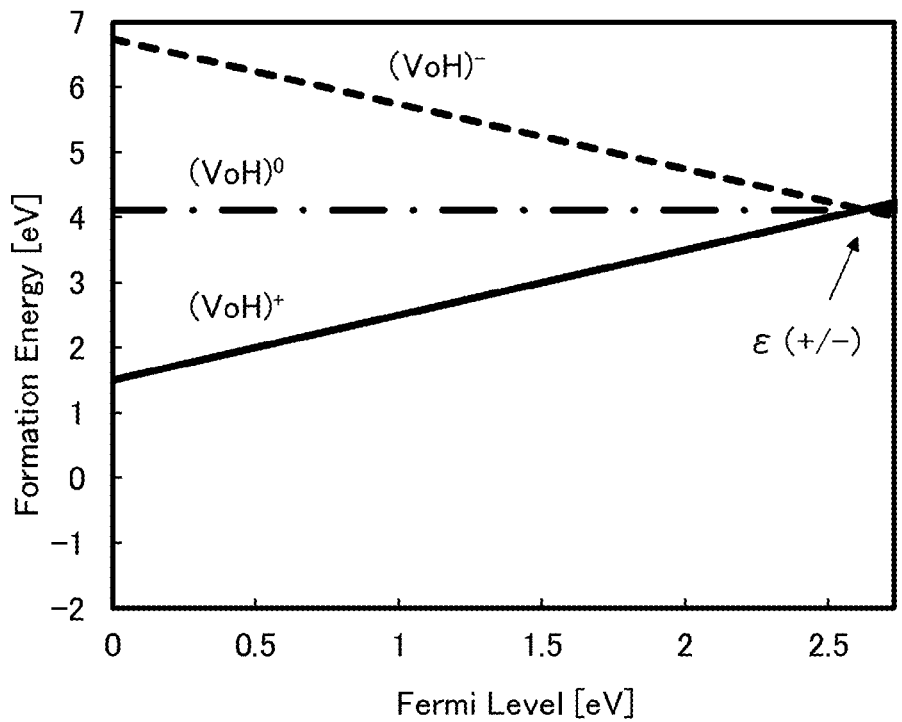
FIGS. 55A and 55B illustrate formation energy and thermodynamic transition level of VoH.

FIG. 55A shows the formation energies of (VoH)$^+$, (VoH)$^-$, and (VoH)$^0$. The horizontal axis represents the Fermi level, and the vertical axis represents the formation energy. The solid line represents the formation energy of (VoH)$^+$, the dashed-dotted line represents the formation energy of (VoH)$^0$, and the dashed line represents the formation energy of (VoH)$^-$. In addition, the transition level of the VoH charge from (VoH)$^+$ to (VoH)$^-$ through (VoH)$^0$ is represented by $\in$ (+/−).

Figure 55B:
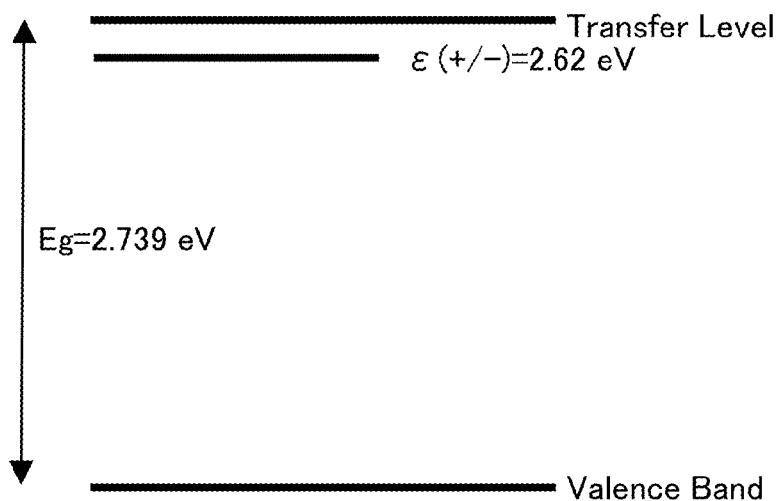

FIG. 55B shows a thermodynamic transition level of VoH. From the calculation result, the energy gap of InGaZnO$_4$ was 2.739 eV. In addition, when the energy of the valence band is 0 eV, the transfer level ($\in$ (+/−)) is 2.62 eV, which exists just under the conduction band. This shows that InGaZnO$_4$ is n-type by trapping a H atom in an oxygen vacancy Vo.

When an oxide semiconductor film is exposed to plasma, the oxide semiconductor film is damaged and defects, typically oxygen vacancies are generated in the oxide semiconductor film. In addition, when a nitride insulating film is in contact with an oxide semiconductor film, hydrogen contained in the nitride insulating film is transferred to the oxide semiconductor film. As a result, VoH is formed in an oxide semiconductor film by entry of hydrogen into an oxygen vacancy in the oxide semiconductor film, so that the oxide semiconductor film becomes n-type film and the resistivity thereof is reduced. As described above, the oxide semiconductor film in contact with the nitride insulating film can be used as an electrode of a capacitor.

This application is based on Japanese Patent Application serial no. 2013-016257 filed with Japan Patent Office on Jan. 30, 2013, and Japanese Patent Application serial no. 2013-054014 filed with Japan Patent Office on Mar. 15, 2013, the entire contents of which are hereby incorporated by reference.

What is claimed is:

1. A semiconductor device comprising:
a substrate; and
a pixel over the substrate, the pixel comprising:
- a transistor comprising:
  - a channel region comprising In, Ga, Zn and O; and
  - a gate electrode over the channel region with a first insulating film between the channel region and the gate electrode; and
- a capacitor over the substrate, the capacitor comprising:
  - a first electrode comprising In, Ga, Zn and O; and
  - a second electrode over the first electrode,
wherein regions with high luminance in a circular pattern are observed in a nanobeam electron diffraction pattern of the channel region, and
wherein the first electrode comprises a portion which does not overlap the first insulating film.

2. The semiconductor device according to claim 1,
wherein an oxide semiconductor film comprises the channel region, and
wherein a conductor film comprises the first electrode.

3. The semiconductor device according to claim 1, wherein a conductor film comprises the second electrode and a pixel electrode.

4. The semiconductor device according to claim 1,
wherein the pixel further comprises a colored film over the capacitor, and
wherein an end of the colored film and the first insulating film overlap each other.

5. The semiconductor device according to claim 1, wherein the first insulating film comprises a second insulating film and a third insulating film.

6. The semiconductor device according to claim 5,
wherein the second insulating film is capable of oxygen release, and
wherein the second insulating film is positioned over the third insulating film.

7. The semiconductor device according to claim 6, wherein the third insulating film comprises hydrogen.

8. The semiconductor device according to claim 1, a concentration of hydrogen contained in the first electrode is higher than or equal to $8 \times 10^{19}$ atoms/cm$^3$.

9. A display comprising the semiconductor device according to claim 1.

10. An electronic appliance comprising the semiconductor device according to claim 1.

11. A semiconductor device comprising:
a substrate; and
a pixel over the substrate, the pixel comprising:
- a transistor comprising:
  - a first gate electrode over the substrate;
  - a first insulating film over the first gate electrode;
  - a channel region over the first insulating film, the channel region comprising In, Ga, Zn and O; and
  - a second gate electrode over the channel region with a second insulating film between the channel region and the second gate electrode; and
- a capacitor over the substrate, the capacitor comprising:
  - a first electrode comprising In, Ga, Zn and O; and
  - a second electrode over the first electrode,
wherein regions with high luminance in a circular pattern are observed in a nanobeam electron diffraction pattern of the channel region, and
wherein the first electrode comprises a portion which does not overlap the first insulating film.

12. The semiconductor device according to claim 11,
wherein an oxide semiconductor film comprises the channel region, and
wherein a conductor film comprises the first electrode.

13. The semiconductor device according to claim 11, wherein a conductor film comprises the second electrode and a pixel electrode.

14. The semiconductor device according to claim 11,
wherein the pixel further comprises a colored film over the capacitor, and
wherein an end of the colored film and the second insulating film overlap each other.

15. The semiconductor device according to claim 11, wherein the second insulating film comprises a third insulating film and a fourth insulating film.

16. The semiconductor device according to claim 15,
wherein the third insulating film is capable of oxygen release, and
wherein the third insulating film is positioned over the fourth insulating film.

17. The semiconductor device according to claim 16, wherein the fourth insulating film comprises hydrogen.

18. The semiconductor device according to claim 11, a concentration of hydrogen contained in the first electrode is higher than or equal to $8 \times 10^{19}$ atoms/cm$^3$.

19. A display comprising the semiconductor device according to claim 11.

20. An electronic appliance comprising the semiconductor device according to claim 11.

* * * * *